(12) United States Patent
Sakurai et al.

(10) Patent No.: US 10,659,056 B1
(45) Date of Patent: May 19, 2020

(54) GRAY CODE COUNTING SIGNAL DISTRIBUTION SYSTEM

(71) Applicant: OmniVision Technologies, Inc., Santa Clara, CA (US)

(72) Inventors: Satoshi Sakurai, Cupertino, CA (US); Hiroaki Ebihara, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/440,279

(22) Filed: Jun. 13, 2019

(51) Int. Cl.
    *H03K 23/00* (2006.01)
    *H03M 1/56* (2006.01)
    *H03M 7/16* (2006.01)

(52) U.S. Cl.
    CPC ............ *H03K 23/005* (2013.01); *H03M 1/56* (2013.01); *H03M 7/16* (2013.01)

(58) Field of Classification Search
    CPC ......... H03K 23/005; H03M 1/56; H03M 7/16
    See application file for complete search history.

(56) References Cited

U.S. PATENT DOCUMENTS

| | | | |
|---|---|---|---|
| 7,629,913 B2 | 12/2009 | Okumura | |
| 7,671,317 B2 | 3/2010 | Shimomura et al. | |
| 8,102,449 B2 | 1/2012 | Kudo | |
| 8,406,370 B2 | 3/2013 | Hizu | |
| 9,053,999 B2 | 6/2015 | Iwaki et al. | |
| 9,106,859 B2 * | 8/2015 | Kizuna | H04N 5/378 |
| 9,363,452 B2 | 6/2016 | Iwaki et al. | |
| 9,374,539 B2 | 6/2016 | Kudo | |
| 9,473,722 B2 | 10/2016 | Iwaki | |
| 9,621,169 B2 * | 4/2017 | Liu | H03L 7/18 |
| 10,419,003 B1 * | 9/2019 | Kim | H03K 23/005 |
| 2006/0214821 A1 * | 9/2006 | Roh | H03M 1/1071 341/50 |
| 2009/0026352 A1 | 1/2009 | Shimomura et al. | |
| 2013/0015329 A1 | 1/2013 | Iwaki | |

OTHER PUBLICATIONS

S. Okura et al. "A 3.7 M-Pixel 1300-fps CMOS Igame Sensor With 5.0 G-Pixel/s High-Speed Readout Circuit", IEEE Journal of Colid-State Circuits, vol. 50, No. 4, Apr. 2015, 9 pages.
Sakurai et al., U.S. Appl. No. 16/190,862, filed Nov. 14, 2018.

* cited by examiner

*Primary Examiner* — Patrick O Neill
(74) *Attorney, Agent, or Firm* — Christensen O'Connor Johnson Kindness PLLC

(57) ABSTRACT

A counter distribution system includes an N bit counter to receive a first counting clock to generate a plurality of data bits including lower data bits on lower data bit lines and upper data bits on upper data bit lines. The upper data bits include at least one redundant bit to provide error correction for the counter distribution system. A plurality of latches is coupled to the N bit counter. Each one of the lower data bit lines and each one of the upper data bit lines is coupled to at least one of the latches. The latches are arranged into a plurality of groupings of latches. Each grouping of latches is coupled to a respective latch enable signal. Each latch in each grouping of latches is coupled to latch a respective one of the plurality of data bits in response to the respective latch enable signal.

63 Claims, 43 Drawing Sheets

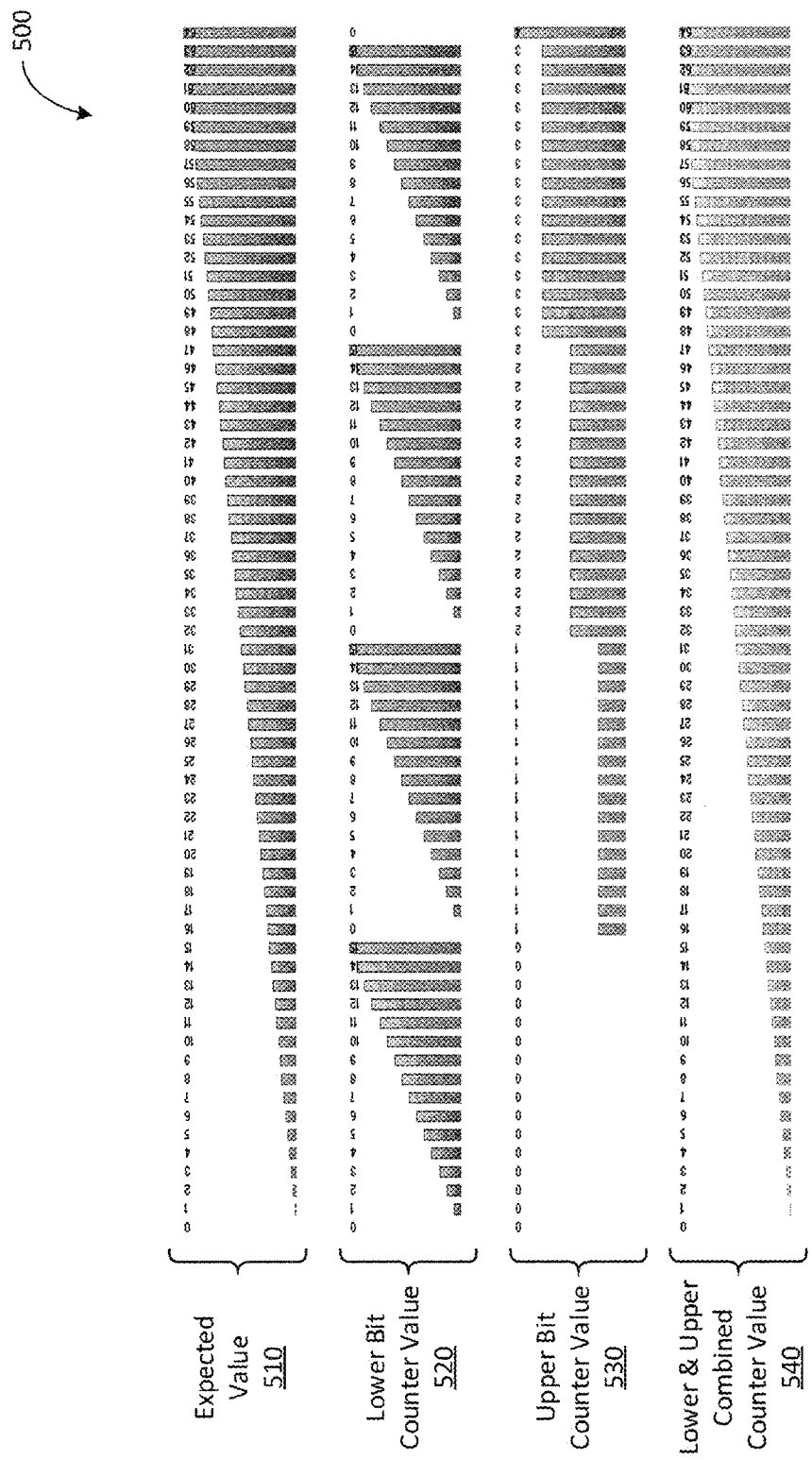

GRAY CODE COUNTING SIGNAL DISTRIBUTION SYSTEM

BACKGROUND INFORMATION

Field of the Disclosure

This disclosure relates generally to counter circuits, and in particular but not exclusively, relates to counter circuits for use with image sensors.

Background

Image sensors have become ubiquitous. They are widely used in digital still cameras, cellular phones, security cameras, as well as medical, automobile, and other applications. High dynamic range (HDR) image sensors have been required by many of those applications. Human eyes normally possess a dynamic range of up to about 100 dB. For automobile applications, an image sensor of more than 100 dB dynamic range to deal with different driving conditions, such as driving through a dark tunnel into bright sunlight, is often required.

When image sensors are used, photo-generated electrons in each of the plurality of pixel cells are transferred from a photodiode (PD) to a floating diffusion (FD) in the pixel cell for subsequent read out. A transfer (TX) transistor coupled between the PD and the FD is switched on and off under the control of a voltage pulse asserted to the TX gate terminal to enable this charge transfer. The image signal is amplified by a source follower (SF) transistor. When a row select (RS) transistor is enabled, the amplified image signal is transferred to an output line, called a bitline, of the pixel cell.

The analog image signal on the bitline is normally fed into an analog to digital converter (ADC) to be converted to digital image signal. A ramp type ADC is often used with image sensors to convert the analog image signal to the digital image signal. For a ramp type ADC, a counter starts to count when a ramp signal begins and is compared to an image signal. At the point when the ramp signal and the image signal are equal, the value of the counter is latched as digital representation of the analog image signal. To achieve higher resolution digital image signal outputs, the time resolution of the counter is increased. This requires that the clock frequency of the counter is increased. However, as the frequency of clock signals increase, the power consumption of the counter increases as well. Counter power consumption accounts for the majority of power consumption of many ADCs. Therefore, the reduction of counter power consumption becomes an important factor for reducing power consumption in many image sensors. Such power reduction becomes even more important when image sensor products are used in low power mobile applications.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 5 is a diagram illustrating properly aligned output values of a Lower Bit Counter Gray code generator, an Upper Bit Counter Gray code generator, combined values, and expected values.

Figure 1:
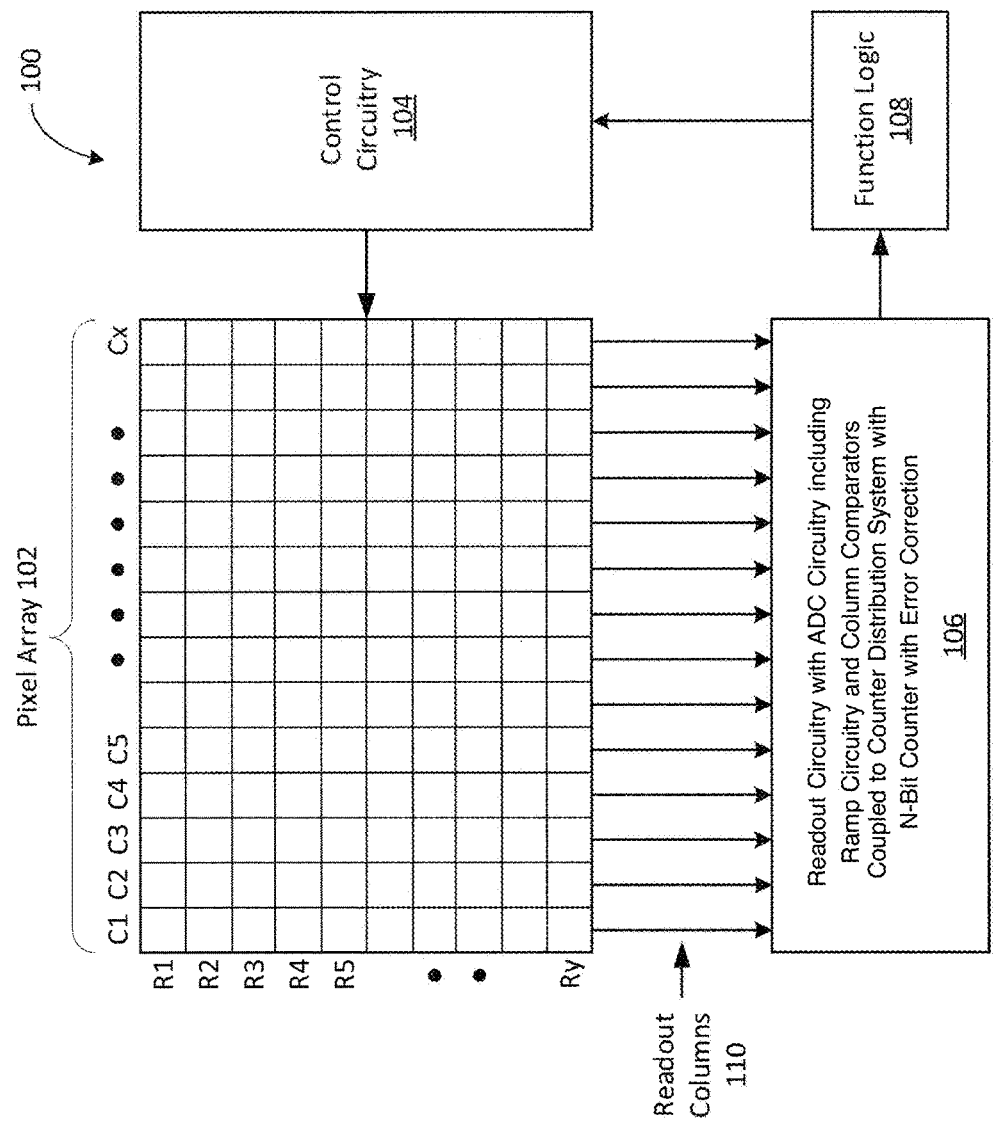
FIG. 1 is a block diagram that shows one example of an imaging system including a Gray code counting signal distribution system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Methods and apparatuses for distributing counter signals of an N bit Gray code counting system with error correction are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be shown, examples of distributing counting signals of an N bit Gray code counting system with error correction are disclosed. In the various examples, the N bit Gray code counter may include multiple stages. In one example, a lower counter is a first stage followed by an upper counter including one or more additional stages. In one example, the lower counter has a first output that has M bits, and the upper counter has N-M bits as well as L redundant least significant bit(s), which provides an error correction function for the N bit counter in accordance with the teachings of the present invention. In various depicted examples, the counter signals of the stages of the Gray code counter may be shared and used among one or more latches of the N bit counter.

By using a Gray code counter, power consumption is reduced because of a minimum number of code transitions in accordance with the teachings of the present invention. However, as the counting frequency and the number of bits of a Gray code counter increase, the signal phase alignment of all the bits of Gray code becomes more difficult, especially for a column parallel counter architecture utilized in image sensor applications. An example in accordance with the teachings of the present invention provides a solution of phase alignment between the upper and lower bits of multi stage counter by utilizing a phase shift for the upper bits with a redundant bit and error correction. In so doing, the strict signal phase alignment requirement is limited only to the lower bit counter, which makes it significantly easier to design a fast counter circuit with a large number of counter signals that may be shared and used among many latches in an image sensing application in accordance with the teachings of the present invention. Examples of the disclosed N bit counter include an error correction controller that provides an error correction function. In one example, the error correction is provided by comparing the least significant bit of the second output and the most significant bit of the first output after the Gray to Binary code conversion. Depending on the result of the comparison, error correction operations may be performed on the N-M most significant bits of the upper counter as needed in accordance with the teachings of the present invention.

To illustrate, FIG. 1 illustrates one example of an imaging system 100 including readout circuitry that includes readout circuitry with an example a counter signal distribution system including a multi stage N bit counter with error correction in accordance with the teachings of the present invention. As shown, imaging system 100 includes pixel array 102, control circuitry 104, readout circuitry 106, and function logic 108. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. In another example, however, it is appreciated that photodiodes do not necessarily have to be arranged into rows and columns, and may take other configurations in accordance with the teachings of the present invention.

In one example, after each image sensor photodiode/pixel in pixel array 102 has acquired its image charge through photo-generation of the image charge, the corresponding image data is read out by readout circuitry 106, and the digital representation of the image data is then transferred to function logic 108. Readout circuitry 106 may be coupled to read out image data from the plurality of photodiodes in pixel array 102. In various examples, readout circuitry 106 may include amplification circuitry and analog-to-digital (ADC) conversion circuitry including ramp circuitry and at least one column comparator coupled to a counter signal distribution system including at least one multi stage column N bit Gray code counter with error correction as will be discussed, or otherwise. In one example, readout circuitry 106 may read out a row of image data at a time along readout column lines 110 (illustrated) or may read out the image data using a variety of other techniques (not illustrated), such as a serial read out or a full parallel read out of all pixels simultaneously. Function logic 108 may store the image data or even manipulate the image data by applying post image effects (e.g., crop, rotate, remove red eye, adjust brightness, adjust contrast, or otherwise). In some examples, function logic 108 may require certain imaging conditions to be met and may therefore instruct the control circuitry 104 to manipulate certain parameters in pixel array 102 to achieve better qualities or special effects.

In imaging system 100, a ramp signal comparison type ADC is used in readout circuitry 106 to convert the pixel signal amplitude data read from pixel array 102 into digital image data. In the ramp type ADC included in readout circuitry 106, an N bit Gray code counter starts to count when a ramp signal begins, which is compared to an image signal. At the point when the ramp signal and the image signal are equal, the value of the counter is latched as a digital representation of the analog image signal. In one example, the counter signals may be distributed and shared among a plurality of latches to perform the analog to digital conversion of the pixel values from the image sensor. In one example, the ADC counting is performed once for pixel reset signals, and once for combined signals to perform the analog to digital conversion of the pixel values from the image sensor. In an example with correlated double sampling (CDS), the difference of the two counter values between a pixel reset signal and a combined signal may be determined to return a true final ADC signal of any given pixel in accordance with the teachings of the present invention.

Figure 2:
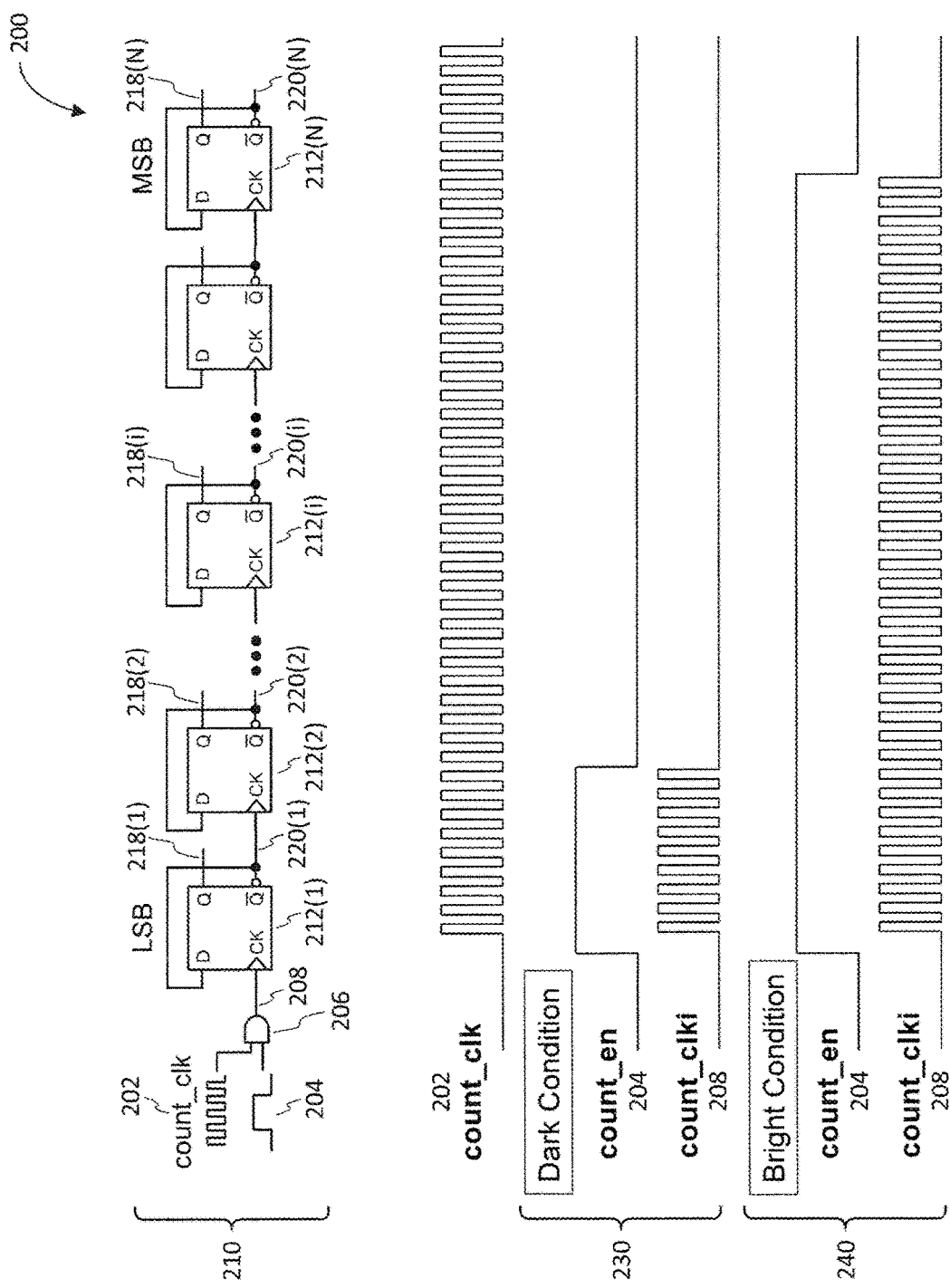
FIG. 2 is a block diagram illustrating one example of a ripple carry binary counter circuit and associated waveforms.

FIG. 2 is a block diagram 200 illustrating one example of a ripple carry binary counter circuit, which may also be referred to as a ripple counter 210, and associated waveforms that may be included in ADC circuitry of an imaging system. As shown in the illustrated example, ripple counter 210 includes a plurality of D flip-flops (DFFs) 212(1) to 212(N) that are coupled in series to form a DFF train. The clock input CK of the first DFF 212(1) in a DFF train is driven by an enabled counter clock signal count_clki 208. The count_clki 208 is a counter clock count_clk 202 enabled by a counter enable signal count_en 204 through an AND gate 206. Each of the inverted output Q_bar signal 220($i$) of each DFF 212($i$) is fed back to its own data D input as well as the clock input CK of the next DFF 212($i$+1) in the DFF train, when there is a next DFF 220($i$+1) in the DFF train. The resulting counting frequency of each clock signal introduced to a next clock input CK of a subsequent DFF 212($i$+1) is divided by 2 at the output Q_bar 220($i$) of each DFF 212($i$).

As stated, the counting frequency introduced to the CK input of each subsequent DFF 212($i$+1) is half of the counting frequency of the previous DFF 212($i$). In the depicted example, the output Q 218(1) of the first DFF 212(1) to the leftmost of FIG. 2 represents the least significant bit (LSB) of the ripple counter 210, while the output Q 218(N) of the last DFF 212(N) to the rightmost of FIG. 2 represents the most significant bit (MSB) of the ripple counter 210. The number N of DFFs in a ripple counter is the same number of output bits of the ripple counter 210.

The dark signal condition 230 shown in the example of FIG. 2 illustrates that there are less clock cycles of actual counter clock count_clki 208 needed to convert relative smaller amplitude under a dark signal condition 230 compared to a bright signal condition 240. As shown, under a bright signal condition 240, there are more clock cycles of actual counter clock count_clki 208 in order to convert relative larger amplitude image signal. Each clock cycle consumes power, and therefore more clock cycles leads to larger power consumption.

Figure 3A:
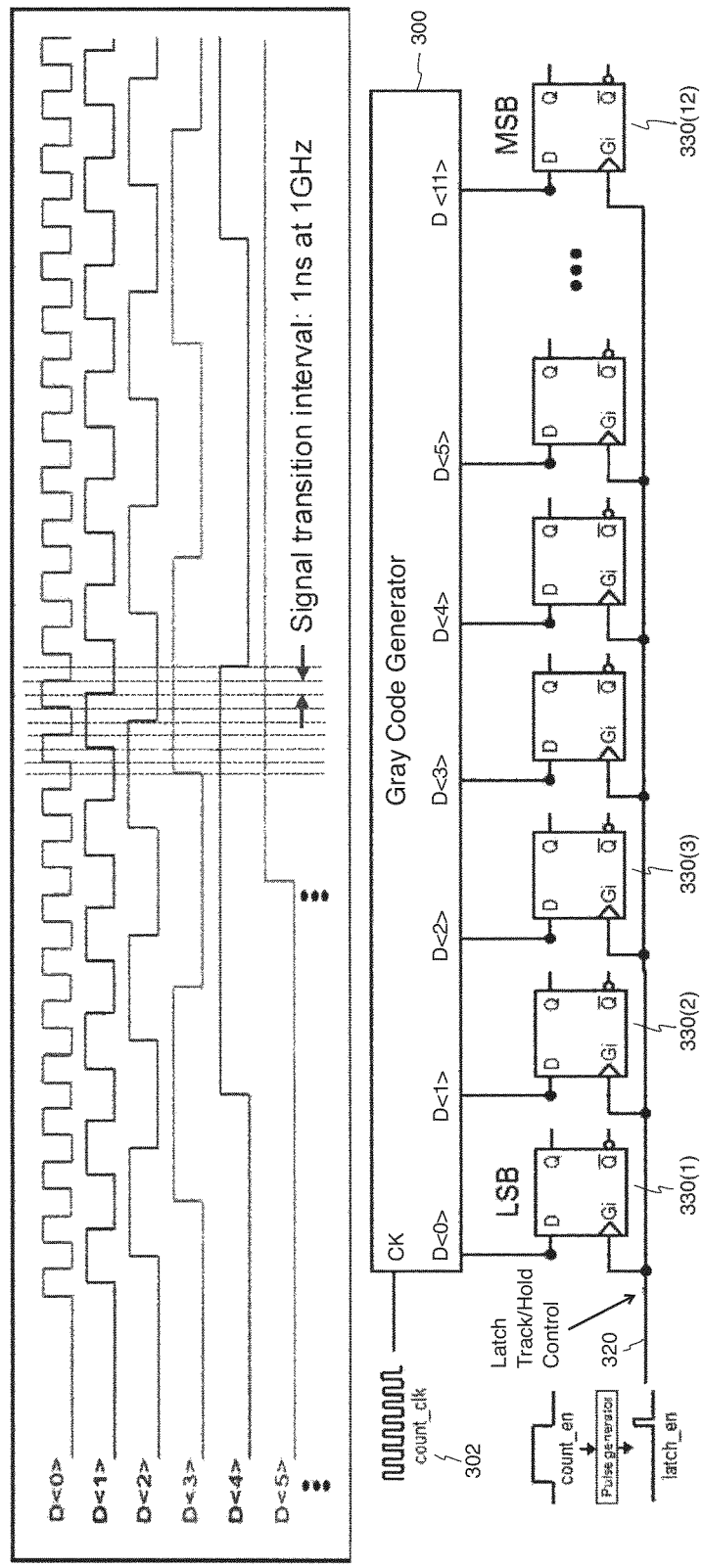
FIG. 3A is a block diagram illustrating an example counter signal distribution system structure including a single Gray code counter that generates signals from the LSB to the MSB.

FIG. 3A is a block diagram illustrating an example counter structure that utilizes a Gray code generator 300. Each Gray code output bit of Gray code generator 300 is represented with bits D<0> (LSB) to D<11> (MSB). It is noted of course that the number of bits (e.g., D<0> to D<11>) illustrated in FIG. 3A, and throughout this disclosure, is for explanation purposes and that in other examples, Gray code generator 300 may include a greater number or a fewer number of bits in accordance with the teachings of the present invention. In the depicted example, each Gray code output bit D<0> to D<11> from Gray code generator 300 is coupled to be stored or latched in a respective latch 330(1) to 330(12) in response to a latch enable signal latch_en 320.

Gray code is a representation of binary code where any two successive values in a consecutive order differ in only one digital bit. When used in digital counters, Gray code limits the number of valid transitions among all binary bits between any two successive values in an ordering system to one. That is a least possible number to reach. The minimized number of valid bit transitions of Gray code counters results in less power consumption compared to binary counters.

Figure 3B:
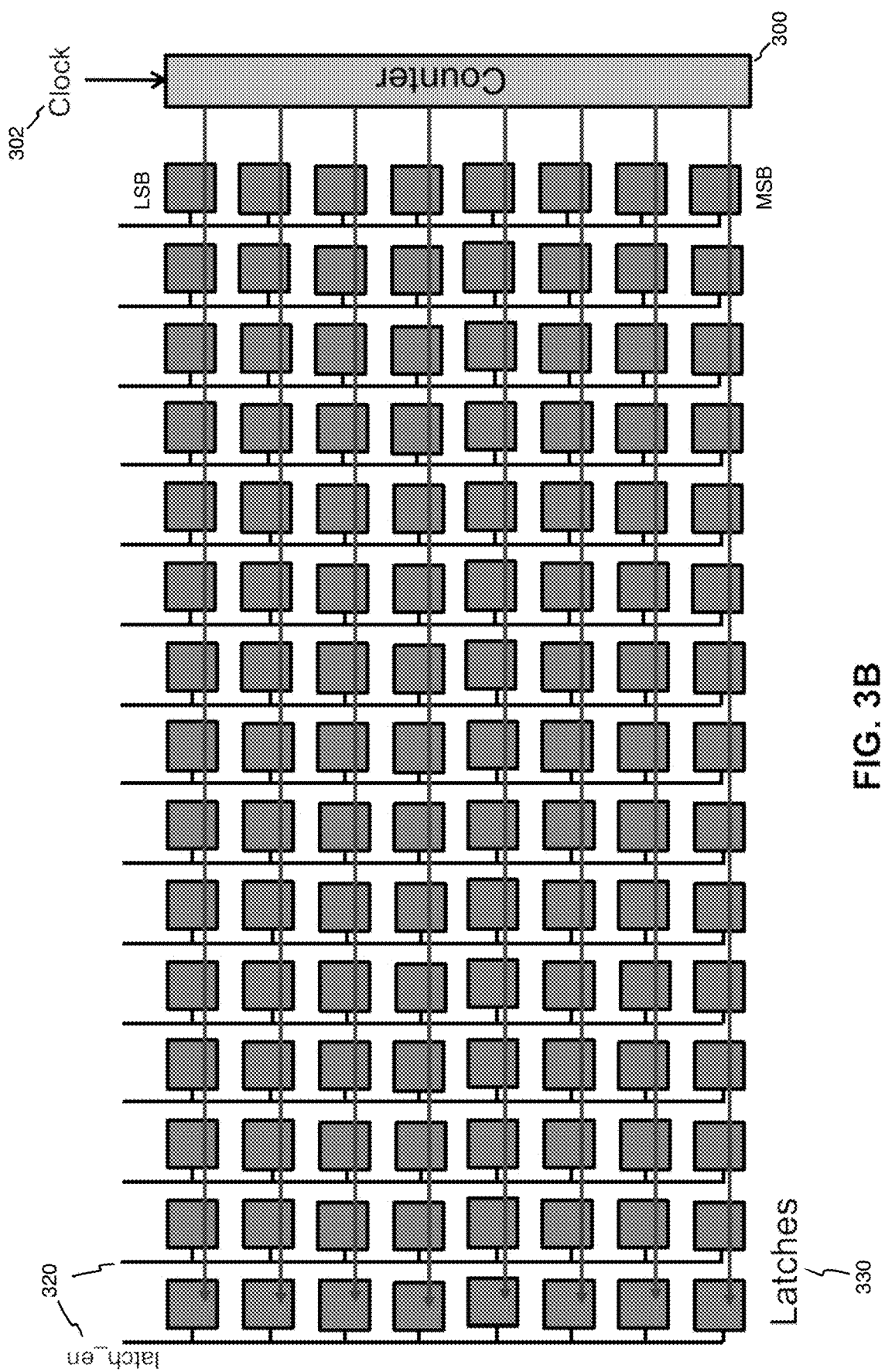
FIG. 3B is a block diagram illustrating an example counter signal distribution system structure including a single Gray code counter that generates signals that are shared by a plurality of latches from the LSB to the MSB.

FIG. 3B is a block diagram illustrating an example counter signal distribution system structure including a single Gray code counter 300 that generates signals, in response to a counting clock 302, that are distributed and shared among a plurality of latches 330 from the LSB to the MSB. In the depicted example, the Gray code counter 300 generates a plurality of data bits, which includes the LSB on one end and the MSB on the other end as shown. It is appreciated that the Gray code counter 300 and plurality of latches 330 of FIG. 3B may be examples of Gray code counter 300 and the plurality of latches 300 of FIG. 3A, and may be included in ADC circuitry of an imaging sensor for all readout columns (e.g., readout columns 110).

It is noted that the orientation or arrangement of each "column" of latches 330 (top to bottom) as illustrated in FIG. 3B corresponds to the "row" of latches 330 (left to right) as illustrated in FIG. 3A. Therefore, for the purposes of this disclosure, it is appreciated that the term "column" of latches 330, as shown in FIG. 3B may be used interchangeably with the term "row" of latches 330, as shown in FIG. 3A. In this regard, it is also appreciated that terms "column" and/or "row" may also be referred to interchangeably with the term "grouping" or "group" of latches 330 for throughout this disclosure, such that each latch of a grouping latches 330 is coupled to store the respective data bit (e.g., D<0> to D<11>) received from the respective data bit line (e.g., LSB to MSB) in response to a respective latch enable signal 320.

Referring back to the example depicted in FIG. 3B, each column of latches 330 (e.g., grouping of latches) is coupled to store a respective data bit from the Gray code counter 300 in response to a respective latch enable signal latch_en 320 as illustrated. Sharing a Gray code counter 300 among a plurality of latches 330 is one solution to reduce power consumption in column counters for an imaging system.

Figure 3C:
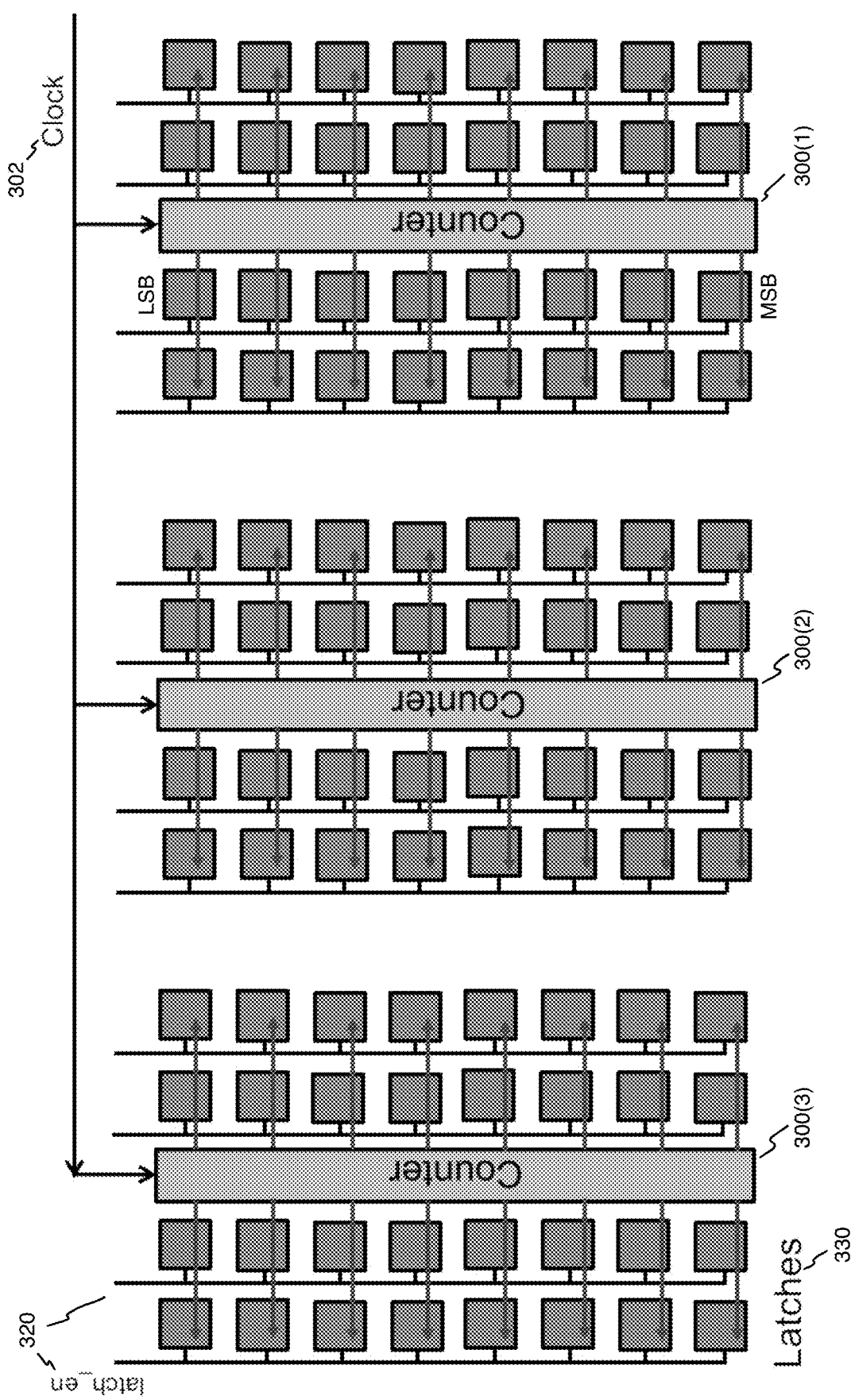
FIG. 3C is a block diagram illustrating an example counter signal distribution system structure including a plurality of Gray code counters that generate signals that are shared by a plurality of latches from the LSB to the MSB.

FIG. 3C is a block diagram illustrating an example counter signal distribution system structure including a plurality of Gray code counter that generate signals from the LSB to the MSB a that are shared by a plurality of latches 330. It is appreciated that the Gray code counting structure of FIG. 3C may be another example of Gray code counter 300 and the plurality of latches 300 of FIGS. 3A-3B, and that similarly named and numbered elements described above are coupled and function similarly below. It is also noted that the counter structure illustrated in FIG. 3C shares many similarities with the counter structure illustrated in FIG. 3B.

However, one difference however between FIG. 3C and FIG. 3B, is that the Gray code counter structure illustrated in FIG. 3C includes a plurality Gray code counters 300(1), 300(2), 300(3) that are shared by the plurality of latches 330. In the depicted example, the plurality of latches are organized into blocks, with each block of latches 330 coupled to a corresponding one of the plurality of Gray code counters 300(1), 300(2), 300(3). Thus, each block of latches 330 is a subset of all of the latches 330, and each block of latches 330 is spread over a plurality of columns of latches 330 or a plurality of groupings of latches 330. For instance, as shown in the example depicted in FIG. 3C, each block of latches 330 includes four columns or groupings of latches 330 that are coupled to the data bit lines of a corresponding one of the plurality of Gray code counters 300(1), 300(2), 300(3). As such, each of the data bits that is generated by each of the Gray code counters 300(1), 300(2), 300(3) is shared among a respective block of latches 330. Stated in another way, the example shown in FIG. 3C illustrates that each of the data bits that is generated by each data bit output by of the Gray code counters 300(1), 300(2), 300(3) is shared among four latches 330. In other examples, it is appreciated that each block of latches 330 may include a different number of columns or grouping such that each data bit generated by the Gray code counters 300(1), 300(2), 300(3) may be shared among a greater number than four latches 330, or a fewer number than four latches 330.

One of the considerations regarding the example Gray code counting structures and signal distributions in the systems illustrated in FIGS. 3A-3C is that precise signal transition intervals must be maintained between all of the data bits from the LSBs to the MSBs of the Gray code counts. For instance, in practice, for a counting clock 302 having a 1 GHz counting frequency or a period of 1 ns, it becomes increasingly challenging to maintain the phase relationship among a large number of internal signals with increasing propagation delays resulting from circuit elements being placed further apart, and eventually for example, between D<0> and D<11>. Therefore, as the counting clock 302 frequencies increase, it becomes increasingly difficult for the Gray code counting structures of FIGS. 3A-3C to be able to align its output data D<0> and D<11> under required timing tolerances for the plurality of latches 330 to reliably acquire their data enabled by the same latch enable signal latch_en 320.

One solution to overcome the phase alignment challenge among signals in a single Gray code generator is to utilize a multi stage counter. As shown in the example depicted in FIG. 4A, a Gray code counting system 400 includes a split multi stage (e.g., two stage) Gray code counter that includes a Lower Bit Counter (LBC) 410 that does not have too many bits, and therefore does not suffer from the phase alignment challenges discussed above. In addition, Gray code counting system 400 also includes an Upper Bit Counter (LBC) 460, which generates the upper data bits that can be concatenated with the lower data bits output by the LBC 410 to provide a Gray code count. It is appreciated that the Gray code counting structure of FIG. 4A may be another example of the Gray code counting structure of FIGS. 3A-3C, and that similarly named and numbered elements described above are coupled and function similarly below.

Figure 4A:
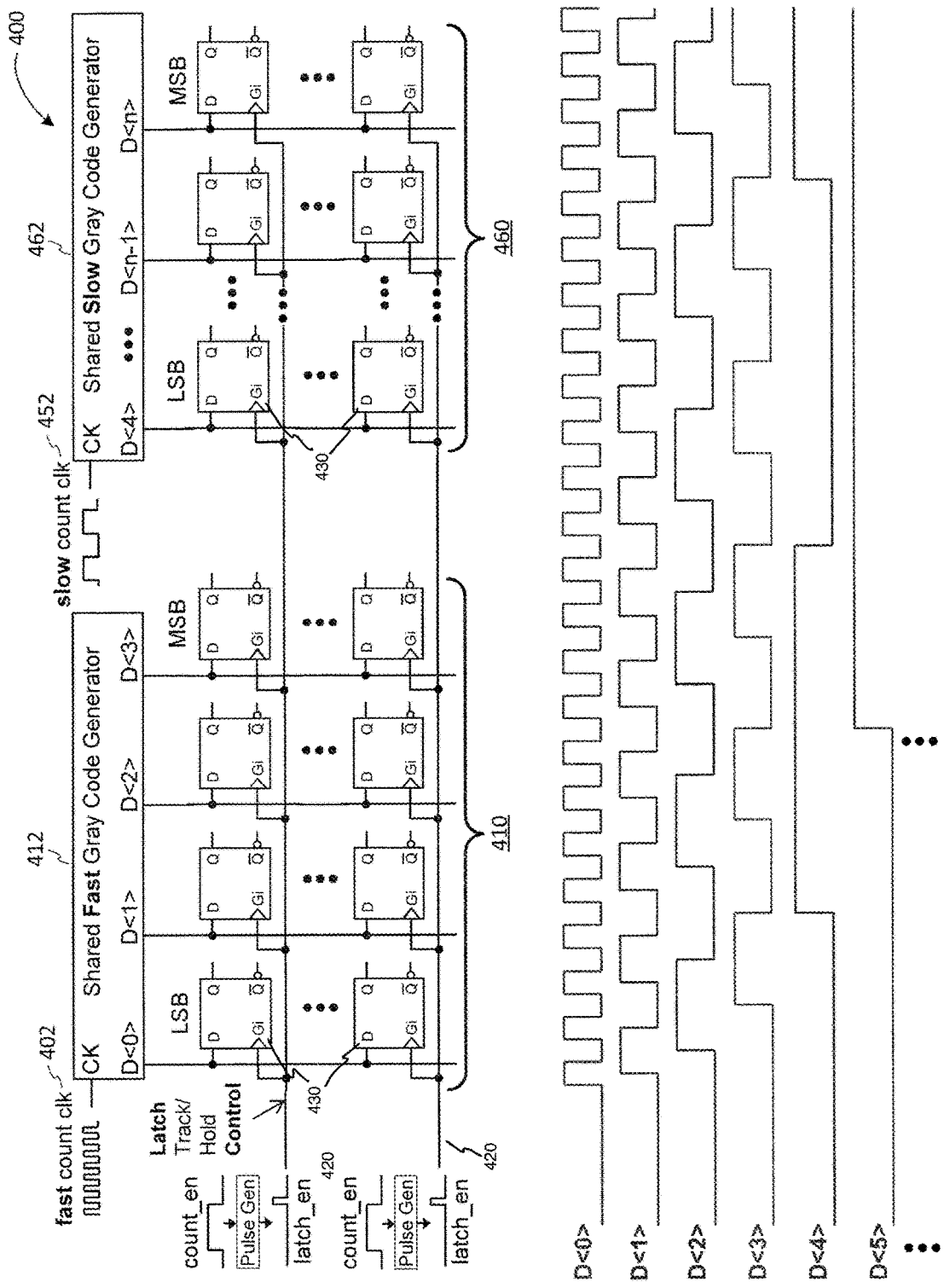
FIG. 4A is a block diagram illustrating an example multi stage counter signal distribution system structure including a lower bit Gray code counter and an upper bit Gray code counter that are shared by a plurality of latches.

In the example depicted in FIG. 4A, a lower bit counter 410 is illustrated as generating 4 lower output bits and runs at a first counting frequency under a first clock 402. The UBC 460 generates the upper output bits, but runs at a second counting frequency under a slow second clock 452. The Lower Bit Counter 410 has a fast Gray Code Generator 412 generating lower output bits D<0> D<1> D<2> D<3>, which are shared by a first plurality of latches 430, and runs at a high counting frequency of fast count clock 402. In one example, the LBC 410 may be a 4-bit counter operating at a 1 GHz counting frequency.

The UBC 460 has a slow Gray Code Generator 462 generating upper output bits D<4> . . . D<n−1>, and D<n>, which are shared by a second plurality of latches 430, and runs at a slow counting frequency of slow count clock 452. It is noted that the first plurality of latches 430 is illustrated as including the same number of latches 430 as the second plurality of latches 430 in FIG. 4A. In another example, it is appreciated that the number of the first plurality of latches 430 that share each of the lower output bits of the fast Gray Code Generator 412 may be a different number (e.g., less than) of latches 430 from the number of the second plurality of latches 430 that share each of the upper output bits of the slow Gray Code Generator 462. In various examples, the UBC 460 may operate at a much slower counting frequency, such as for instance 62.5 MHz, which is 1 GHz divided by 16 (=$2^4$), and may therefore have as many output bits as demanded.

Figure 4B:
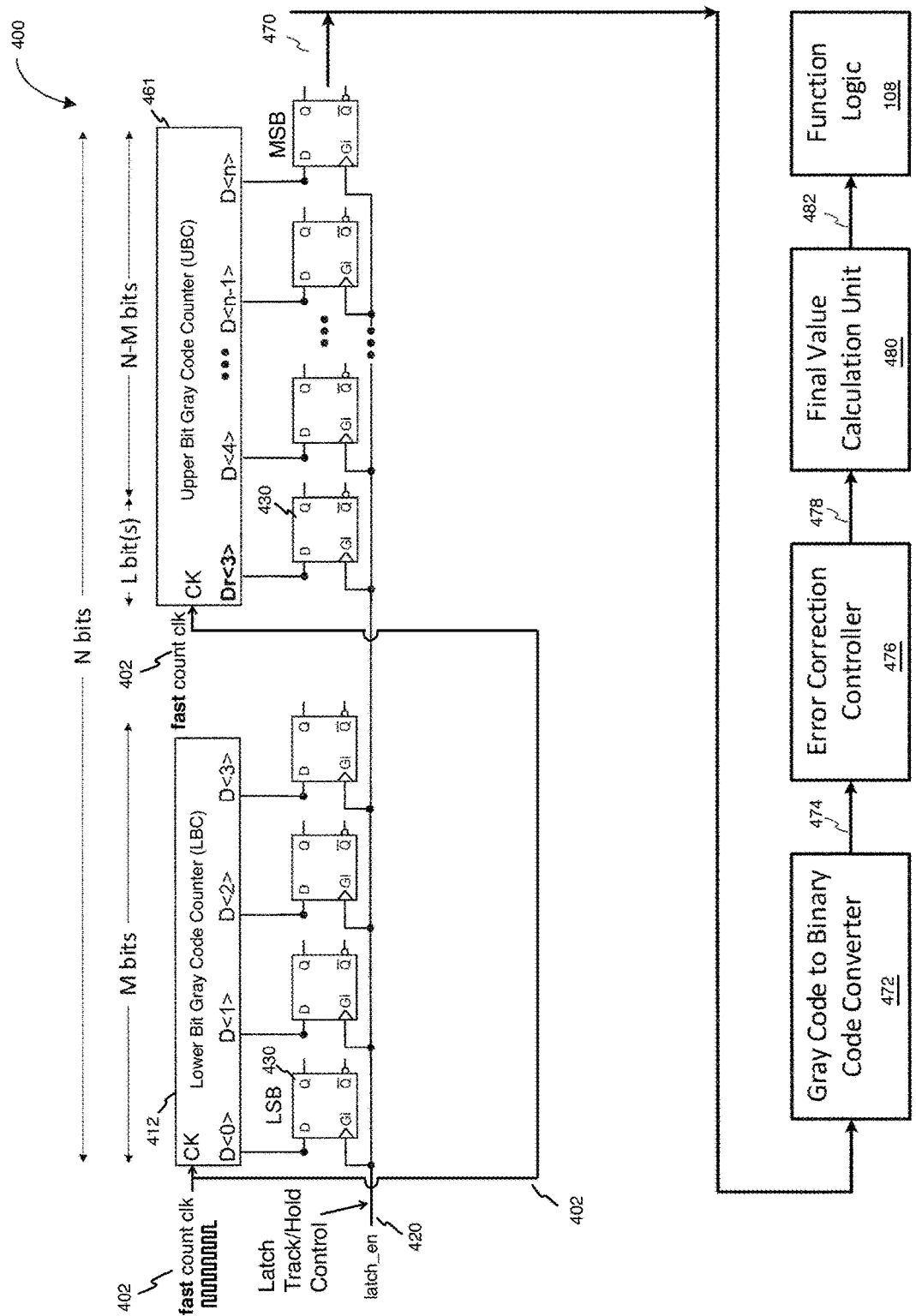
FIG. 4B is a block diagram illustrating an example of an N bit multi stage Gray code counter signal distribution system structure with a redundant bit with processing blocks that provide error correction operations in accordance with the teachings of the present invention.

FIG. 4B is a block diagram illustrating an example of an N bit multi stage Gray code counter signal distribution system structure 400 with a redundant bit with processing blocks that provide error correction operations for use in an imaging system, such as imaging system 100 of FIG. 1, in accordance with the teachings of the present invention It is appreciated that the Gray code counting structure 400 of FIG. 4B shares many similarities with the Gray code counting systems described above, and that similarly named and numbered elements described above are coupled and function similarly below. One of the differences between the Gray code counting system 400 illustrated in FIG. 4B and Gray code counting system 400 illustrated in FIG. 4A is that the Gray code counting system 400 of FIG. 4B is illustrated with a redundant bit to provide error correction operations in accordance with the teachings of the present invention. Another difference between the Gray code counting system 400 illustrated in FIG. 4B and Gray code counting system 400 illustrated in FIG. 4A is that the example upper bit Gray code counter 461 illustrated in FIG. 4B is coupled to run at the same high counting frequency of fast count clock 402 as the lower bit Gray code counter 412.

To illustrate, the example shown in FIG. 4B shows that Gray code counting system 400 generates N bit Gray code counter values by utilizing an M bit lower bit Gray code counter (LBC) 412 and an N-M+L bit upper bit Gray code counter (UBC) 461. Stated in another way, the LBC 412 generates the M least significant bits (LSBs) and UBC 461 generates the N-M most significant bits (MSBs) of the Gray code count. In the example, the LBC 412 operates in response to a fast count clock 402 and generates the lower M bits (e.g., D<0>, D<1>, D<2>, D<3>) of the N bit Gray code count. The UBC 461 operates in response to the same fast count clock 402 and generates the upper N-M bits (e.g., D<4>, . . . , D<n-1>, D<n>), which are concatenated with the M bits output by the LBC 412 to generate the N bit Gray code count. In addition, UBC 461 also generates L redundant bit(s) (e.g., Dr<3>) for error correction, where L is greater than or equal to one. In the example depicted in FIG. 4B, L=1. As shown in the example, each of the output data bits of the Gray code counting system 400 is coupled to and shared by one or more latches 430 in response to a latch enable signal latch_en 420.

The example depicted in FIG. 4B also illustrates one example of processing blocks that may be utilized to provide error correction operations, some of which may be included in the readout circuitry of an imaging system, as illustrated for example in FIG. 1. As shown in FIG. 4B, the Gray code data output from LBC 412 and UBC 461 is latched in latches 430 in response to a latch enable signal 420. The latched Gray code data is then transferred out of the readout column 470 and input to a Gray code to binary code converter 472. As shown, the Gray code to binary converter 472 is coupled between an error correction controller 476 and the latches 430. In operation, the Gray code to binary converter 472 is coupled to convert any Gray code data that is generated by LBC 412 and/or UBC 461 to binary data, which is then coupled to be received by the error correction controller 476. Thus, in an example in which UBC 461 includes a binary counter instead of a Gray code counter, Gray code to binary code converter 476 does not need to perform a Gray code to binary conversion for the output values of UBC 461. On the other hand, if UBC 461 includes a Gray code counter, the Gray code to binary code converter 472 performs the Gray code to binary conversion for the output values of UBC 461.

Binary code 474 is received by the error correction controller 476 where error correction operations, which will be described in further detail below, are performed to correct errors in the counter values of the UBC 461 if needed. Corrected counter values 478 from error correction controller 476 are output to a final value calculation unit 480 to be combined or concatenated together to form a correct N bit counter value. In operation, one example of final value calculation unit 480 is coupled to receive the M bits of LBC 412 and the corrected N-M MSBs of UBC 461 from the error correction controller 476. The final value calculation unit 480 is coupled to combine the M bits of LBC 412 with the corrected N-M MSBs of UBC 461 to generate an error corrected N bit output of the N bit counter in accordance with the teachings of the present invention. In one example, a subtraction or differencing operation (between a reset ADC data and a signal ADC data) may also take place in final value calculation unit 480 to provide out correlated double sampling (CDS) when needed before corrected final digital image data 482 is fed to the Function Logic 108 (as shown for example in FIG. 1) of an imaging system in accordance with the teachings of the present invention.

Figure 4C:
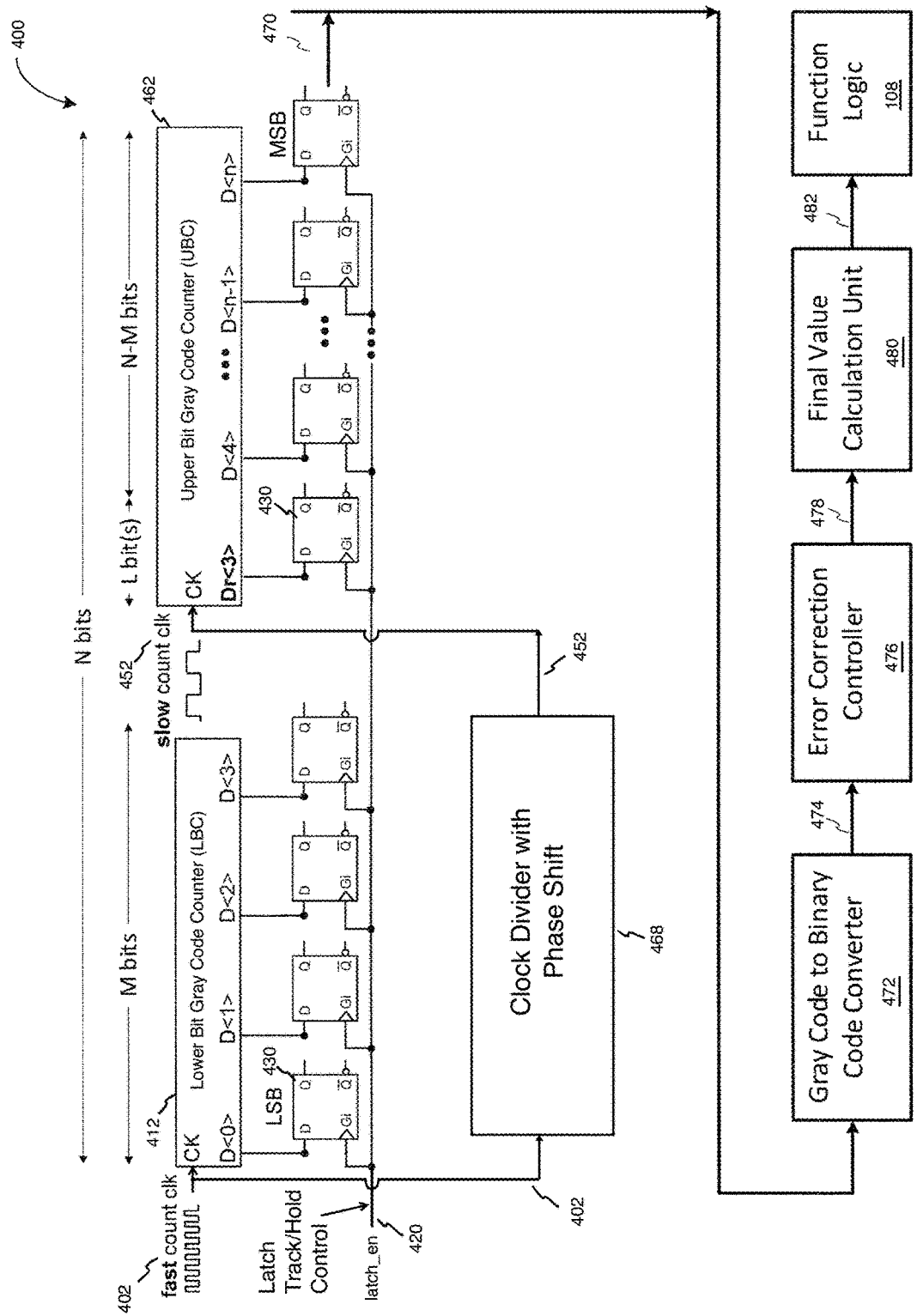
FIG. 4C is a block diagram illustrating another example of an N bit multi stage Gray code counter signal distribution system structure with a redundant bit including a clock divider with phase shift with processing blocks that provide error correction operations in accordance with the teachings of the present invention.

FIG. 4C is a block diagram illustrating another example of an N bit multi stage Gray code counter signal distribution system structure 400 including a redundant bit including a clock divider with phase shift with processing blocks that provide error correction operations in accordance with the teachings of the present invention. It is appreciated that the Gray code counting structure 400 of FIG. 4C shares many similarities with the Gray code counting systems described above, and that similarly named and numbered elements described above are coupled and function similarly below. One of the differences between the Gray code counting system 400 illustrated in FIG. 4C and Gray code counting system 400 illustrated in FIG. 4B is that the Gray code counting system 400 of FIG. 4C is illustrated with a clock divider with phase shift 468 in accordance with the teachings of the present invention.

As will be discussed, the example Gray code counting system 400 of FIG. 4C and subsequently described examples include a clock divider with phase shift to insert a phase difference between the fast clock signal and the slow clock signal utilized by the lower and upper bit counters in accordance with the teachings of the present invention. In the described examples, the routing of the fast clock signal is shortened. In addition, the number of elements (e.g., latches) that are coupled to each of the output data bits of the fast clocked lower bit counters is also reduced. As such, power consumption is reduced and signal integrity is improved by the counter signal distribution system in accordance with the teachings of the present invention.

Similar to the example shown in FIG. 4B, the example shown in FIG. 4C shows that Gray code counting system 400 generates N bit Gray code counter values by utilizing an M bit lower bit Gray code counter (LBC) 412 and an N-M+L bit upper bit Gray code counter (UBC) 462. The LBC 412 operates in response to a fast count clock 402 and generates the lower M bits (e.g., D<0>, D<1>, D<2>, D<3>) of the N bit Gray code count. However, the example shown in FIG. 4C also shows that UBC 462 operates in response to a slow count clock 452 and generates the upper N-M bits (e.g., D<4>, . . . , D<n-1>, D<n>), which are concatenated with the M bits output by the LBC 412 to generate the N bit Gray code count.

In the depicted example, UBC 462 also generates L redundant bit(s) (e.g., Dr<3>) for error correction, where L is greater than or equal to one. In the example depicted in FIG. 4C, L=1. In the depicted example, the fast count clock 402 is divided and phase shifted with a clock divider with phase shift 468 to generate the slow count clock 452. In one example, the clock divider with phase shift 468 may be implemented with an efficient combined circuit implementation to divide and phase shift the fast count clock 402. In another example, the clock divider with phase shift 468 may be implemented with separate clock divider circuitry having an output coupled to an input of a separate phase shift circuit. In the examples, the clock divider circuitry of clock divider with phase shift 468 is coupled to divide the fast count clock 402 by an amount based on the number of output data bits of the LBC 412 and the redundant bit(s), and the phase shift circuitry of the clock divider with phase shift 468 is coupled to phase shift the output of the clock divider circuitry by a phase shift amount so that the slow count clock 452 is phase shifted by the phase shift amount relative to the fast count clock 402. As shown in the example, each of the output data bits of the Gray code counting system 400 is coupled to and shared by one or more latches 430 in response to a latch enable signal latch_en 420. In another example, it is appreciated that UBC 462 may be implemented using an N-M+L bit binary counter or ripple counter instead of a Gray counter.

Similar to the example shown in FIG. 4B, the example shown in FIG. 4C shows that the example of the processing blocks that may be utilized to provide error correction operations, some of which may be included in the readout circuitry of an imaging system, as illustrated for example in FIG. 1. As shown in FIG. 4C, the Gray code data output from LBC 412 and UBC 462 is latched in latches 430 in response to a latch enable signal 420. The latched Gray code data is then transferred out of the readout column 470 and input to a Gray code to binary code converter 472. As shown, the Gray code to binary converter 472 is coupled between an error correction controller 476 and the latches 430. In operation, the Gray code to binary converter 472 is coupled to convert any Gray code data that is generated by LBC 412 and/or UBC 462 to binary data, which is then coupled to be received by the error correct controller 476. Thus, in an example in which UBC 462 includes a binary counter instead of a Gray code counter, Gray code to binary code converter 476 does not need to perform a Gray code to binary conversion for the output values of UBC 462. On the other hand, if UBC 462 includes a Gray code counter, the Gray code to binary code converter 472 performs the Gray code to binary conversion for the output values of UBC 462.

Binary code 474 is received by the error correction controller 476 where error correction operations, which will be described in further detail below, are performed to correct errors in the counter values of the UBC 462 if needed. Corrected counter values 478 from error correction controller 476 are output to a final value calculation unit 480 to be combined or concatenated together to form a correct N bit counter value. In operation, one example of final value calculation unit 480 is coupled to receive the M bits of LBC 412 and the corrected N-M MSBs of UBC 462 from the error correction controller 476. The final value calculation unit 480 is coupled to combine the M bits of LBC 412 with the corrected N-M MSBs of UBC 462 to generate an error corrected N bit output of the N bit counter in accordance with the teachings of the present invention. In one example, a subtraction or differencing operation (between a reset ADC data and a signal ADC data) may also take place in final value calculation unit 480 to provide out correlated double sampling (CDS) when needed before corrected final digital image data 482 is fed to the Function Logic 108 of an imaging system.

As discussed above, in the gray code counter without redundant bit(s), precise signal transition intervals must be maintained between all of the data bits from the LSBs to the MSBs of the Gray code counts, and as the counting clock frequencies increase, it becomes increasingly difficult for ordinary Gray code counting structures to reliably acquire their data. To illustrate, FIG. 5 is an example diagram 500 that shows ideal properly aligned output values of a Lower Bit Counter Gray code generator and an Upper Bit Counter Gray code generator, as illustrated for instance in FIG. 4A. FIG. 5 also illustrates the combined values and expected values. As shown, for a 2-stage Gray counter, the Lower Bit Counter counts up continuously in Gray code with an equivalent counter value 520 shown in FIG. 5. Its Upper Bit Counter also counts up continuously in Gray code with an equivalent counter value 530 shown in FIG. 5. As shown, when the phase of the all the output values are properly aligned, the combined counter value 540 of both Lower Bit Counter and Upper Bit Counter matches the expected value 510.

Figure 6:
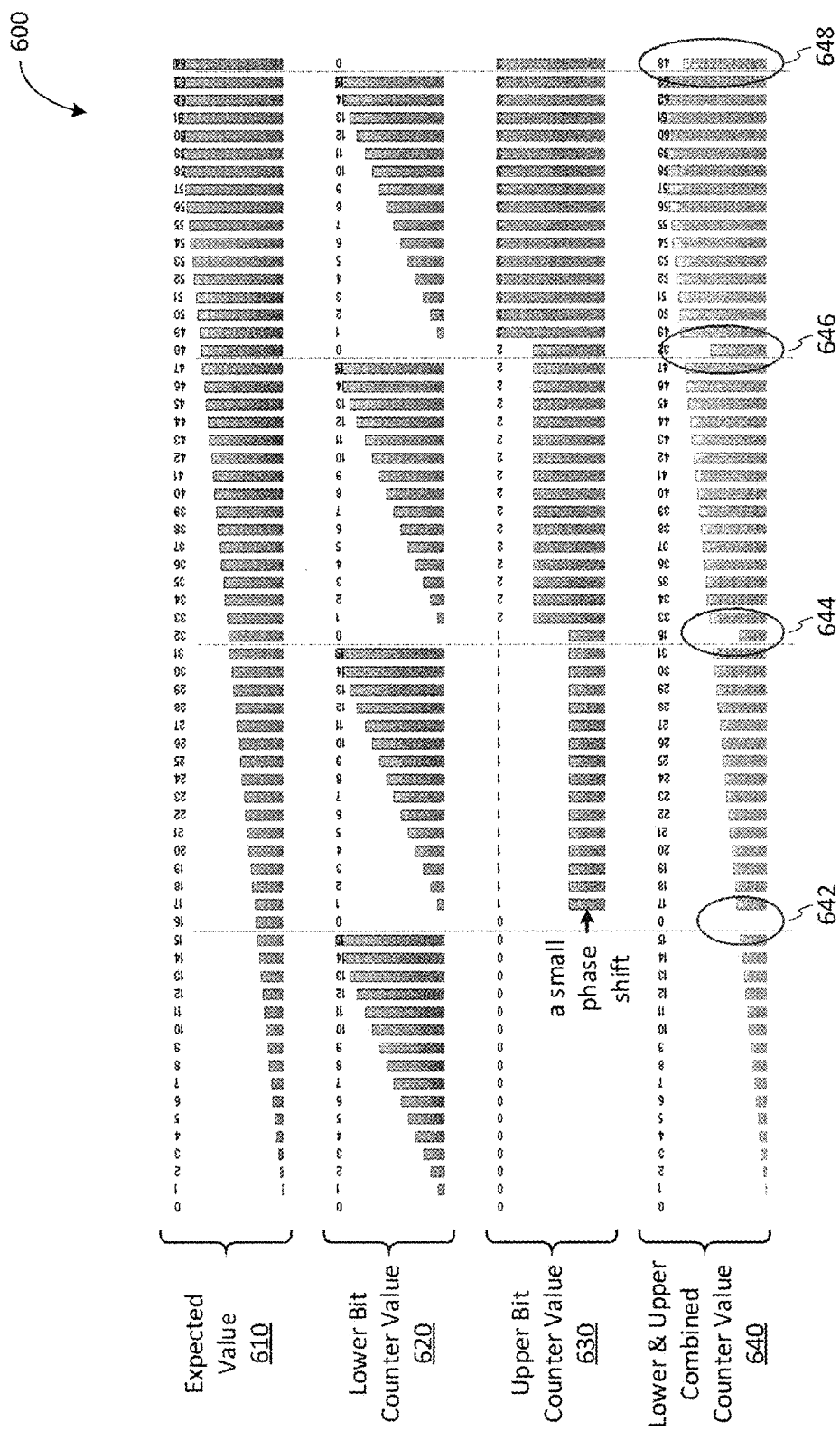
FIG. 6 is a diagram illustrating output values of a Lower Bit Counter Gray code generator, an Upper Bit Counter Gray code generator, combined values, and expected values that suffer from unwanted phase shift.

FIG. 6 is a diagram 600 that shows output values of a Lower Bit Counter Gray code generator and an Upper Bit Counter Gray code generator in which precise signal transition intervals is not maintained. To illustrate, FIG. 6 shows the output values of a Lower Bit Counter Gray code generator, an Upper Bit Counter Gray code generator, combined values, and expected values that may suffer from an unwanted phase shift. As shown, for a 2 stage Gray counter with phase alignment differences between the output bits of for instance LBC 410 and UBC 460 of FIG. 4A, problems starts to appear as demonstrated in FIG. 6. Although each LBC 410 and UBC 460 still counts normally individually as shown by 620 and 630, since the count of UBC 460 of FIG. 4A experiences a delay (e.g., a small phase shift), when combined together, due to the misalignment in timing, the resulting counter value 640 does not match the expected value 610 anymore at 642, 644, 646 and 648. Such phase sensitivity is an inherent serious challenge associated with fast speed 2-stage counter that doesn't include any special treatment.

Figure 7:
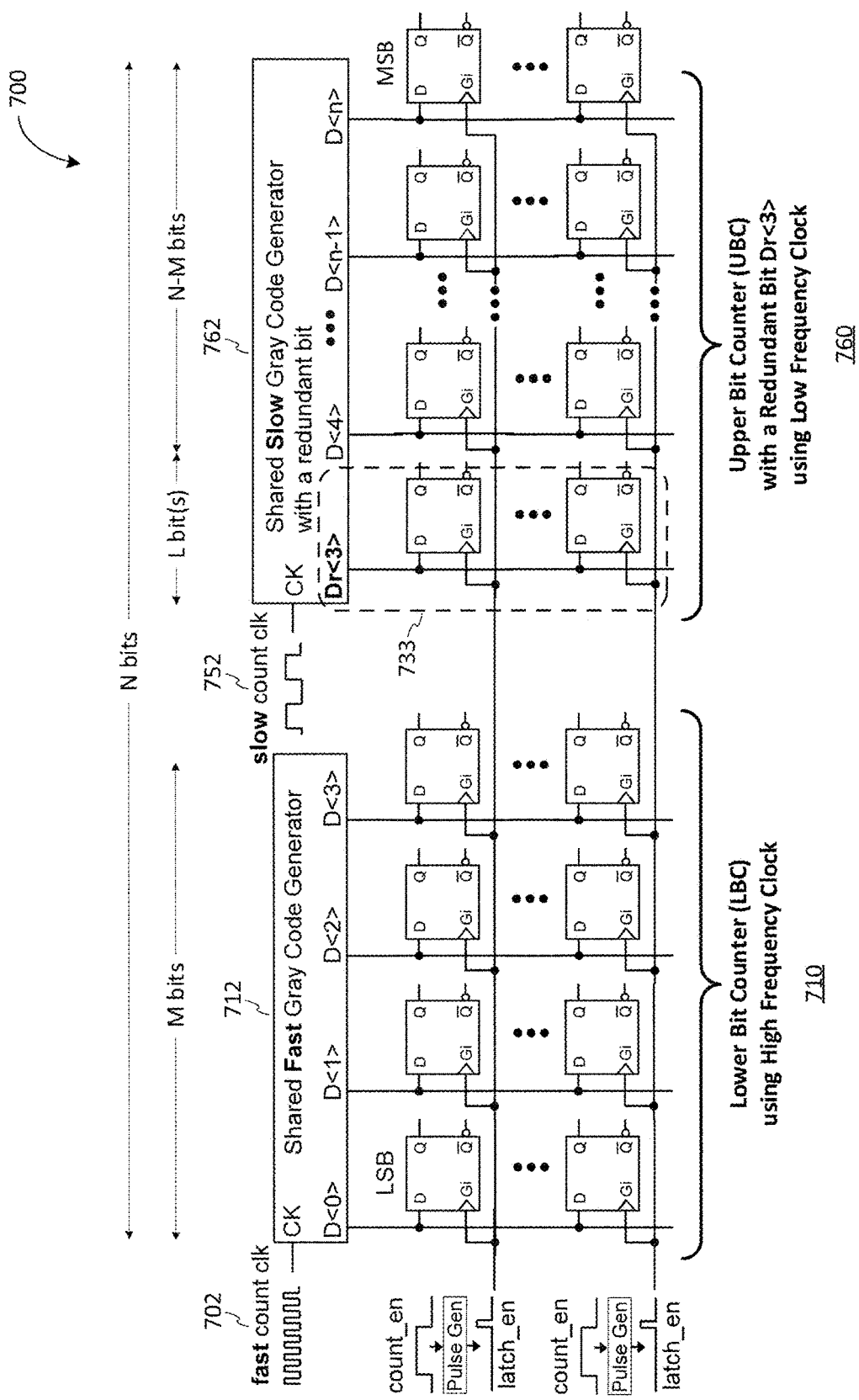
FIG. 7 is an illustration of one example of a multi stage N bit Gray counter with a redundant bit to correct the phase shift or phase alignment problems in accordance with the teachings of the present invention.

FIG. 7 is an illustration of one example of an N bit multi stage counter 700 with a redundant bit, which is used to correct the phase shift or phase alignment problems described above in accordance with the teachings of the present invention. As shown in the example illustrated in FIG. 7, an example multi stage counter is shown as a split two-stage N bit counter 700 that includes an LBC 710, which in the depicted example is a shared M bit Gray code counter that does not have too many bits, and therefore does not suffer internally from unwanted propagation delays or phase shifts. In the depicted example, M is less than N, and operates at a first counting frequency under a first clock 702. LBC 710 provides the M least significant bits (LSBs) of the N bit multi stage counter 700. For purposes of explanation, M=4 in the depicted example, and the M LSBs of LBC 710 are therefore labeled D<0> D<1> D<2> D<3>. It is appreciated that in other examples, M may be equal to values other than four in accordance with the teachings of the present invention. In the depicted example, UBC 760 is a shared N-M+L bit Gray code counter operates at a second counting frequency under a second clock 752, and can therefore have as many bits as needed. UBC 760 provides the N-M most significant bits (MSBs) of the N bit multi stage counter 700, which are labeled D<4> . . . D<n–1> D<n> in the example. In the illustrated example, UBC 760 also includes L additional bit(s). L is greater than or equal to one. In the example, the L additional bits are the least significant bit(s) of UBC 760 and can be thought of as "redundant" bits that are used to provide error correction in accordance with the teachings. In the example illustrated in FIG. 7, L=1 and the redundant bit is labeled Dr<3>.

As shown in the example, LBC 710 includes fast Gray code Generator 712 that is coupled to and is shared by the latch circuitry of multiple columns of an imaging system. In one example, the LBC 710 is a 4 bit Gray code counter operating at a first counting frequency under a first clock 702. In one example, first clock 702 has a counting frequency $f_{C1}$ equal to for example 1 GHz. UBC 760 has as many bits as needed (e.g., N-M bits), and also includes the additional L redundant bit(s) (e.g., Dr<3>), which are included as the least significant bit(s) of UBC 760. In the example, UBC 760 includes a slow Gray code Generator 762 that operates at a second counting frequency under a second clock 752, which in the example has a much lower counting frequency $f_{C2}$. As shown in the example, slow Gray code Generator 762 is also coupled to and shared by the latch circuitry of multiple columns of the imaging system. In one example, the slow counting frequency $f_{C2}$ of second clock 752 is equal to the counting frequency $f_{C1}$ of first clock 702 divided by $2^{(M-L)}$. Therefore, if we assume that $f_{C1}$=1 GHz, M=4, and L=1, then $f_{C2}$=1 GHz/$2^{(4-1)}$, which equals 1 GHz divided by 8, which is equal to 125 MHz in the depicted example. Thus, it is appreciated that examples in accordance with the teachings of the present invention allow the application of different clocks to the LBC and UBC because of the redundancy. With the slow counting frequency $f_{C2}$ of second clock 752, it is appreciated that power consumption of N bit multi stage counter 700 is reduced in accordance with the teachings of the present invention.

In operation, after a counting operation of LBC 710 and UBC 760 is complete, error correction operations are performed as needed on the output values in accordance with the teachings of the present invention. In the example, before error correction operations are performed, the Gray code is converted to binary code to detect the phase difference between the lower code and the upper code. As will be discussed, in one example error correction operations that are performed include comparing the L least significant bits (LSBs) of the UBC 760 and at least one most significant bit (MSB) of the LBC 710, and then correcting the N-M MSBs of the UBC 760 in response to the comparison of the L LSBs of the UBC 760 and the at least one MSB of the LBC 710. The lower bits of the N bit counter are the M bits of the LBC 710 and the upper bits of the N bit counter will be the corrected N-M MSBs of the UBC 760 in accordance with the teachings of the present invention.

Figure 8:
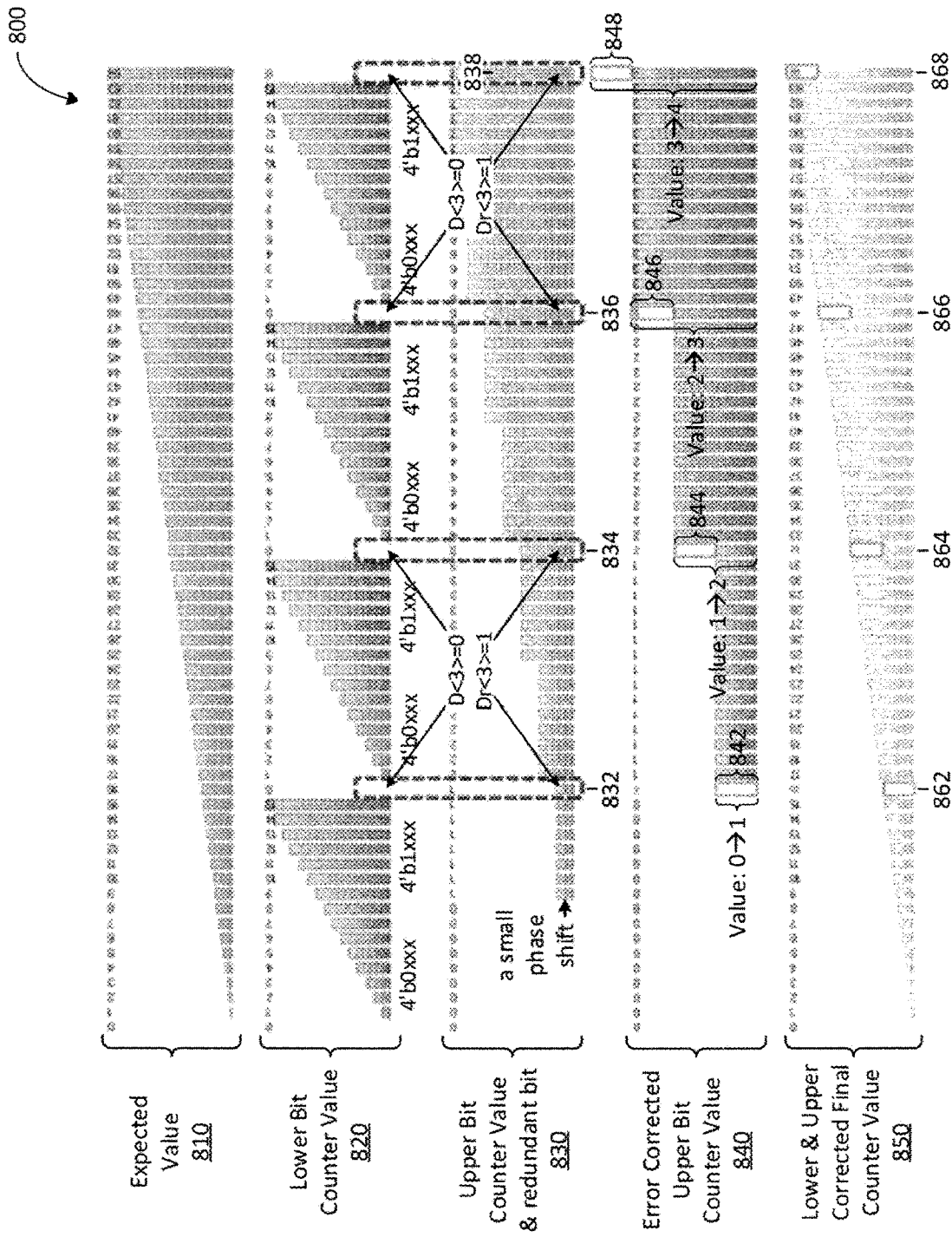
FIG. 8 is a diagram illustrating error correction with output values of a Lower Bit Counter Gray code generator, an Upper Bit Counter Gray code generator with a redundant bit, expected values, and corrected values to correct problems resulting from unwanted phase shift in accordance with the teachings of the present invention.

To illustrate, FIG. 8 is a diagram 800 illustrating output values of a Lower Bit Counter Gray code generator, an Upper Bit Counter Gray code generator with a redundant bit, expected values, and corrected values to correct errors resulting from unwanted phase shift in accordance with the teachings of the present invention. As stated above, after converting the Gray code to binary code, the L redundant bit(s) (e.g., Dr<3>) is/are introduced to UBC 760 as the LSB(s) of UBC 760 to correct errors caused by phase differences between LBC 710 and UBC 760. Continuing with the problems discussed above with respect to FIG. 6, it is demonstrated in the example illustrated in FIG. 8 that when the MSB D<3> of the LBC 710 and the LSB Dr<3> of the UBC 760 are compared, correct counter values can be deducted in accordance with the teachings of the present invention. For example, if the MSB D<3> of the LBC 710 is 0, and the LSB of the UBC 760 (e.g., redundant bit Dr<3> of FIG. 7) is 1 due to the phase shift illustrated in FIG. 6, the counter value represented by the N-M MSBs (e.g., D<4> through D<n>) of the UBC 760 (excluding the redundant bit Dr<3>) is incremented by 1 according to the error correction operations in accordance with the teachings of the present invention.

As mentioned above, when the phases of the two Gray code signals in LBC 710 and UBC 760 are perfectly in phase and aligned, a combined 4-bit LBC 710 and multi-bit UBC 760 deliver correct combined code 540 to match the expected code 510 as illustrated in FIG. 5, where both LBC 710 count code 520 and UBC 760 count code 530 operate perfectly without any misalignment. However, when there is a phase mismatch between the two Gray code signals in LBC 710 and UBC 760, such as for example when UBC 760 has unwanted delay causing UBC 760 to miss an initial incremental count as shown in UBC code 630, the combined LBC count code 620 and UBC count code 630, as shown in combined code 640 not counting in time to match the expected code 610. Consequently, the combined 2-stage counter does not deliver correct results any more at this point if the redundant bit Dr<3> of FIG. 7 is not utilized.

With the redundant bit Dr<3> introduced as shown in FIG. 7, the N bit counter in accordance with the teachings of the present invention becomes highly immune to the phase mismatch. Regardless of the phase difference, the final combined counter value can be corrected by using D<3> and the redundant bit Dr<3>. When D<3>=0 and Dr<3>=1, the value represented by the N-M MSBs (e.g., D<4> through D<n>) of UBC 760 is incremented by 1. In this example, for other values of D<3> and Dr<3>, the N-M MSBs of UBC 760 are not incremented.

For instance, FIG. 8 shows at time points 832, 834, 836, and 838 missed values shown to the UBC value 830 have been added back by 842, 844, 846, and 848 to the error corrected UBC values 840, and by 862, 864, 866, and 868 to the final combined counter value 850 when conditions D<3>=0 and Dr<3>=1 are met within 832, 834, 836, and 868. As shown, the final combined counter value 850 equals the expected value 810. Therefore, counting errors in UBC 760 that are caused by phase shifts are corrected using the error correction operations in accordance the teachings of the present invention.

Figure 9:
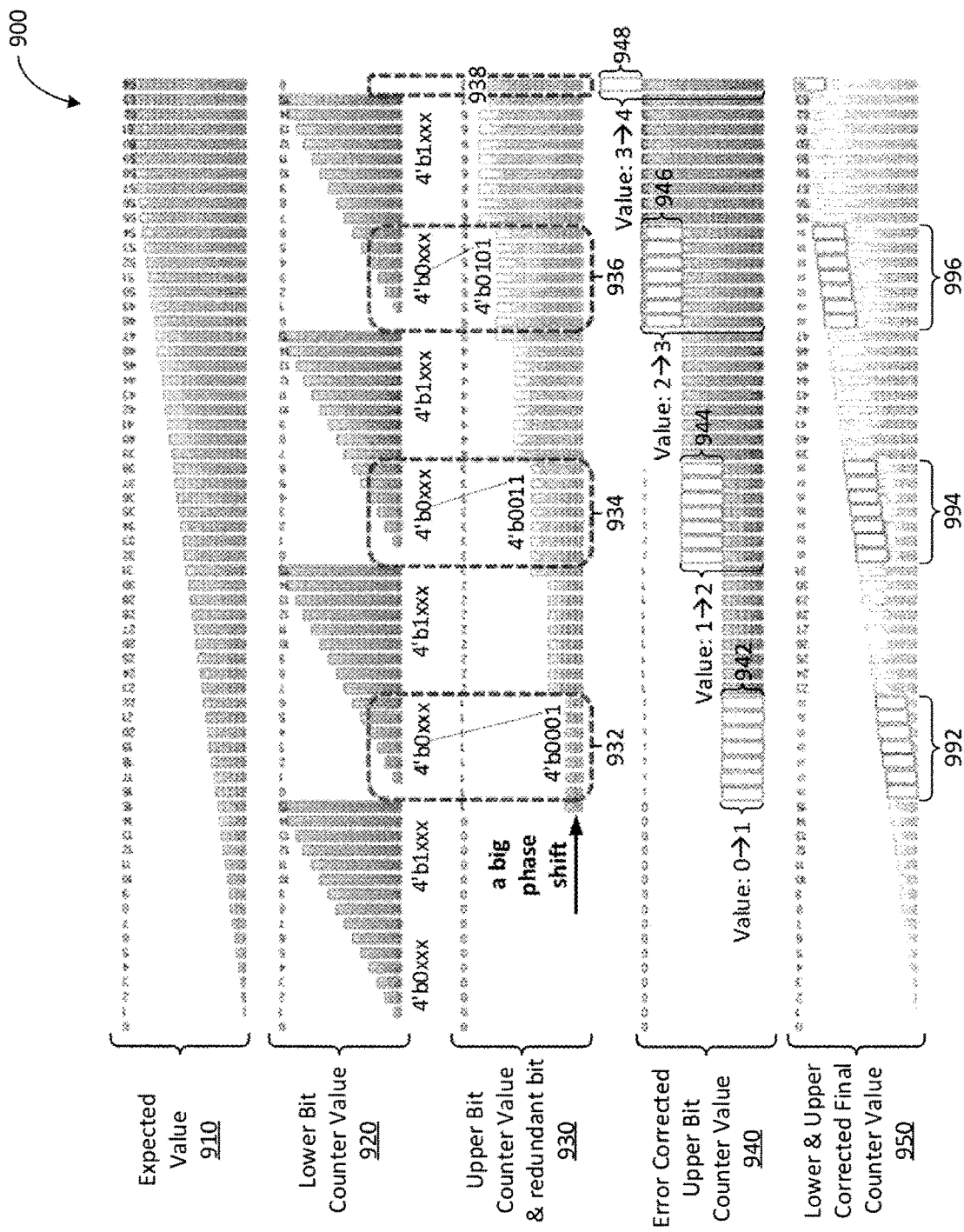
FIG. 9 is another diagram illustrating error correction with output values of a Lower Bit Counter Gray code generator, an Upper Bit Counter Gray code generator with a redundant bit, expected values, and corrected values to correct problems resulting from a larger unwanted phase shift in accordance with the teachings of the present invention.

FIG. 9 is another diagram 900 illustrating error correction operations with output values of a Lower Bit Counter Gray code generator, an Upper Bit Counter Gray code generator with a redundant bit, expected values, and corrected values to correct problems resulting from a larger unwanted phase shift in accordance with the teachings of the present invention. For the larger phase shift illustrated FIG. 9, in time regions 992, 994, and 996, additional 1's have been added back by 942, 944, and 946 to the error corrected UBC values 940 in these regions where the conditions D<3>=0 and Dr<3>=1 are met within regions 932, 934, and 936 as shown. The final combined counter value 950 equals the expected value 910. Value miscounts to the UBC 760 caused by a large phase shift are also completely corrected. Using the error correction operations in accordance with the teachings of the present invention, whenever unwanted phase shifts happen, large or small, as illustrated in FIG. 8 or 9, errors in UBC 760 can be corrected in accordance with the teachings of the present invention.

Figure 10:
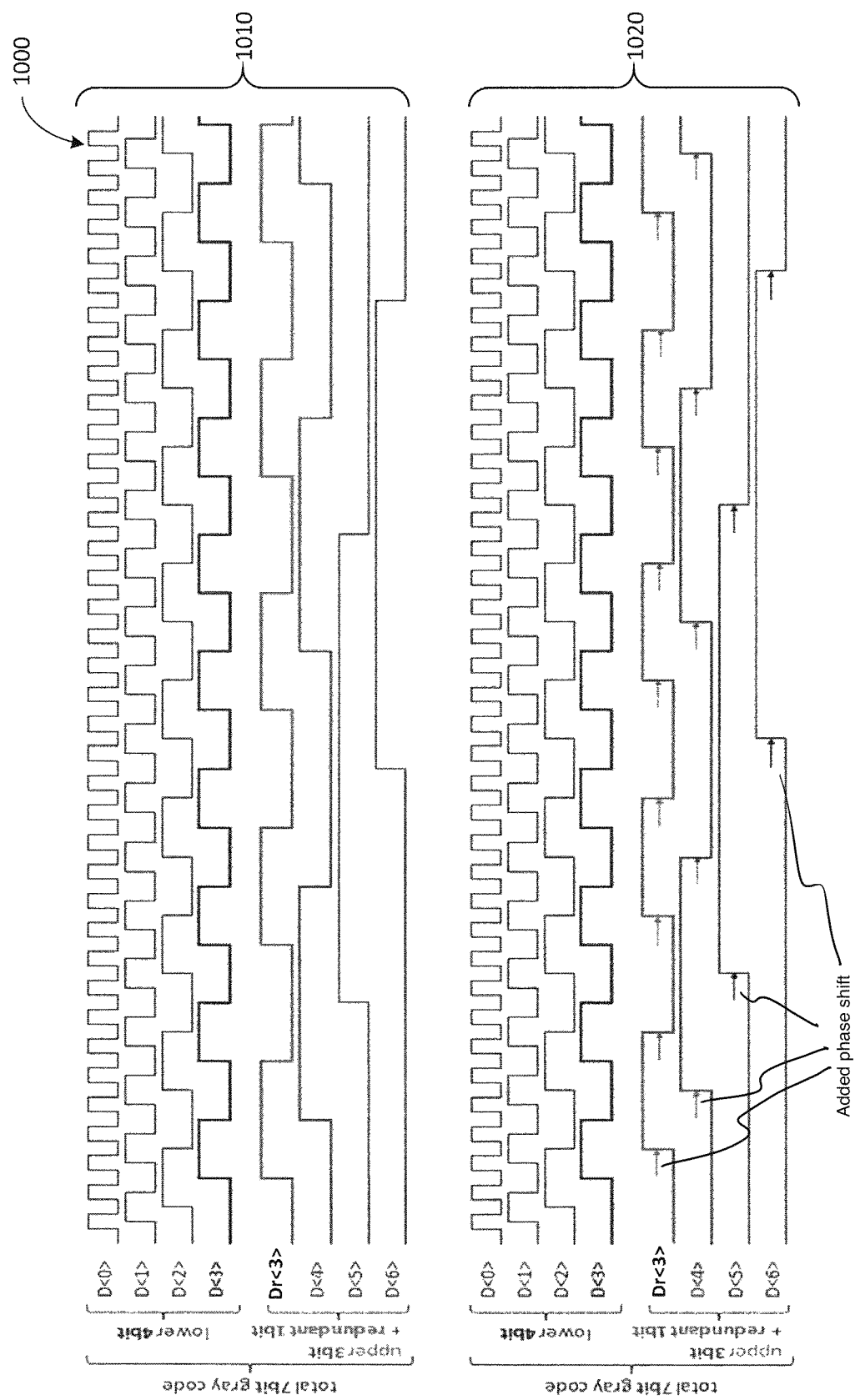
FIG. 10 is timing diagram illustrating waveforms of an example of error correction operations with a phase shift added to the upper counter in accordance with the teachings of the present invention.

FIG. 10 is timing diagram 1000 illustrating waveforms of an example of error correction operations in which a known phase shift is added to the upper counter in accordance with the teachings of the present invention. In one example, the known phase shift that is added to the upper counter may be provided for example with the clock divider with phase shift 468 as shown in FIG. 4C. FIG. 10 illustrates a 4 bit LBC 710 and 3-bit UBC 760 with a redundant bit Dr<3> (e.g., N=7, M=4, and L=1). Ideal Gray code waveforms are shown in waveforms 1010 without any phase shift. However, as shown in the example waveforms 1020, error correction operations include intentionally phase shifting the counting start time of the counting operation of the upper counter (e.g., UBC 760) relative to the counting start time of the counting operation of the lower counter (e.g., LBC 710) in accordance with the teachings of the present invention.

Figure 11:
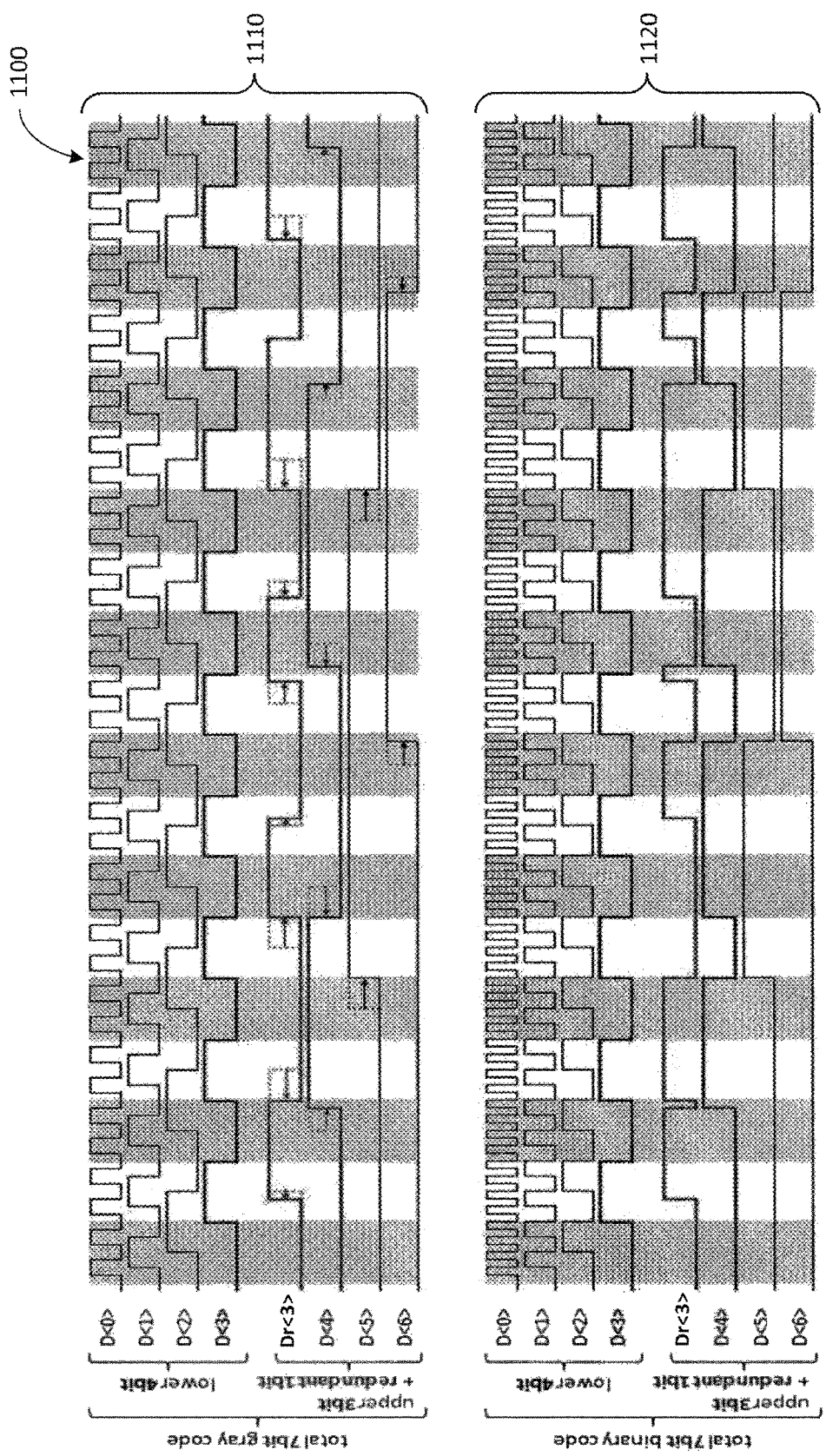
FIG. 11 is timing diagram showing Gray code waveforms and corresponding binary code waveforms with errors to be corrected using example error correction operations in accordance with the teachings of the present invention.

Continuing with the example shown in FIG. 10, FIG. 11 is timing diagram 1100 showing Gray code waveforms and corresponding binary code waveforms with additional unwanted phase shift errors to be corrected using example error correction operations in accordance with the teachings of the present invention. Starting with the intentionally phase shifted waveforms shown in 1020 of FIG. 10, timing diagram 1100 of FIG. 11 further illustrate an example in which each edge of the UBC bits is further shifted again in random directions by a random amount, but still within correctable ranges, which in the illustrated example is within the width of the shaded regions as shown by the Gray code in diagram 1110. When the Gray code represented in diagram 1110 is converted to binary code as shown in diagram 1120, the errors in the UBC binary data bits D<4> through D<6> are readily apparent.

Figure 12:
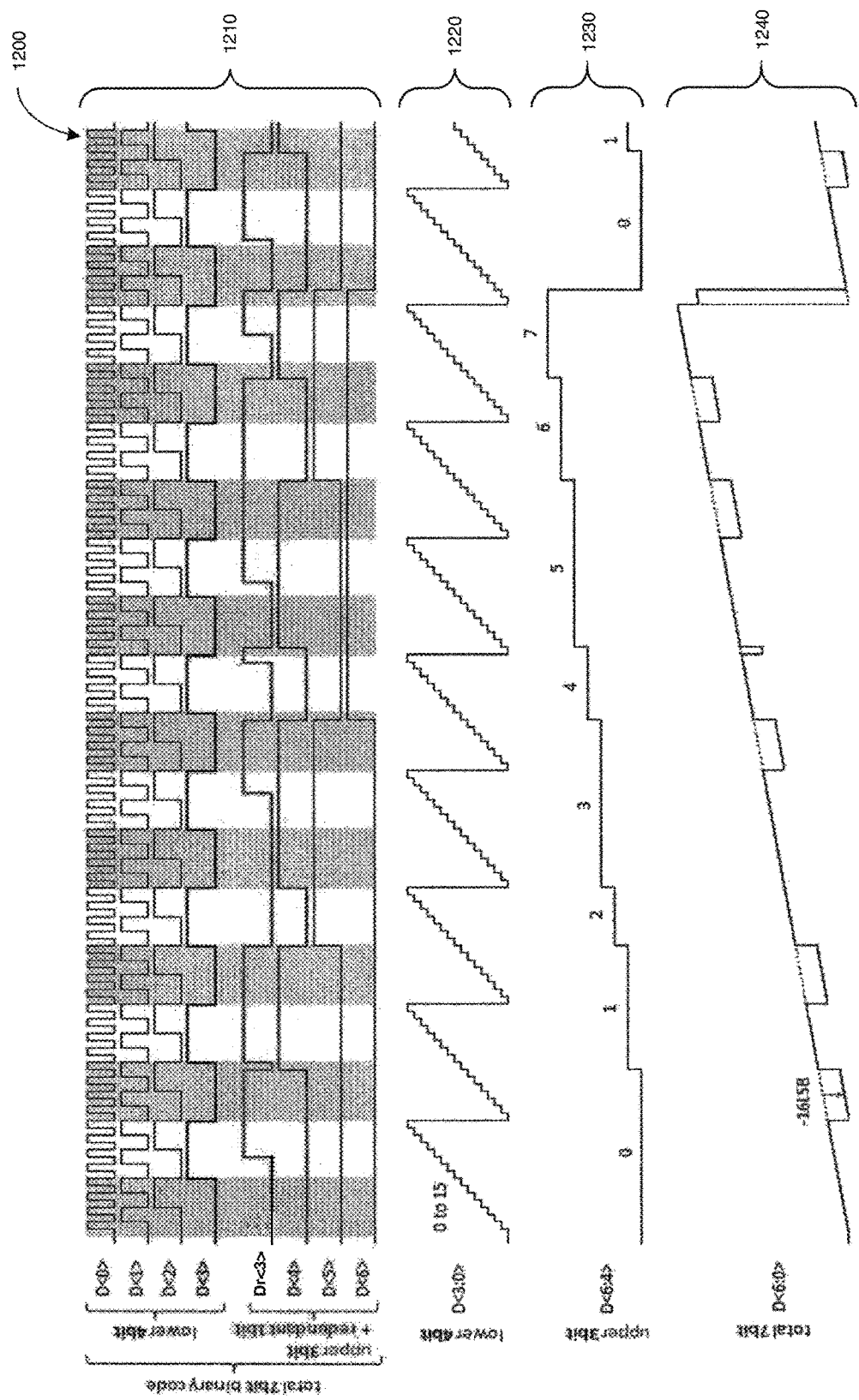
FIG. 12 is timing diagram showing binary code waveforms and corresponding lower bit counts, upper bit counts, and total counts with errors to be corrected using example error correction operations in accordance with the teachings of the present invention.

FIG. 12 is timing diagram showing binary code waveforms corresponding to the waveforms of FIG. 11, and the corresponding lower bit counts, upper bit counts, and total counts with errors to be corrected using example error correction operations in accordance with the teachings of the present invention. As shown in FIG. 12, the binary code 1120 of N bit counter 700 reappears in waveforms 1210. The 4 lower binary bits D<0> through D<3> count perfectly as shown in waveforms 1220. However, the 3 upper binary bits D<4> through D<6> are distorted as shown in waveforms 1230. Due to the binary weight of D<4> (i.e., $2^4$=16), each of errors in D<4> causes a $2^4$ or 16× error relative to the D<0> (the LSB) values. Indeed, the overall binary code shown with bits D<0> through D<6> are full of the errors as illustrated by the many notches (with depth of −16 LSB) where the correct result should be as smooth as indicated by the dashed lines in 1240.

Figure 13:
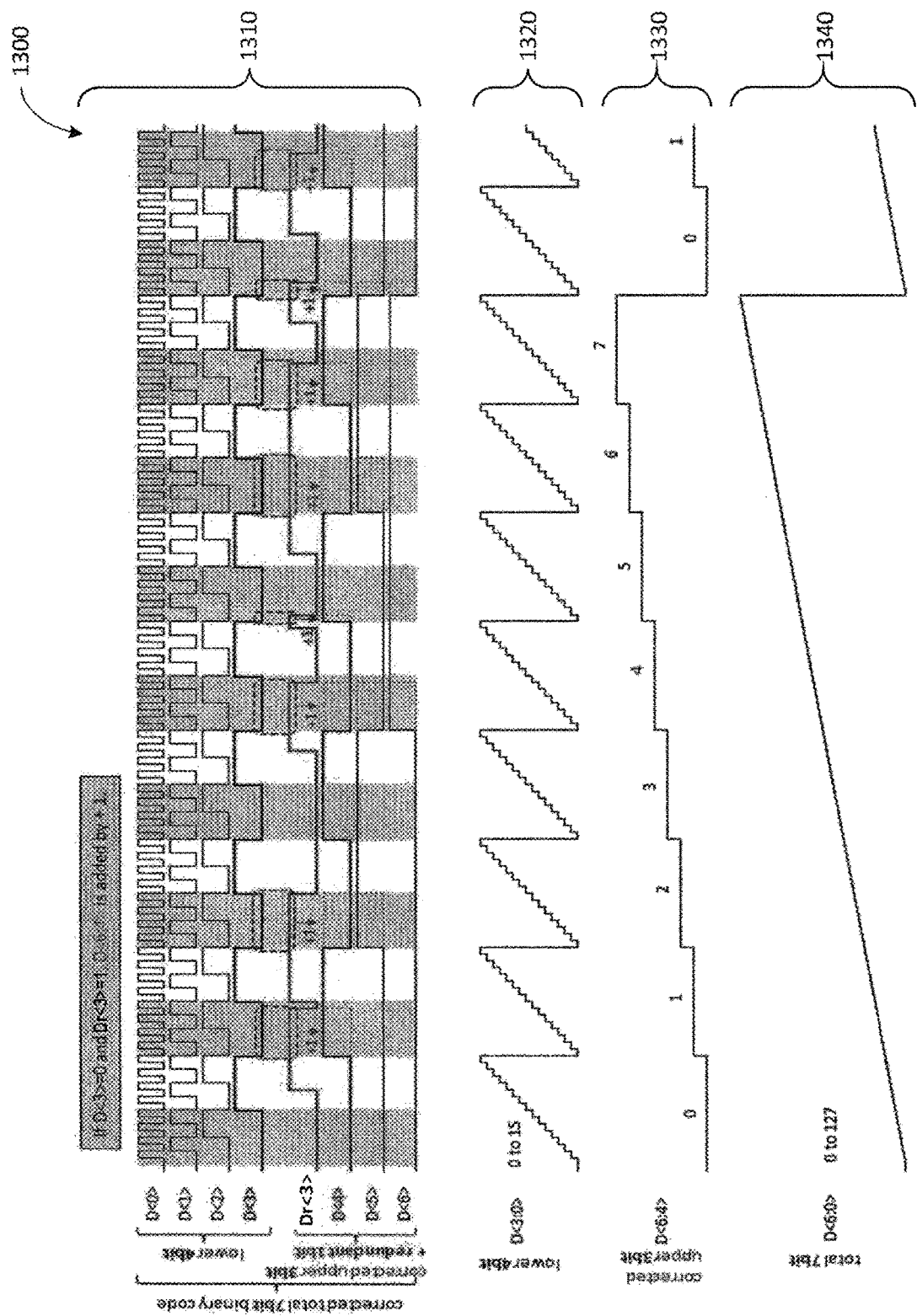
FIG. 13 is timing diagram showing binary code waveforms with errors and corresponding lower bit counts, upper bit counts, and total counts without errors in accordance with the teachings of the present invention.

FIG. 13 is timing diagram showing binary code waveforms with errors and corresponding lower bit counts, upper bit counts, and total counts without errors in accordance with the teachings of the present invention. In particular, FIG. 13 shows the corrected results after the errors shown in FIG. 12 have been corrected using the error correction operations of incrementing the value of D<6:4> by 1 when D<3>=0 and Dr<3>=1, as shown in waveforms 1310. The corrected D<6:4> values are shown in waveform 1330. The corrected final 7-bit D<6:0> is shown in waveform 1340.

Figure 14:
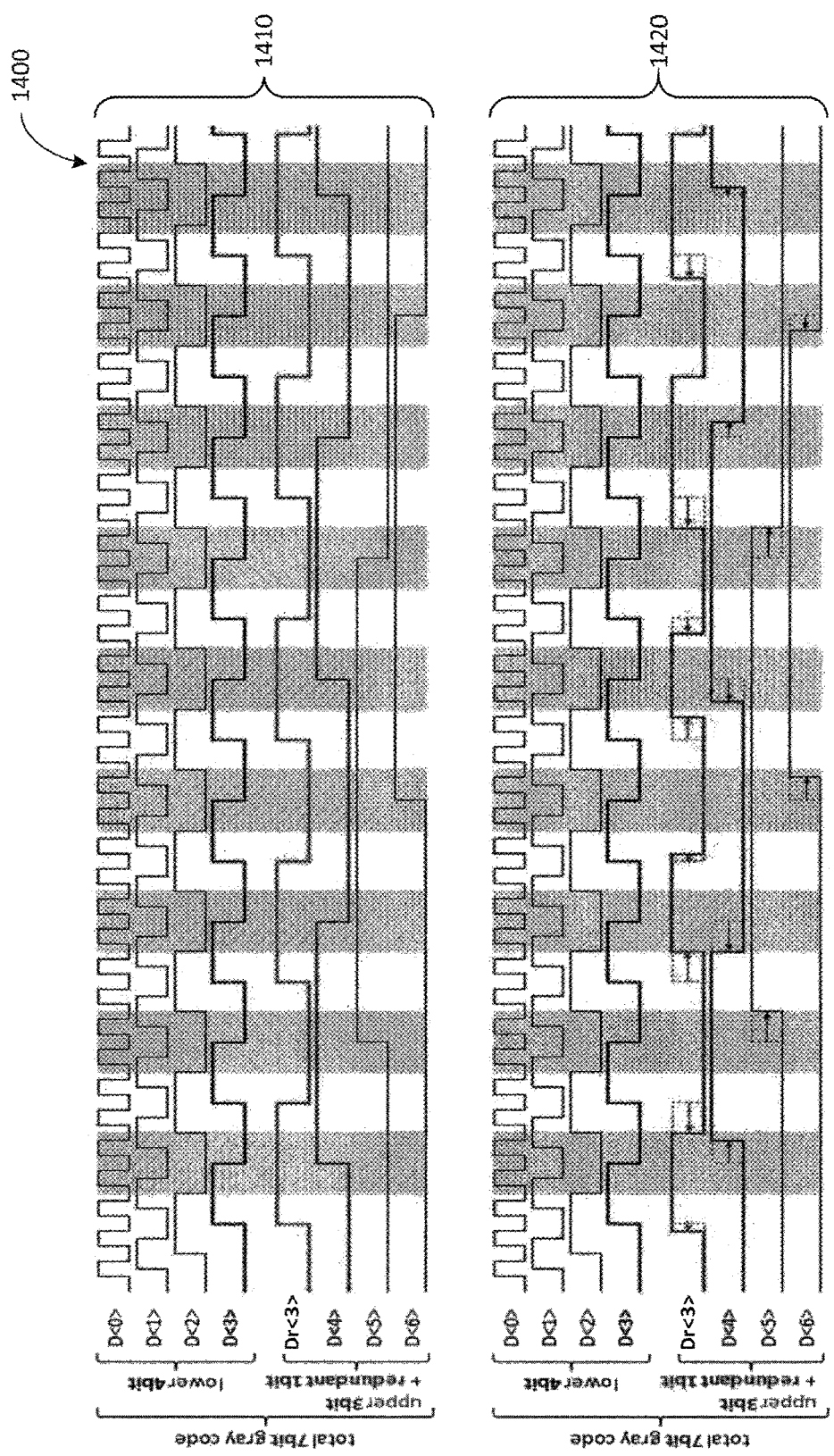
FIG. 14 is timing diagram illustrating waveforms of another example of error correction operations without phase shift added intentionally to the upper counter in accordance with the teachings of the present invention.

In the example error correction operations described above in FIGS. 10-13, the counting start time of the counting operation of the UBC bits D<6:4> and Dr<3> was intentionally delayed or phase shifted relative to the counting start time of the counting operation of the lower counter LBC bits D<3:0> as indicated in waveforms 1020 of FIG. 10. FIG. 14 is timing diagram 1400 illustrating waveforms of yet another example of error correction operations without intentional delay or phase shift added in accordance with the teachings of the present invention. Without any intentional phase shift, ideal Gray code waveforms are shown in waveforms 1410 in FIG. 14. However, in waveforms 1420, UBC 760 suffers from unwanted phase shift as illustrated by each edge of the UBC 760 bits D<6:4> and Dr<3> being shifted in a random direction by a random amount, but still within correctable ranges as illustrated by being within the width of the shaded regions in waveforms 1420.

Figure 15:
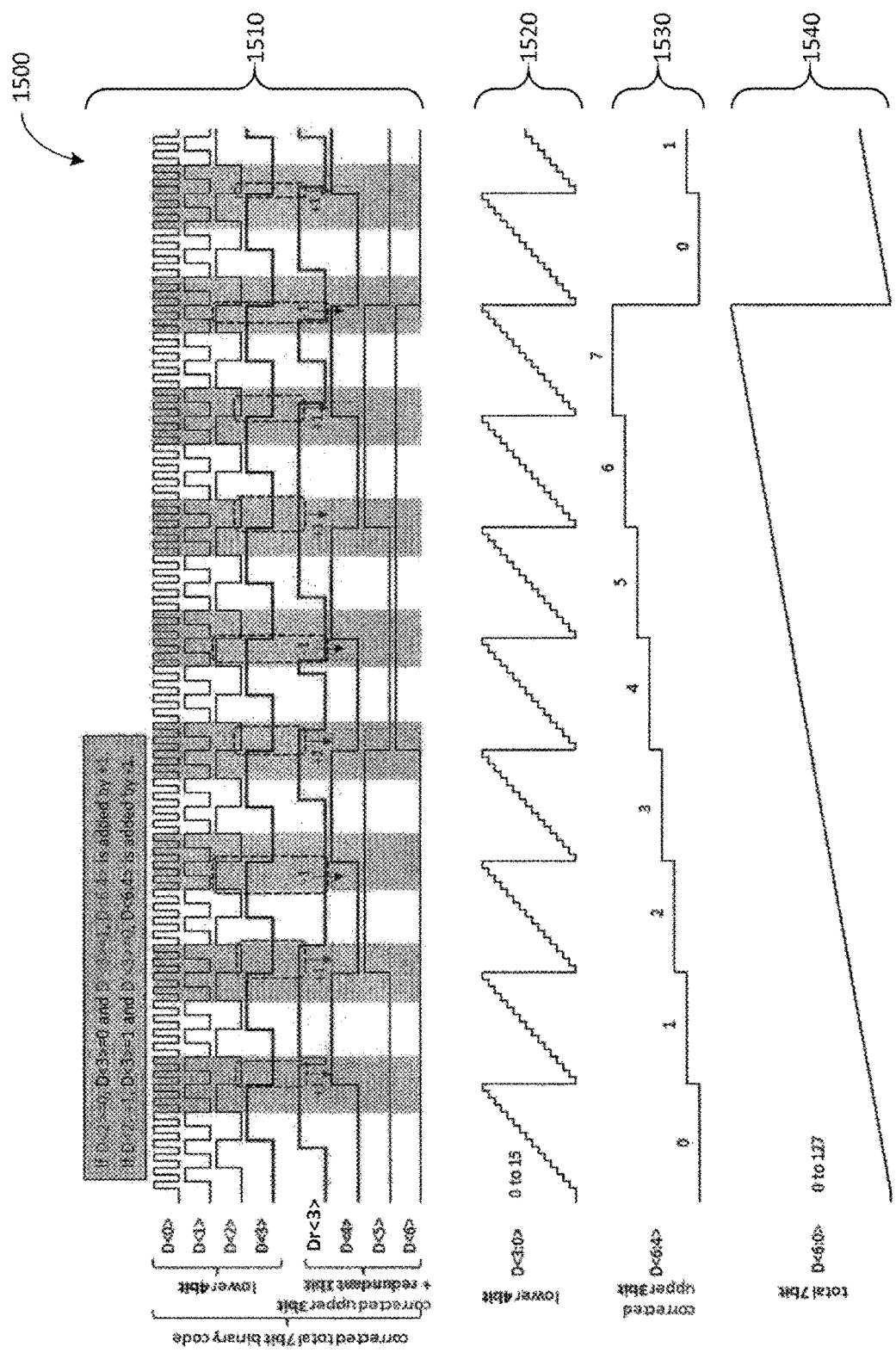
FIG. 15 is timing diagram showing binary code waveforms with errors and corresponding lower bit counts, upper bit counts, and total counts without errors in accordance with the teachings of the present invention.

FIG. 15 is timing diagram 1500 showing binary code waveforms with errors and corresponding lower bit counts, upper bit counts, and total counts without errors in accordance with the teachings of the present invention. In particular, FIG. 15 shows the correct result after errors in FIG. 14 have been corrected using another example of error correction operations in accordance with the teachings of the present invention. When the Gray code of waveforms 1420 is converted to the binary code as shown in waveforms 1510 of FIG. 15, the UBC 760 data bits D<6:4> are seen with many errors as indicated by the dashed lines in the shaded regions of waveforms 1510. The erroneous D<6:4> values are corrected using another example of error correction operations in accordance with the teachings of the present invention. In particular: (1) the value of D<6:4> is incremented by 1 when D<2>=0, D<3>=0, and Dr<3>=1; or (2) the value of D<6:4> is decremented by 1 when D<2>=1, D<3>=1, and Dr<3>=0. The final D<6:4> value after the error correction operations are performed is indicated by the solid lines in the shaded regions of waveforms 1510. The corrected D<6:4> values are shown in waveform 1530, and the corrected final 7-bit D<6:0> values are shown in waveform 1540.

It should be appreciated that the two error correction operations disclosed above are just two examples of error correction operations in accordance with the teachings of the present invention. As such, the error correction operations described above are provided for explanation purposes only and should not be viewed as being limited only to the specific two error correction operations described above. In addition, it is appreciated that the effectiveness of the error correction operations is not limited only to the specific N bit counter 700 described in FIG. 7.

Figure 16A:
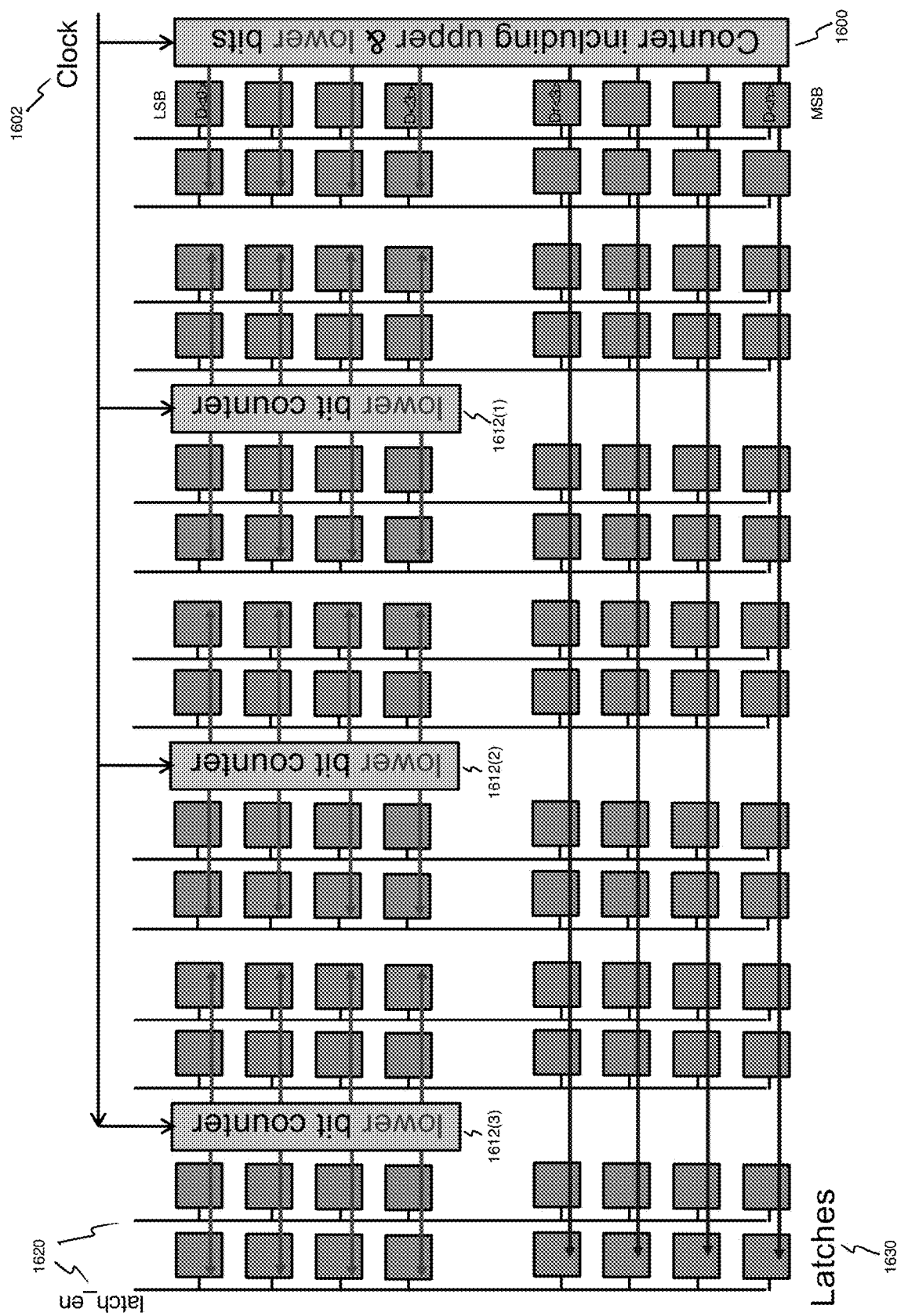
FIG. 16A is a block diagram illustrating an example counter signal distribution system structure including a Gray code counter that generates signals from the LSB to the MSB and a plurality of lower bit Gray code counters that are shared by a plurality of latches in accordance with the teachings of the present invention.

FIG. 16A is a block diagram illustrating an example counter signal distribution system structure including a Gray code counter 1600 that generates signals from the LSB to the MSB and a plurality of lower bit Gray code counters 1612(1), 1612(2), 1612(3) that are shared by a plurality of latches 1630 in accordance with the teachings of the present invention. It is appreciated that the Gray code counting structure of FIG. 16A generates L redundant bit(s) (e.g., Dr<3>) for error correction, where L is greater than or equal to one. In the example depicted in FIG. 16A, L=1. Thus, it is appreciated that that the Gray code counting structure of FIG. 16A may be another example of the Gray code counters described above that generate redundant bit(s), and that similarly named and numbered elements described above are coupled and function similarly below. For instance, the example depicted in FIG. 16A illustrates a single Gray code counter 1600 that generates in response to the counting clock 1602 a plurality of data bits from the LSB to the MSB, which includes a redundant bit Dr<3>, that are shared and stored among a plurality of latches 1630 in response to a respective latch enable signal latch_en 1620.

In addition, the Gray code counter structure illustrated in FIG. 16A also includes a plurality of lower bit Gray code counters 1612(1), 1612(2), 1612(3), each of which is coupled to generate in response to the counting clock 1602 the same lower data bits, or the LSBs, of the Gray code count as is generated by Gray code counter 1600. Further, the plurality of latches 1630 that are coupled to the lower data bit lines of the Gray code counter structure of FIG. 16A are arranged or organized into a plurality of lower blocks of latches 1630. In one example, each lower block of latches 1630 is a subset of all of the latches 1630, and each lower block of latches 1630 is spread over a plurality of columns of latches 1630 or a plurality of groupings of latches 1630. For instance, as shown in the example depicted in FIG. 16A, each lower block of latches 1630 includes four columns or groupings of latches that are coupled to the lower data bit lines in accordance with the teachings of the present invention. As such, each of the lower data bits that is generated by each of the lower bit Gray code counters 1612(1), 1612(2), 1612(3) is shared among a respective lower block of latches 1630. Stated in another way, the example shown in FIG. 16A illustrates that each of the lower data bits that is generated by each data bit output by each lower bit Gray code counters 1612(1), 1612(2), 1612(3) is shared among four latches 1630. In other examples, it is appreciated that each block of latches may include a different number of columns or grouping that each data bit generated by the lower bit Gray code counters 1612(1), 1612(2), 1612(3) may be shared among a greater number than four latches 1630 or a fewer number than four latches 330 in accordance with the teachings of the present invention.

In comparison, each of the upper bits that is generated by the single Gray code counter 1600 is shared among an upper block of latches 1630, where the upper block of latches includes is an equal to or greater number of columns or groupings of latches 1630 than the lower block of latches 1630. For instance, in the depicted example, the upper block of latches 1630 that are coupled to the upper data bit lines of the Gray code counter 1600 includes all of the columns or groupings of latches 1630 shown in FIG. 16A in accordance with the teachings of the present invention. Thus, in the example shown in FIG. 16A, each of the upper data bits that is generated by Gray code counter 1600 is shared among all of the columns of the upper block of latches 1630, while each of the lower data bits that is generated by each data bit output by the lower bit Gray code counters 1612 is shared among four columns of latches 1630. In addition, in the depicted example, the lower data bits that are generated by the Gray code counter 1600 is also shared among four columns of latches 1630 of a lower block of latches. In other examples, it is appreciated that each data bit generated by the lower bit Gray code counters 1612(1), 1612(2), 1612(3) and the lower data bits of the Gray code counter 1600 may be shared among a greater number than four latches 1630 or a fewer number than four latches 1630 in accordance with the teachings of the present invention.

Therefore, each of the lower data bits generated by each of the lower bit Gray code counters 1612(1), 1612(2), 1612(3) and Gray code counter 1600 is coupled to be shared by a lower block of latches 1630 (e.g., four latches in FIG. 16A), while each of the upper data bits (and redundant bit(s)) generated by the Gray code counter 1600 is coupled to be shared by an upper block of latches 1600 (e.g., all of the latches for that data bit in FIG. 16A), where the upper block of latches 1600 includes more columns or groupings of latches 1630 than the lower blocks of latches 1630.

Figure 16B:
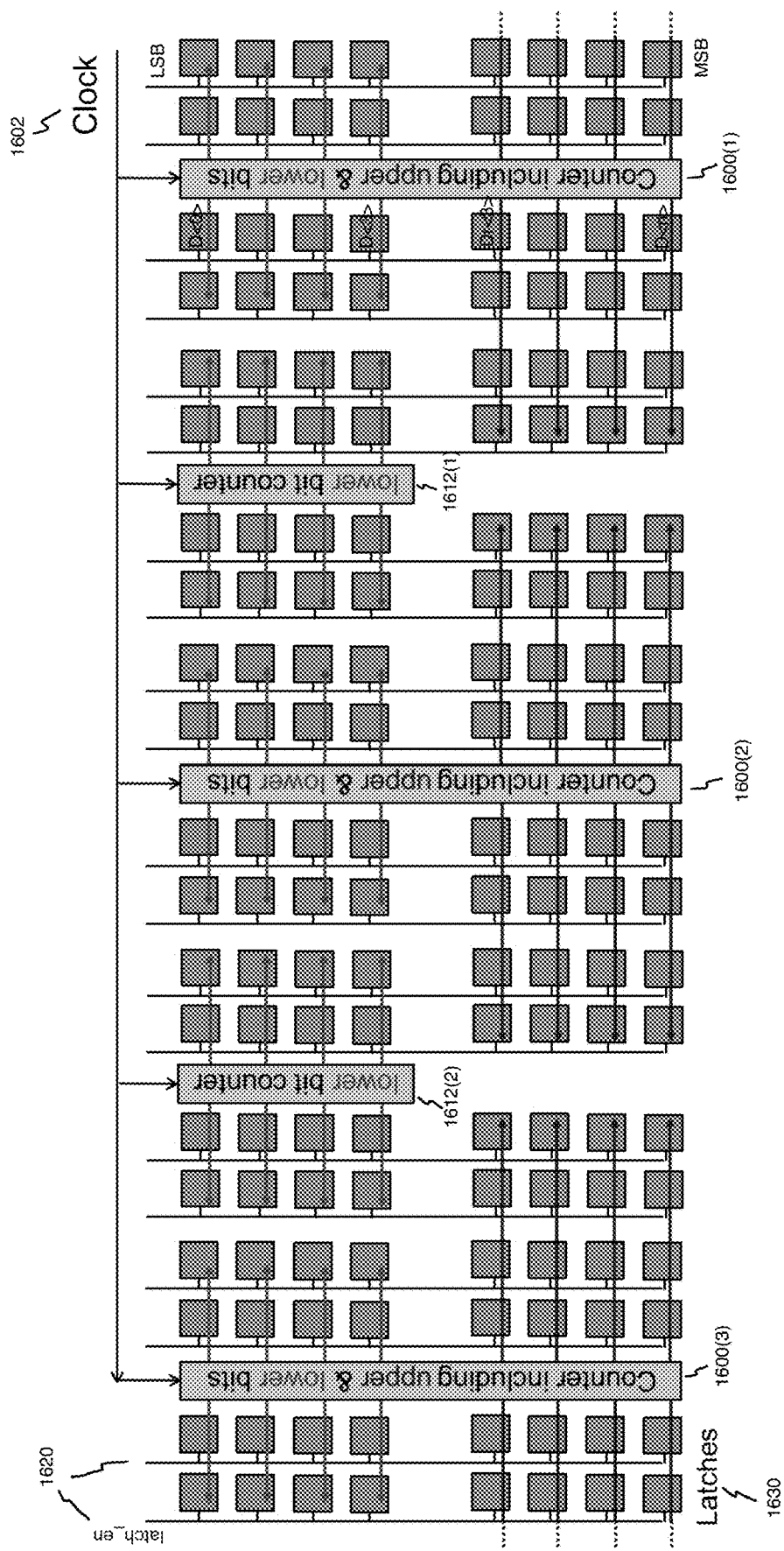
FIG. 16B is a block diagram illustrating an example counter signal distribution system structure including a plurality of Gray code counters that generate signals from the LSB to the MSB and a plurality of lower bit Gray code counters that are shared by a plurality of latches in accordance with the teachings of the present invention.

FIG. 16B is a block diagram illustrating an example counter signal distribution system structure including a plurality of Gray code counters that generate signals from the LSB to the MSB and a plurality of lower bit Gray code counters that are shared by a plurality of latches in accordance with the teachings of the present invention. It is appreciated that the Gray code counting structure of FIG. 16B may be another example of the Gray code counters described above that generate redundant bit(s), and that similarly named and numbered elements described above are coupled and function similarly below. It is also noted that the counter structure illustrated in FIG. 16B shares many similarities with the counter structure illustrated in FIG. 16A. In particular, the example depicted in FIG. 16B also illustrates that the Gray code counter structure includes a plurality of lower bit Gray code counters 1612(1), 1612(2), each of which is coupled to generate in response to the counting clock 1602 the lower data bits, or the LSBs, of a Gray code count. In one example, each of the lower data bits that is generated by each of the lower bit Gray code counters 1612(1), 1612(2) is shared and stored among lower blocks of latches 1630, such as for example but not limited to four latches 1630, in response to a latch enable signal latch_en 1620.

However, one difference between the examples illustrated in FIG. 16B and FIG. 16A is that the example depicted in FIG. 16B illustrates a plurality of Gray code counters 1600(1), 1600(2), 1600(3), each of which generates in response to the same counting clock 1602 a plurality of data bits from the LSB to the MSB (including redundant bit(s)) that are shared and stored among a lower and upper blocks of latches 1630 in response to a respective latch enable signal latch_en 1620. In particular, the example depicted in FIG. 16B illustrates that each of the Gray code counters 1600(1), 1600(2), 1600(3) that generates lower data bits (e.g., LSBs), redundant bit(s), and upper data bits (e.g., MSBs). In the example, each of the lower data bits output by the Gray code counters 1600 is coupled to be shared and stored among lower blocks of latches 1630, each of which includes for example but not limited to four columns or groupings of latches 1630. In the example, each of the upper data bits output by the Gray code counters 1600 is coupled to be shared and stored among upper blocks latches 1630, each of which includes for example but not limited to eight columns or groupings of latches 1630. In the example, the number of columns or groupings of latches included in the lower blocks (e.g., four) is less than the number of columns or groupings of latches included in the upper blocks (e.g., eight). In other examples, it is appreciated that the lower and upper blocks may include different numbers of columns or groupings of latches other than four or eight, so long as the number of groupings in the lower blocks is less than or equal to the number of columns or groupings in the upper blocks.

Figure 16C:
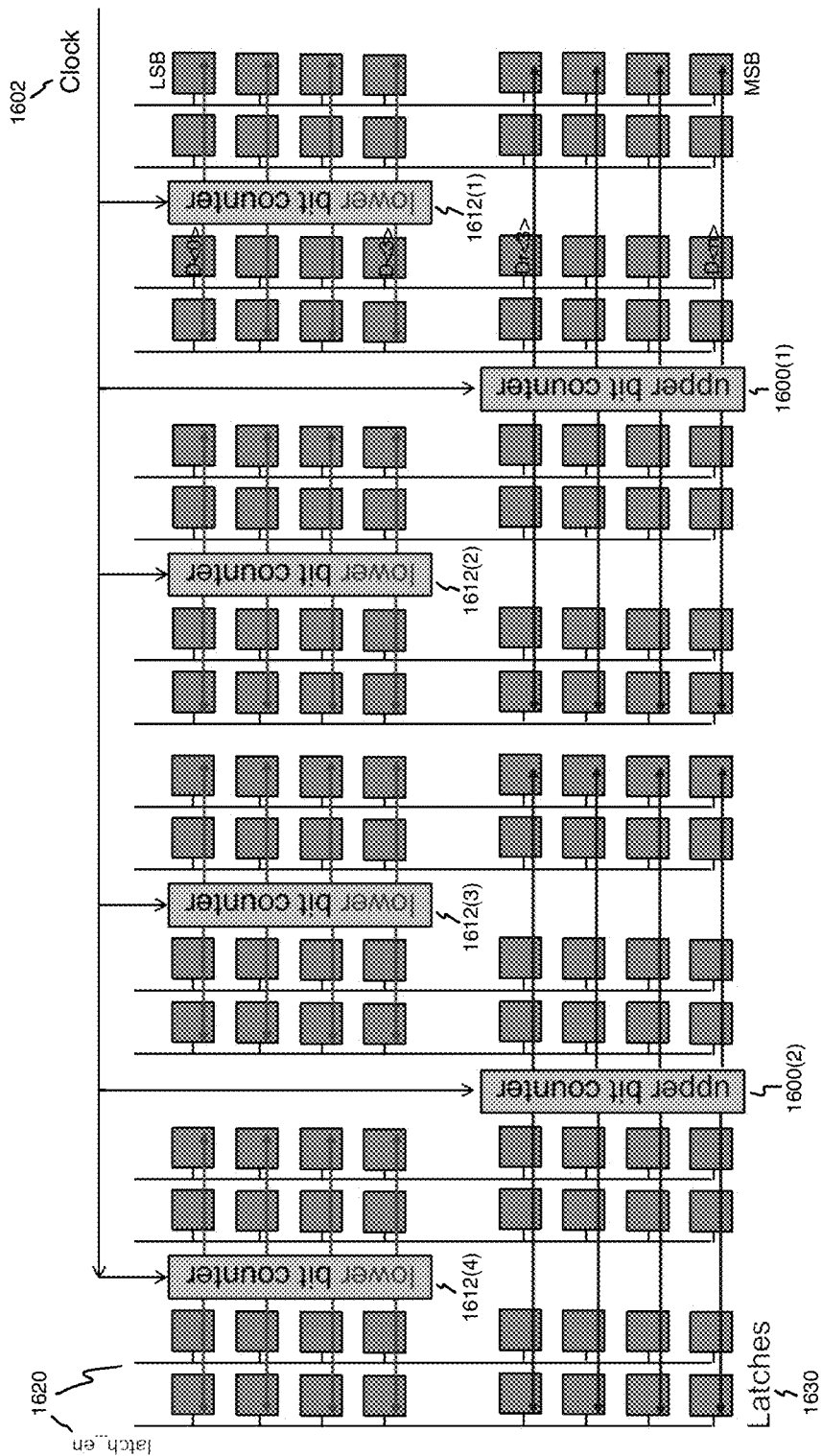
FIG. 16C is a block diagram illustrating an example counter signal distribution system structure including a plurality of lower bit Gray code counters and a plurality of upper bit Gray code counters that are shared by a plurality of latches in accordance with the teachings of the present invention.

FIG. 16C is a block diagram illustrating an example counter structure including a plurality of lower bit Gray code counters and a plurality of upper bit Gray code counters that are shared by a plurality of latches in accordance with the teachings of the present invention. It is appreciated that the Gray code counting structure of FIG. 16B may be another example of the Gray code counters described above that generate redundant bit(s), and that similarly named and numbered elements described above are coupled and function similarly below. It is also noted that the counter structure illustrated in FIG. 16C shares many similarities with the counter structure illustrated in FIG. 16B. In particular, the example depicted in FIG. 16C also illustrates that the Gray code counter structure includes a plurality of lower bit Gray code counters 1612(1), 1612(2), 1612(3), 1612(4), each of which is coupled to generate in response to the counting clock 1602 the lower data bits, or the LSBs, of a Gray code count. In one example, each of the lower data bits that is generated by each of the lower bit Gray code counters 1612(1), 1612(2), 1612(3), 1612(4) is shared and stored among a lower blocks of latches 1630, each of which includes for example but not limited to four columns or groupings of latches 1630, in response to a latch enable signal latch_en 1620.

However, one difference between the examples illustrated in FIG. 16C and FIG. 16B is that the example depicted in FIG. 16C illustrates a plurality of upper bit Gray code counters 1600(1), 1600(2), each of which generates in response to the same counting clock 1602 redundant bit(s) and the plurality of upper data bits or MSBs that are shared and stored among upper blocks of latches 1630 in response to a respective latch enable signal latch_en 1620. Stated in another way, only redundant bit(s) and the upper data bits or MSBs generated by the plurality of upper bit Gray code counters 1600(1), 1600(2) of FIG. 16C are distributed and shared among the upper blocks of latches 1630, whereas in the example depicted in FIG. 16B, the lower data bits, as well as the redundant bit(s) and upper data bits that are generated by the Gray code counters 1600(1), 1600(2), 1600(3) are distributed and shared.

In particular, in the example depicted in FIG. 16C, each of the redundant bit(s) and upper data bits output by the upper bit Gray code counters 1600(1), 1600(2) is coupled to be shared and stored among upper blocks of latches 1630, each of which includes for example but not limited to eight latches 1630. In the example, the number of columns or groupings of latches included in the lower blocks (e.g., four) is equal to or less than the number of columns or groupings of latches included in the upper blocks (e.g., eight). In other examples, it is appreciated that the lower and upper blocks may include different numbers of columns or groupings of latches other than four or eight, so long as the number of groupings in the upper blocks is greater than or equal to the number of columns or groupings in the lower blocks.

Figure 17:
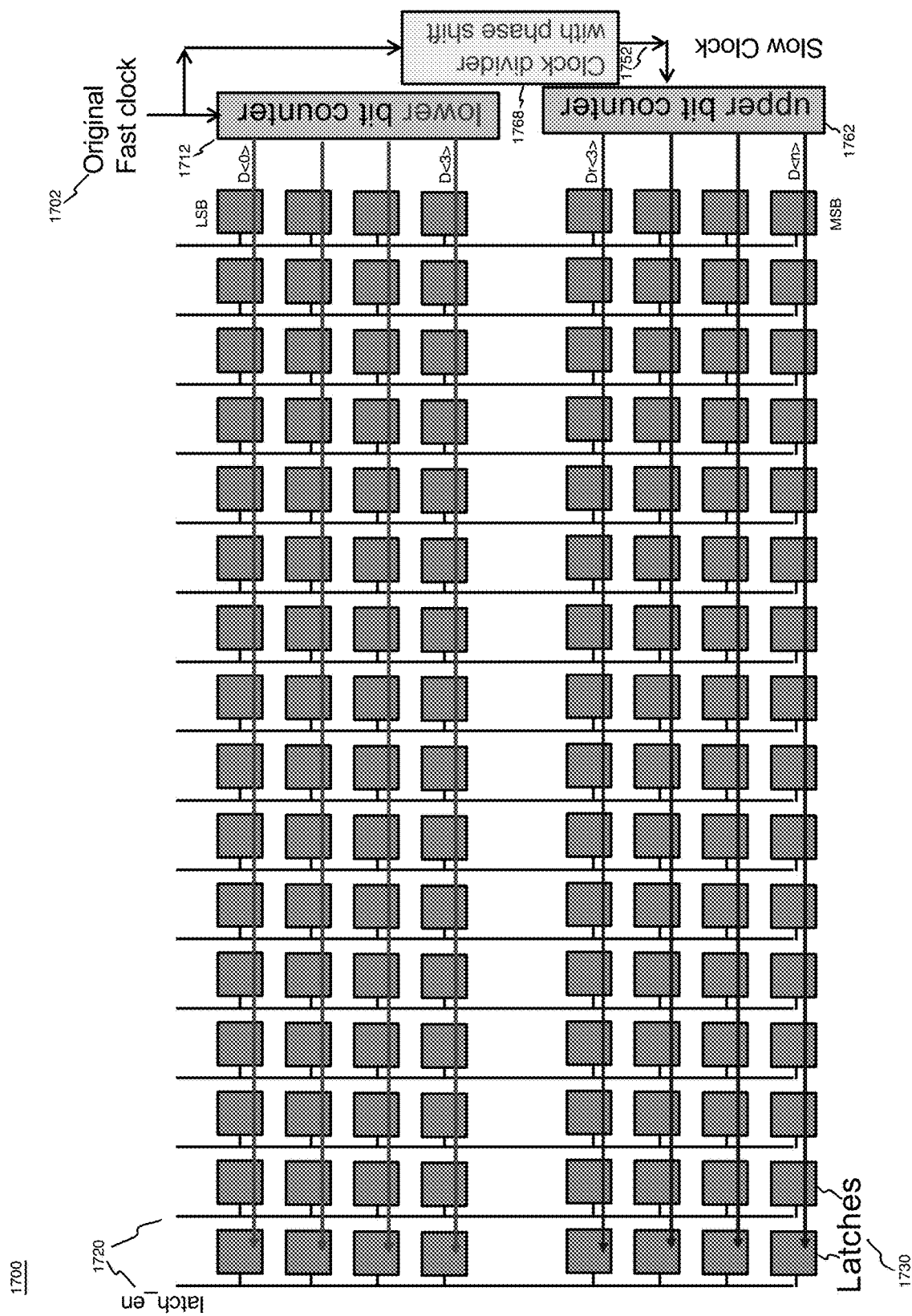
FIG. 17 is a block diagram illustrating an example of an N bit multi stage Gray code counting signal distribution system structure, including a lower bit Gray code counter, an upper bit Gray code counter, a clock divider with phase shift that generates counting signals which are shared by a plurality of latches in accordance with the teachings of the present invention.

FIG. 17 is a block diagram illustrating an example of an N bit multi stage Gray code counting system 1700 and corresponding signal distribution in accordance with the teachings of the present invention. As shown in the example, the Gray code counting system 1700 includes a clock divider with phase shift and generates counting signals that are shared among a plurality of latches 1730 in accordance with the teachings of the present invention. It is appreciated that the Gray code counting system 1700 may be included in ADC circuitry of an imaging sensor for all readout columns (e.g., readout columns 110). It is further appreciated that the Gray code counting structure of FIG. 17 may be another example of the Gray code counters described above that generate redundant bit(s), and that similarly named and numbered elements described above are coupled and function similarly below.

The example depicted in FIG. 17 illustrates that Gray code counting system 1700 includes a lower bit counter LBC 1712 that generates in response to a fast counting clock 1702 a plurality of lower data bits (e.g., LSBs), which are shared and stored among the plurality of latches 1730 in response to a respective latch enable signal latch_en 1720. Clock divider with phase shift 1768 is also coupled to receive the fast counting clock 1702 to generate a phase shifted slow clock 1752, which is coupled to an upper bit counter (UBC) 1762 to generate a plurality of upper data bits (MSBs), as well as the redundant bit, which are shared and stored among a plurality of latches 1730 in response to a respective latch enable signal latch_en 1720. In the example illustrated in FIG. 17, it is appreciated that the number of latches (e.g., columns of latches in FIG. 17) that are coupled to and share each output data bit of the LBC 1712 is the same number of latches (e.g., columns of latches in FIG. 17) that are coupled to and share each output data bit of the UBC 1762.

In the example, it is appreciated that Gray code counting system 1700 may generate N bit Gray code count values, of which LBC 1712 generates the M LSBs and UBC 1762 generates the N-M MSBs, which are concatenated with the M LSBs generated by LBC 1712, as well as the redundant bit Dr<3> as shown. In one example, the clock divider with phase shift 1768 divides the fast counting clock 1702 by an amount based on the number of bits of the lower bit counter and the redundant bit(s). For example, if M=4 and L=1, then the clock divider with phase shift 1768 may divide the fast counting clock 1702 by equal to or less than 8 (=$2^{4-1}$) to generate the phase shifted slow clock 1752. In addition, it is appreciated that UBC also generates one or more redundant bits (e.g. Dr<3>) that can be used by the error process logic to correct errors as discussed above.

Figure 18A:
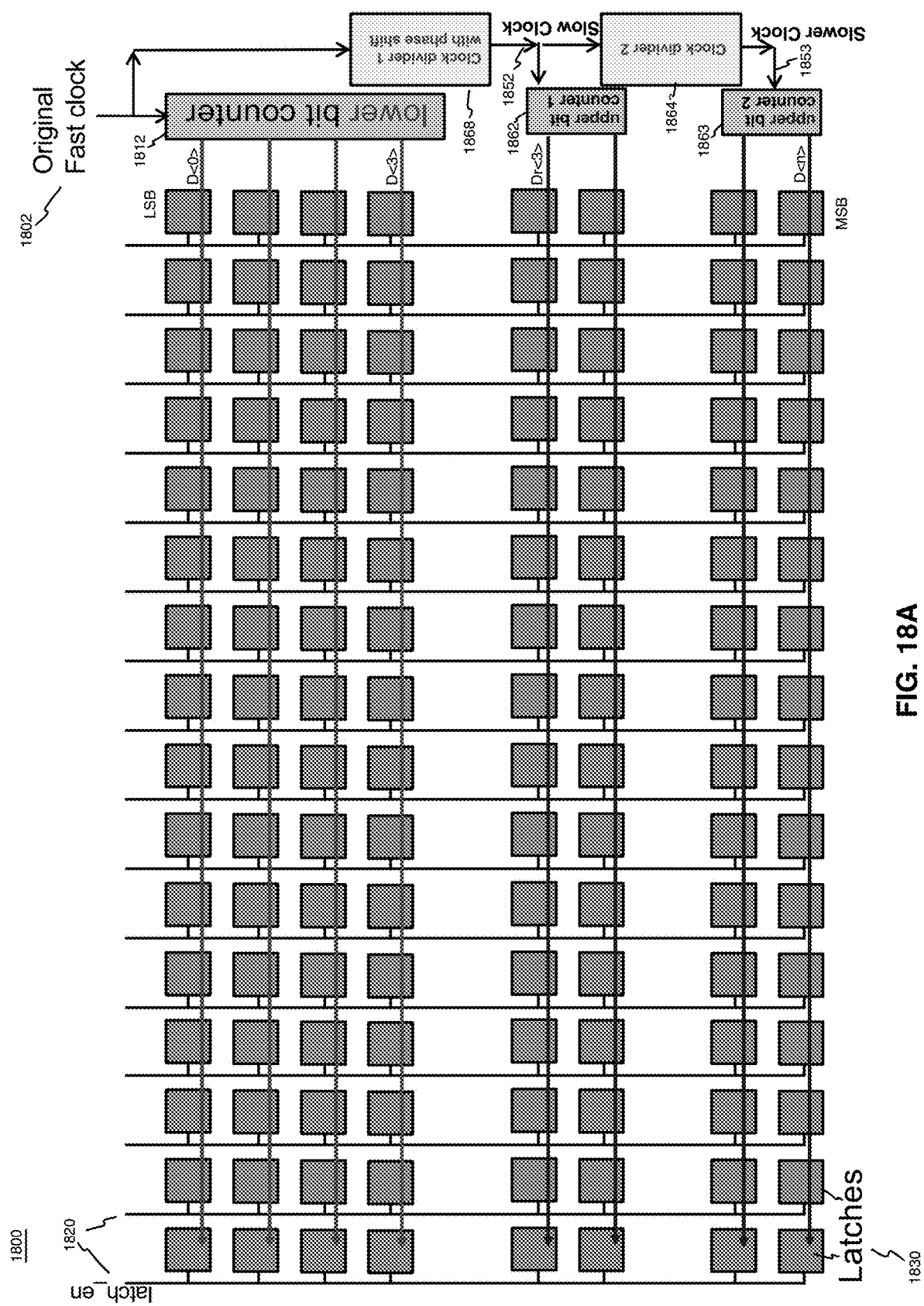
FIG. 18A is a block diagram illustrating an example of an N bit multi stage Gray code counting signal distribution system structure, including a lower bit Gray code counter, a multi stage upper bit counter and a clock dividers with phase shift and a clock divider, that generates counting signals which are shared by a plurality of latches in accordance with the teachings of the present invention.

FIG. 18A is a block diagram illustrating an example of an N bit multi stage Gray code counting system 1800, including a clock divider with phase shift and a clock divider, that generates counting signals which are shared by a plurality of latches in accordance with the teachings of the present invention. It is appreciated that Gray code counting system 1800 of FIG. 18A may be another example of the Gray code counters described above that generate redundant bit(s), and that similarly named and numbered elements described above are coupled and function similarly below.

As shown in the depicted example, FIG. 18A illustrates that Gray code counting system 1800 includes a lower bit counter LBC 1812 that generates in response to a fast counting clock 1802 a plurality of lower data bits (e.g., LSBs) that are shared and stored among the plurality of latches 1830 in response to a respective latch enable signal latch_en 1820. Clock divider with phase shift 1868 is also coupled to receive the fast counting clock 1802 to generate a phase shifted slow clock 1852, which is coupled to a first upper bit counter (UBC) 1862 to generate a first plurality of upper data bits (MSBs), as well as the redundant bit, that are shared and stored among a plurality of latches 1830 in response to a respective latch enable signal latch_en 1820.

In addition, the example depicted in FIG. 18A also shows that a second clock divider 1864 is also coupled to receive the phase shifted slow counting clock 1852 to generate a second slower clock 1853, which is coupled to a second upper bit counter (UBC) 1863 to generate a second plurality of upper data bits (MSBs) that are shared and stored among a plurality of latches 1830 in response to a respective latch enable signal latch_en 1820.

In the example illustrated in FIG. 18A, it is appreciated that the number of latches (e.g., columns of latches in FIG. 18A) that are coupled to and share each output data bit of the LBC 1812 is the same number of latches (e.g., columns of latches in FIG. 18A) that are coupled to and share each output data bit of the first UBC 1862 and the second UBC 1863.

In the example, it is appreciated that Gray code counting system 1800 may generate N bit Gray code count values, of which LBC 1812 generates the M LSBs and first and second UBCs 1862 and 1863 generate the N-M MSBs that are concatenated with the M LSBs generated by LBC 1812, as well as a redundant bit Dr<3> as shown. In this example, the clock divider with phase shift 1868 divides the fast counting clock 1802 by equal to or less than $2^{M-L}$ For instance, if M=4 and L=1, then the clock divider with phase shift 1868 divides the fast counting clock 1802 by equal to or less than 8 (=$2^{4-1}$) to generate the phase shifted slow clock 1852. In addition, it is appreciated that the first UBC 1862 also generates one or more redundant bits (e.g. Dr<3>) that can be used by the error process logic to correct errors as discussed above.

In the example, it is appreciated that the second clock divider 1864 divides the slow clock 1852 by an amount determined by the number of bits that are generated by first UBC 1862. For instance, if first upper bit counter 1862 generates 2 output data bits, then the second clock divider 1864 divides the first slow counting clock 1852 by equal to or less than 4 (=$2^2$) to generate the second slower clock 1853, which is coupled to the second UBC 1863 as shown.

Figure 18B:
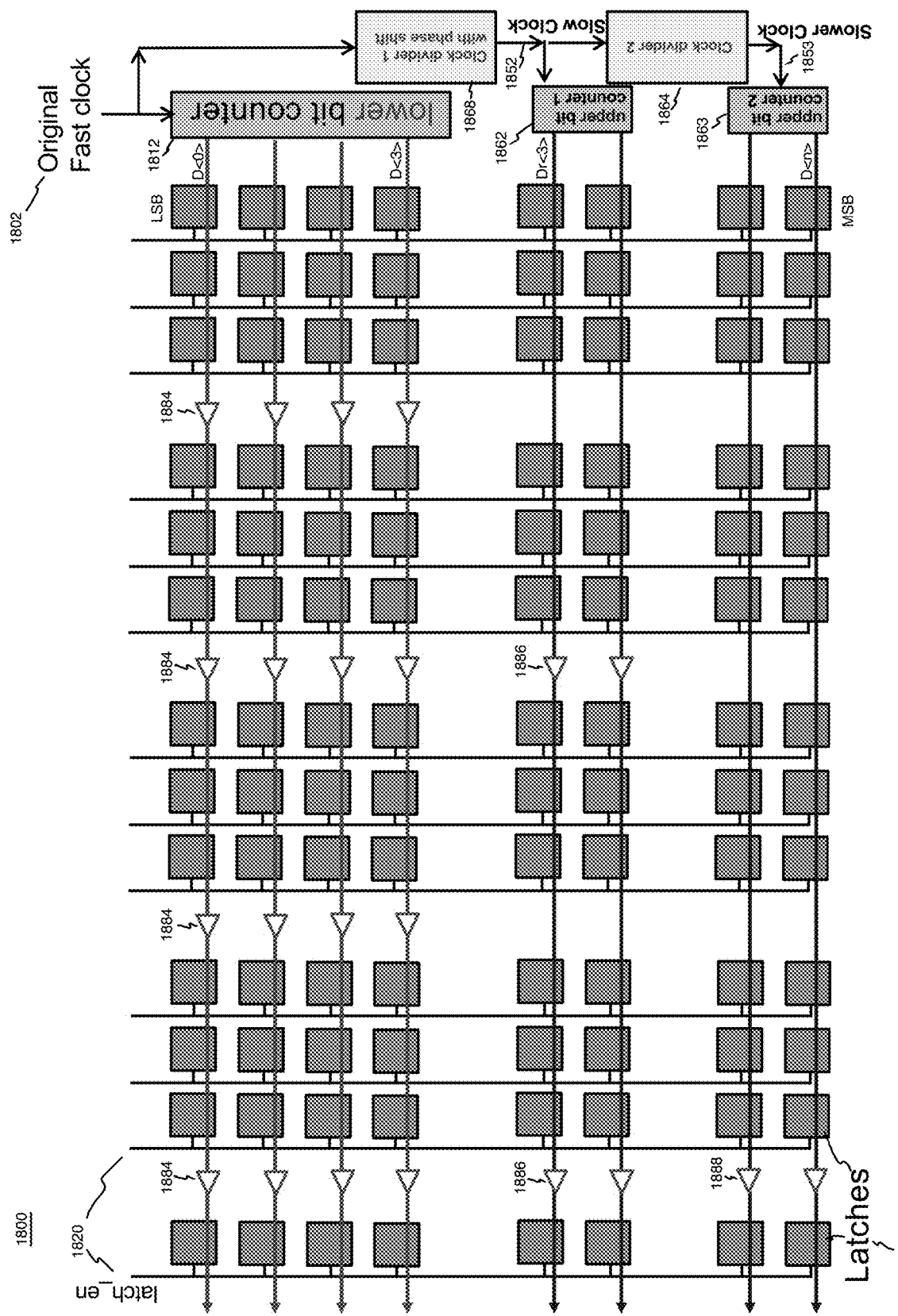
FIG. 18B is a block diagram illustrating another example of an N bit multi stage Gray code counting signal distribution system structure including a lower bit Gray code counter, a multi stage upper bit counter, a clock divider with phase shift, a clock divider, and buffers, that generates counting signals which are shared by a plurality of latches in accordance with the teachings of the present invention.

FIG. 18B is a block diagram illustrating another example of an N bit multi stage Gray code counter including a clock divider with phase shift, a clock divider, and buffers, that generate counting signals which are shared by a plurality of latches in accordance with the teachings of the present invention. It is appreciated that Gray code counting system 1800 of FIG. 18B may be another example of the Gray code counters described above that generate redundant bit(s), and that similarly named and numbered elements described above are coupled and function similarly below.

For instance, it is appreciated that the Gray code counting system 1800 illustrated in FIG. 18B shares many similarities with the Gray code counting system 1800 illustrated in FIG. 18A. One difference between the Gray code counting system 1800 illustrated in FIG. 18B and the Gray code counting system 1800 illustrated in FIG. 18A is that the Gray code counting system 1800 illustrated in FIG. 18B also includes a first plurality of buffers or repeaters 1884 distributed along the output data bit lines of LBC 1812, a second plurality of buffers or repeaters 1886 distributed along the output data bit lines of first UBC 1862, and a third plurality of buffers or repeaters 1888 distributed along the output data bit lines of second UBC 1863.

In one example, it is noted that the number of buffers that are included along each output data line increases as the frequency of the clock signal received by the respective bit counter increases. For instance, in the example depicted in FIG. 18B, the frequency of fast clock 1802 is greater than the frequency of first slow clock 1852, and the frequency of first slow clock 1852 is greater than the frequency of second slower clock 1853. As such, the example depicted in FIG. 18B shows that a buffer 1884 is distributed along the output data bit lines of LBC 1812 every 3 latches 1830, whereas a buffer 1886 is distributed along the output data bit lines of first UBC 1862 every 6 latches 1830, and a buffer 1888 is distributed along the output data bit lines of second UBC 1863 every 12 latches 1830. Stated in another way, in the depicted example, each the output of buffer 1884 is coupled to drive three latches 1830, each buffer 1886 is coupled to drive six latches 1830, and each buffer 1888 is coupled to drive twelve latches 1830.

It is appreciated that the example choice of a buffer or repeater every 3, 6, or 12 latches along output data bit lines in FIG. 18B is illustrated for explanation purposes, and that different numbers of buffers, repeaters, and/or latches may also be selected in accordance with the teachings of the present invention. In various examples, it is appreciated that the number of buffers or repeaters utilized in the output data bit lines and/or clock lines, if any, can be freely selected depending on the demand of signal integrity and/or the requirement of allowable delay difference. Indeed, in other examples, it is appreciated that the same number of buffers or repeaters may be included in all of the gray code signal lines regardless of LSB or MSB. In such an example, the number of buffers included in a particular signal lines does not necessarily need to vary depending on the clock or signal frequency. Furthermore, the inclusion of various numbers of buffers or repeaters along output data bit lines and/or clock lines can be applied to all the examples in accordance with the teachings of the present invention.

Figure 19:
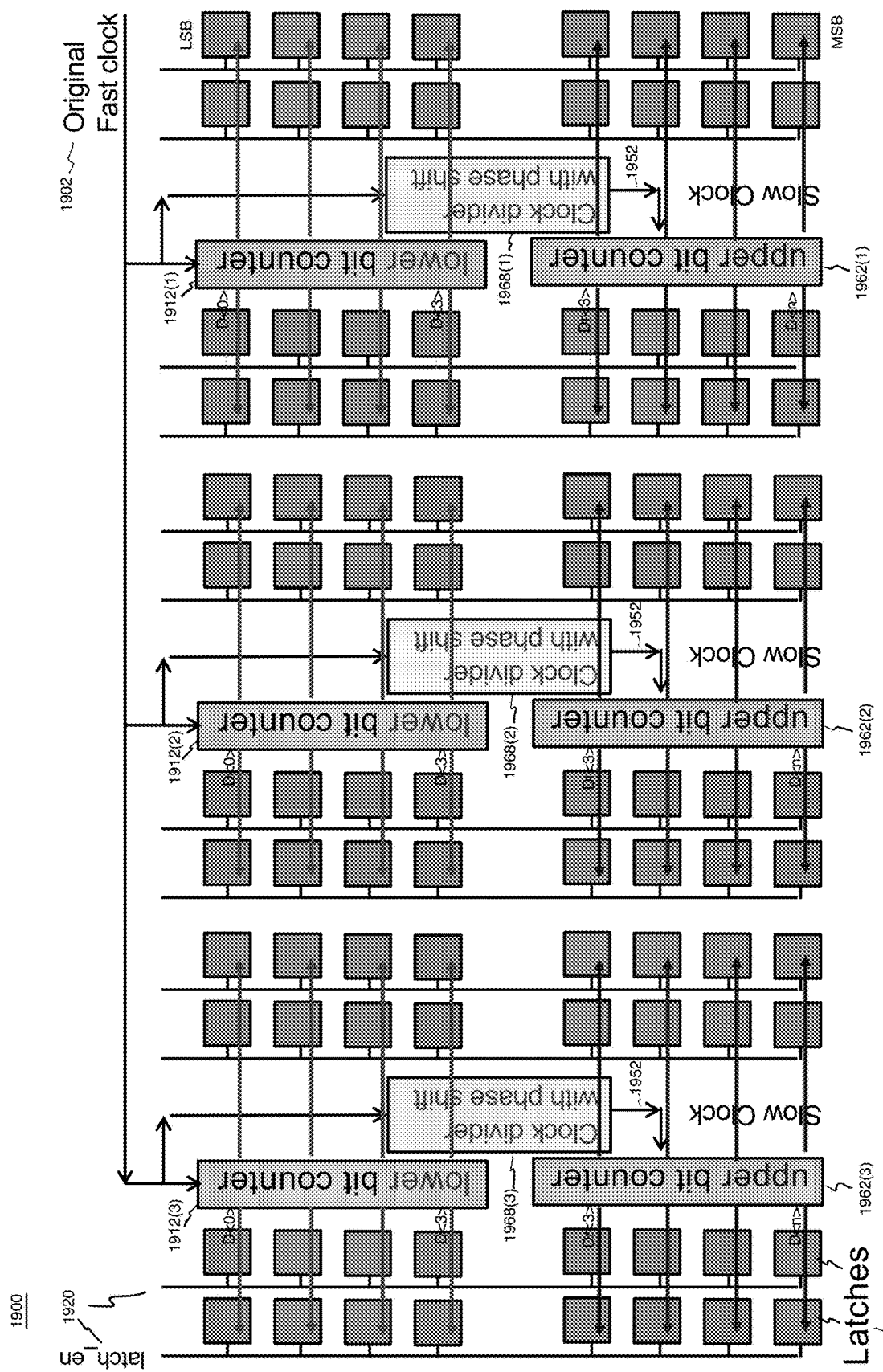
FIG. 19 is a block diagram illustrating an example of an N bit multi stage Gray code counting signal distribution system structure, including a plurality of lower bit counters, a plurality of upper bit counters, and a plurality of clock dividers with phase shift, that generates counting signals which are shared by a plurality of latches in accordance with the teachings of the present invention.

FIG. 19 is a block diagram illustrating an example of an N bit multi stage Gray code counting system 1900, including a plurality of lower bit counters, a plurality of upper bit counters, and a plurality of clock dividers with phase shift, that generates counting signals which are shared by a plurality of latches in accordance with the teachings of the present invention. It is appreciated that Gray code counting system 1900 of FIG. 19 may be another example of the Gray code counters described above that generate redundant bit(s), and that similarly named and numbered elements described above are coupled and function similarly below.

As shown in the depicted example, FIG. 19 illustrates that Gray code counting system 1900 includes a plurality of lower bit counters LBC 1912(1), 1912(2), 1912(3) that generate in response to a fast counting clock 1902 a plurality of lower data bits (e.g., LSBs) that are shared and stored among the plurality of latches 1930 in response to a respective latch enable signal latch_en 1920. A plurality of clock dividers with phase shift 1968(1), 1968(2), 1968(3) are also coupled to receive the fast counting clock 1902 to generate phase shifted slow clocks 1952, each of which is coupled to a respective upper bit counter (UBC) 1962(1), 1962(2), 1962(3) to generate a plurality of upper data bits (MSBs), as well as the redundant bit, that are shared and stored among a plurality of latches 1930 in response to a respective latch enable signal latch_en 1920.

In the example illustrated in FIG. 19, it is appreciated that the number of latches (e.g., columns of latches in FIG. 19) in the lower blocks of latches that are coupled to and share each output data bit of each LBC 1912(1), 1912(2), 1912(3) is the same number of latches (e.g., columns of latches in FIG. 19) in the upper blocks of latches that are coupled to and share each output data bit of each UBC 1962(1), 1962(2), 1962(3). For instance, as shown in the example depicted in FIG. 19, each output data bit line of each LBC 1912(1), 1912(2), 1912(3) and each UBC 1962(1), 1962(2), 1962(3) is coupled to and shared with 4 latches (e.g., four columns of latches in each lower block of latches and in each upper block of latches in FIG. 19).

Figure 20:
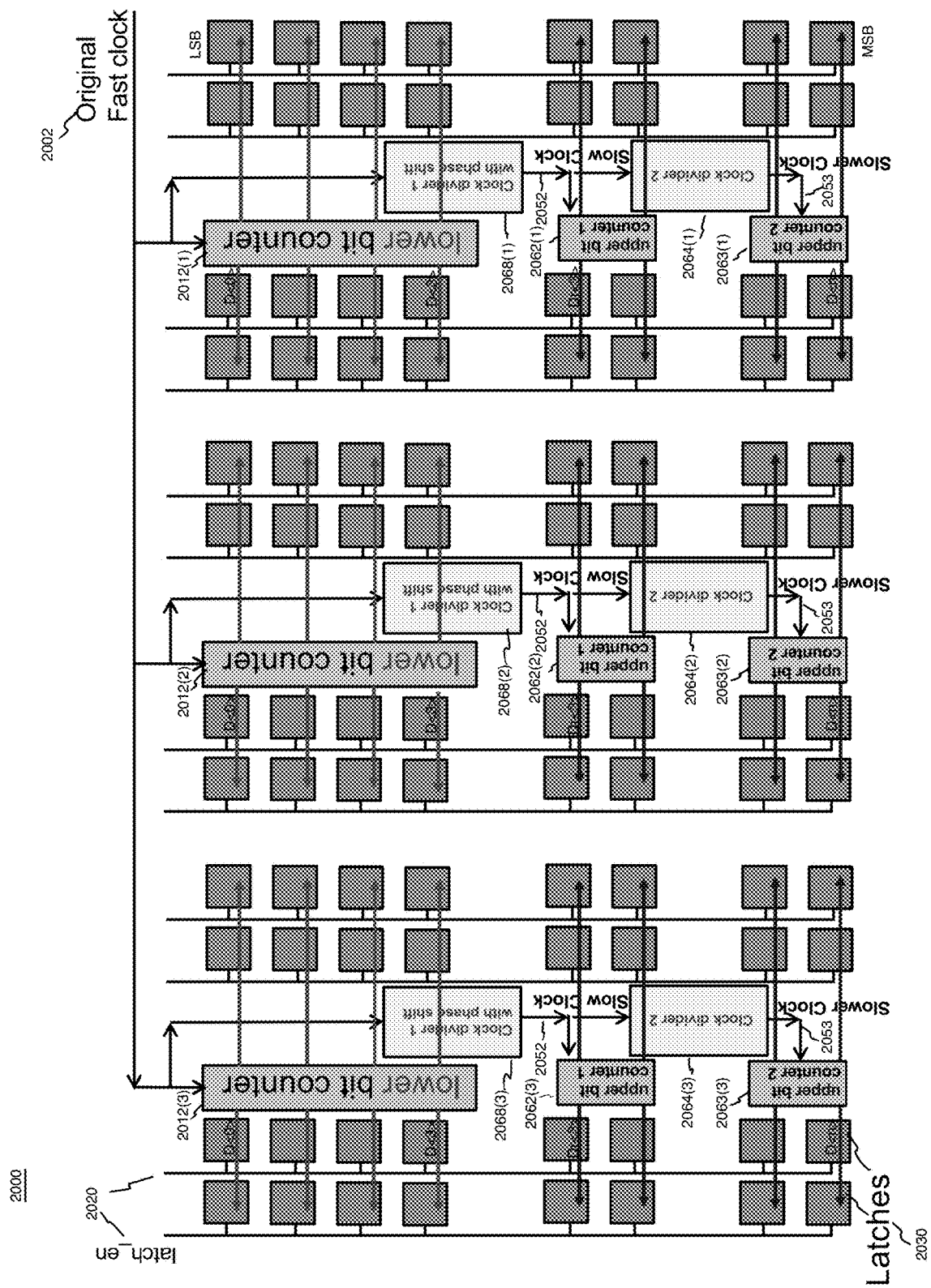
FIG. 20 is a block diagram illustrating an example of an N bit multi stage Gray code counting signal distribution system structure, including a plurality of lower bit counters, a plurality of multi stage upper bit counters, a plurality of clock dividers with phase shift, and a plurality of clock dividers, that generates counting signals which are shared by a plurality of latches in accordance with the teachings of the present invention.

FIG. 20 is a block diagram illustrating an example of an N bit multi stage Gray code counting system 2000, including a plurality of lower bit counters, a plurality of multi stage upper bit counters, a plurality of clock dividers with phase shift, and a plurality of clock dividers, that generates counting signals which are shared by a plurality of latches in accordance with the teachings of the present invention. It is appreciated that Gray code counting system 2000 of FIG. 20 may be another example of the Gray code counters described above that generate redundant bit(s), and that similarly named and numbered elements described above are coupled and function similarly below.

As shown in the depicted example, FIG. 20 illustrates that Gray code counting system 2000 includes a plurality of lower bit counters LBCs 2012(1), 2012(2), 2012(3) that generate in response to a fast counting clock 2002 a plurality of lower data bits (e.g., LSBs) that are shared and stored among the plurality of latches 2030 in response to a respective latch enable signal latch_en 2020. A plurality of clock dividers with phase shift 2068(1), 2068(2), 2068(3) are also coupled to receive the fast counting clock 2002 to generate phase shifted slow clocks 2052, which are coupled to a plurality of first upper bit counters (UBCs) 2062(1), 2062(2), 2062(3) to generate a first plurality of upper data bits (MSBs), as well as the redundant bit, that are shared and stored among a plurality of latches 2030 in response to a respective latch enable signal latch_en 2020.

In addition, the example depicted in FIG. 20 also shows that a plurality of second clock dividers 2064(1), 2064(2), 2064(3) are also coupled to receive the phase shifted slow counting clock 2052 to generate a second slower clock 2053, which is coupled to a plurality of second upper bit counters (UBCs) 2063(1), 2063(2), 2063(3) to generate a second plurality of upper data bits (MSBs) that are shared and stored among a plurality of latches 2030 in response to a respective latch enable signal latch_en 2020.

In the example, it is appreciated that each of the plurality of second clock dividers 2064(1), 2064(2), 2064(3) divides the slow clock 2052 by an amount determined by the number of bits that are generated by the plurality of UBCs 2062(1), 2062(2), 2062(3). For instance, if each of the first upper bit counters 2062(1), 2062(2), 2062(3) generates 2 output data bits, then each of the second clock dividers 2064(1), 2064(2), 2064(3) divides the first slow counting clock 2052 by equal to or less than 4 ($=2^2$) to generate the second slower clocks 2053, which are coupled to the second UBCs 2063(1), 2063(2), 2063(3) as shown.

In the example illustrated in FIG. 20, it is appreciated that the number of latches (e.g., columns of latches in FIG. 20) in the lower blocks of latches that are coupled to and share each output data bit of the LBCs 2012(1), 2012(2), 2012(3) is the same number of latches (e.g., columns of latches in FIG. 20) in the upper blocks of latches that are coupled to and share each output data bit of the plurality of first UBCs 2062(1), 2062(2), 2062(3) and each output data bit of the plurality of second UBCs 2063(1), 2063(2), 2063(3). For instance, in the depicted example, each output data bit of each of the plurality of LBCs 2012(1), 2012(2), 2012(3), each output data bit of each of the plurality of first UBCs 2062(1), 2062(2), 2062(3), and each output data bit of each of the plurality of second UBCs 2063(1), 2063(2), 2063(3) is coupled to and shared with four latches 2030 (e.g., four columns of latches in the lower blocks of latches and in the upper blocks of latches in FIG. 20).

It is appreciated that the example choice of each output data bit line of the bit counters being coupled to and shared with a block of four latches 2030 is for explanation purposes, and that a different number of latches in each block may also be coupled to and share each output data bit line of the bit counters in accordance with the teachings of the present invention.

Figure 21:
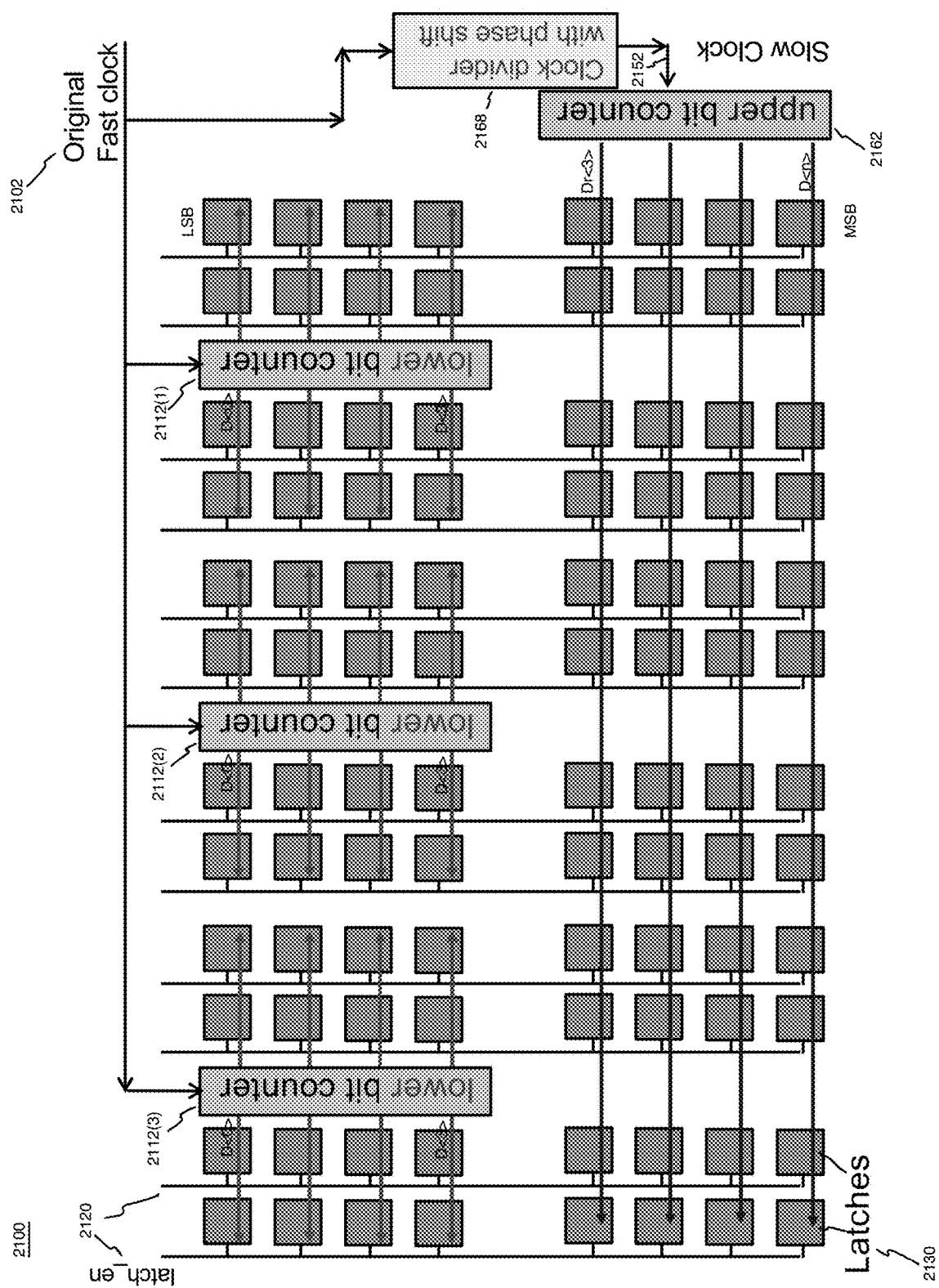
FIG. 21 is a block diagram illustrating an example of an N bit multi stage Gray code counting signal distribution system structure, including a plurality of lower bit counters, an upper bit counter, and a clock divider with phase shift, that generates counting signals which are shared by a plurality of latches in accordance with the teachings of the present invention.

FIG. 21 is a block diagram illustrating an example of an N bit multi stage Gray code counting system 2100, including a plurality of lower bit counters, an upper bit counter, and a clock divider with phase shift, that generates counting signals which are shared by a plurality of latches in accordance with the teachings of the present invention. It is appreciated that Gray code counting system 2100 of FIG. 21 may be another example of the Gray code counters described above that generate redundant bit(s), and that similarly named and numbered elements described above are coupled and function similarly below.

As shown in the depicted example, FIG. 21 illustrates that Gray code counting system 2100 includes a plurality of lower bit counters LBCs 2112(1), 2112(2), 2112(3), each of which generates in response to a fast counting clock 2102 a plurality of lower data bits (e.g., LSBs) that are shared and stored among a block including a first plurality of latches 2130 in response to a respective latch enable signal latch_en 2120. In the example depicted in FIG. 21, each of the plurality of lower data bits of each of the LBCs 2112(1), 2112(2), 2112(3) are shared and stored among a block including four latches 2130 (e.g., four columns of latches). In other examples, it is appreciated that each of the plurality of lower data bits of each of the LBCs 2112(1), 2112(2), 2112(3) may be shared and stored among a block including a different number of latches 2130.

Continuing with the depicted example, clock divider with phase shift 2168 is also coupled to receive the fast counting clock 2102 to generate a phase shifted slow clock 2152, which is coupled to an upper bit counter (UBC) 2162 to generate a plurality of upper data bits (MSBs), as well as a redundant bit, all of which are shared and stored among a block including a second plurality of latches 2130 in response to a respective latch enable signal latch_en 2120. In the example depicted in FIG. 21, each of the plurality of upper data bits of the UBCs 2162 is shared and stored among a block including all of the respective latches 2130 (e.g., twelve columns of latches in FIG. 21). In other examples, it is appreciated that the block including the second plurality of latches may be greater than or fewer than twelve columns of latches 2130, so long as the number of the first plurality of latches (e.g., four columns of latches) in the lower blocks coupled to the LBCs 2112(1), 2112(2), 2112(3) is less than or equal to the number of the second plurality of latches (e.g., twelve columns of latches) included in the upper block of latches coupled to the UBC 2162.

Figure 22:
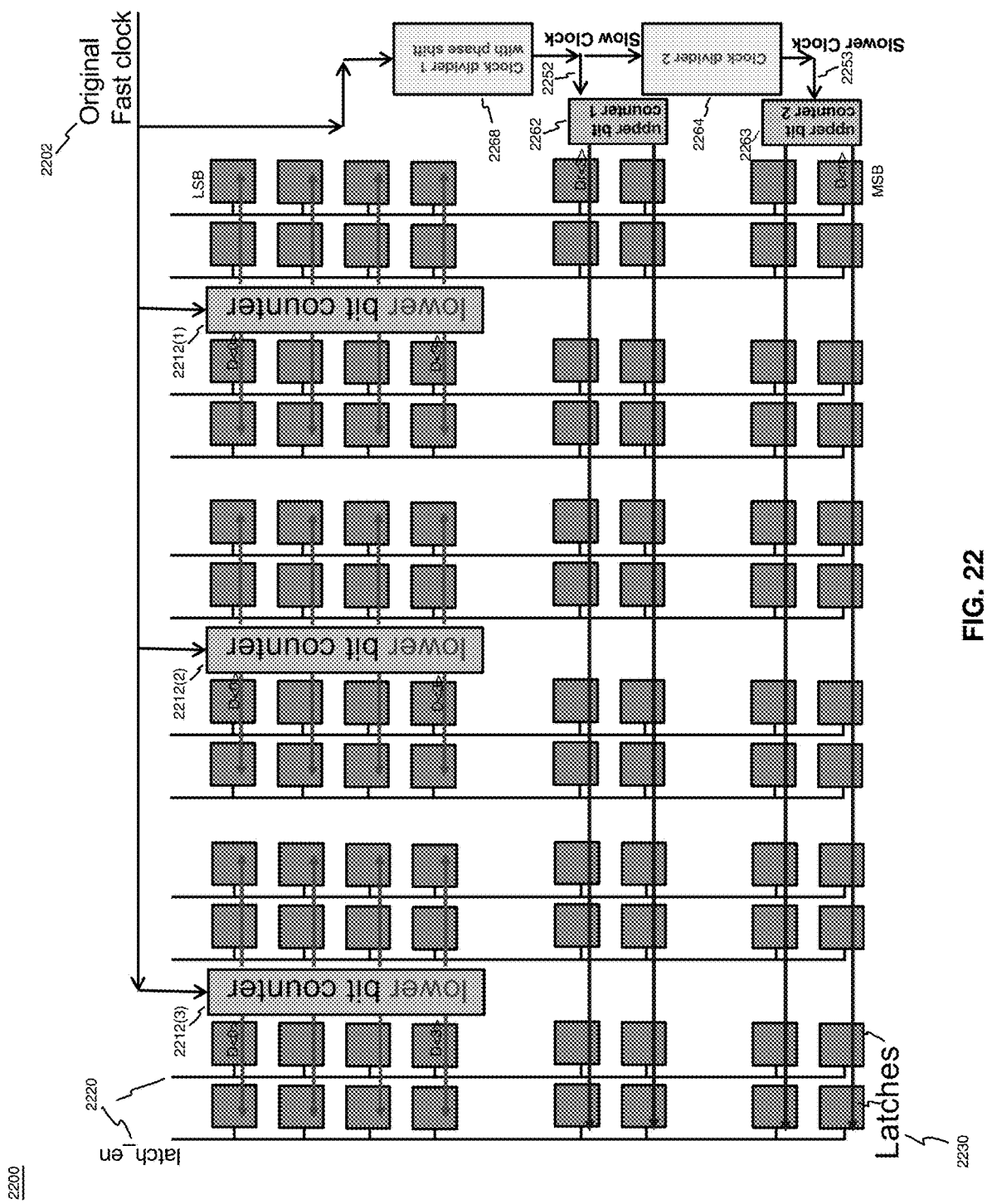
FIG. 22 is a block diagram illustrating an example of an N bit multi stage Gray code counting signal distribution system structure, including a plurality of lower bit counters, a multi stage upper bit counter, a clock divider with phase shift, and a clock divider, that generates counting signals which are shared by a plurality of latches in accordance with the teachings of the present invention.

FIG. 22 is a block diagram illustrating an example of an N bit multi stage Gray code counting system 2200, including a plurality of lower bit counters, a multi stage upper bit counter, a clock divider with phase shift, and a clock divider, that generates counting signals which are shared by a plurality of latches in accordance with the teachings of the present invention. It is appreciated that Gray code counting system 2200 of FIG. 22 may be another example of the Gray code counters described above that generate redundant bit(s), and that similarly named and numbered elements described above are coupled and function similarly below.

As shown in the depicted example, FIG. 22 illustrates that Gray code counting system 2200 includes a plurality of lower bit counters LBCs 2212(1), 2212(2), 2212(3), each of which generates in response to a fast counting clock 2202 a plurality of lower data bits (e.g., LSBs) that are shared and stored among a block including a first plurality of latches 2230 in response to a respective latch enable signal latch_en 2220. In the example depicted in FIG. 22, each of the plurality of lower data bits of each of the LBCs 2212(1), 2212(2), 2212(3) are shared and stored among four latches 2230 (e.g., four columns of latches) in the lower block of latches. In other examples, it is appreciated that each of the plurality of lower data bits of each of the LBCs 2212(1), 2212(2), 2212(3) may be shared and stored among a block including a different number of latches 2230.

Continuing with the depicted example, clock divider with phase shift 2268 is also coupled to receive the fast counting clock 2202 to generate a phase shifted slow clock 2252, which is coupled to a first upper bit counter (UBC) 2262 to generate a first plurality of upper data bits (MSBs), as well as a redundant bit, all of which are shared and stored among a block including a second plurality of latches 2230 in response to a respective latch enable signal latch_en 2220. In addition, the example depicted in FIG. 22 also shows that a second clock divider 2264 is also coupled to receive the phase shifted slow counting clock 2252 to generate a second slower clock 2253, which is coupled to a second upper bit counter (UBC) 2263 to generate a second plurality of upper data bits (MSBs), all of which are shared and stored among an upper block including a second plurality of latches 2230 in response to a respective latch enable signal latch_en 2220.

In the example depicted in FIG. 22, each of the plurality of upper data bits generated by UBC 2262 and UBC 2263 is shared and stored among a block including all of the respective latches 2230 (e.g., twelve columns of latches in FIG. 22). In other examples, it is appreciated that the upper block including the second plurality of latches may be greater than or fewer than twelve columns of latches 2230, so long as the number of the first plurality of latches (e.g., four columns of latches) in the lower blocks coupled to the LBCs 2212(1), 2212(2), 2212(3) is less than or equal to the number of the second plurality of latches (e.g., twelve columns of latches) in the upper block coupled to UBC 2262 and UBC 2263.

Figure 23:
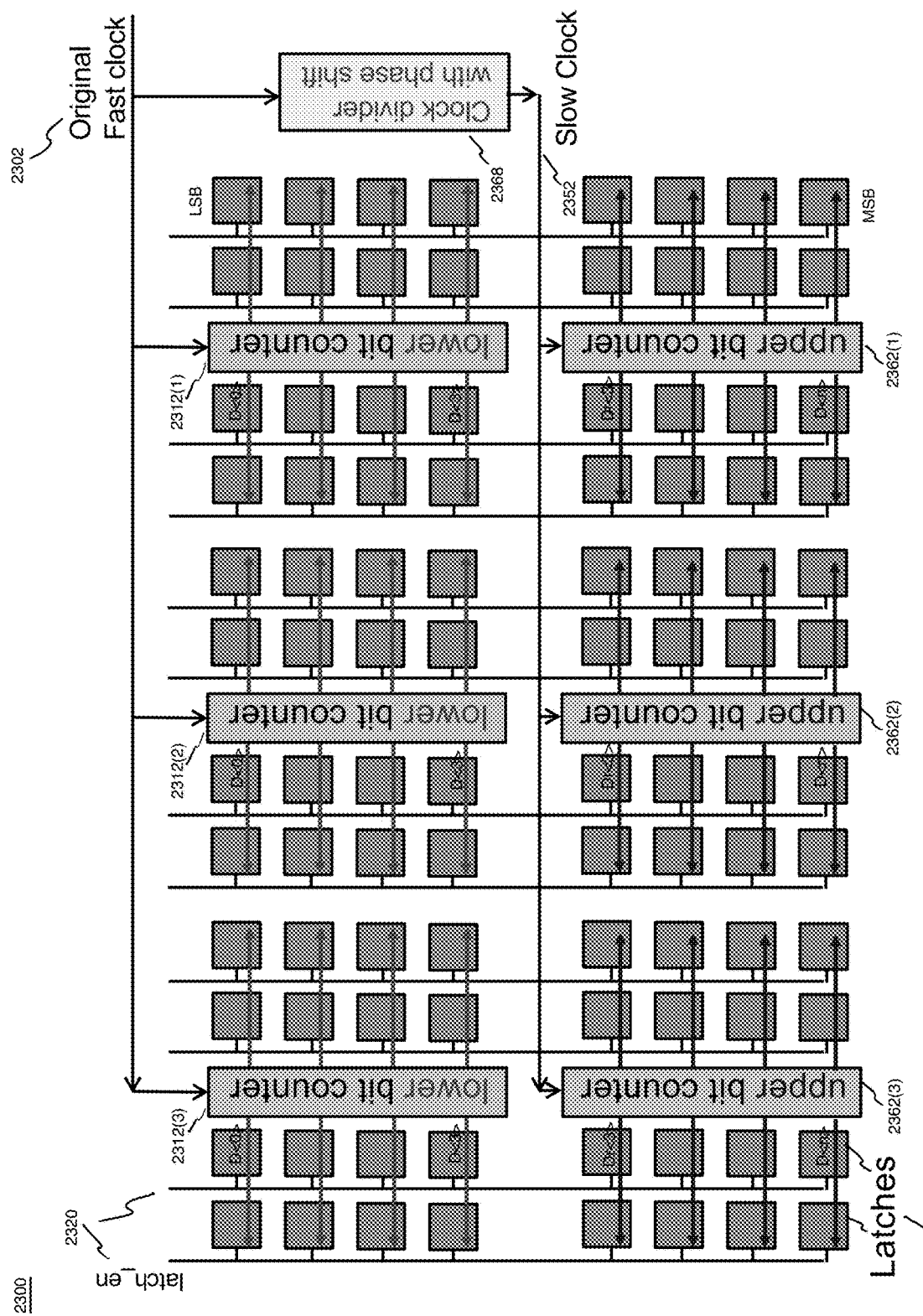
FIG. 23 is a block diagram illustrating an example of an N bit multi stage Gray code counting signal distribution system structure, including a plurality of lower bit counters, a plurality of upper bit counters, and a clock divider with phase shift, that generates counting signals which are shared by a plurality of latches in accordance with the teachings of the present invention.

FIG. 23 is a block diagram illustrating an example of an N bit multi stage Gray code counting system 2300, including a plurality of lower bit counters, a plurality of upper bit counters, and a clock divider with phase shift, that generates counting signals which are shared by a plurality of latches in accordance with the teachings of the present invention. It is appreciated that Gray code counting system 2300 of FIG. 23 may be another example of the Gray code counters described above that generate redundant bit(s), and that similarly named and numbered elements described above are coupled and function similarly below.

As shown in the depicted example, FIG. 23 illustrates that Gray code counting system 2300 includes a plurality of lower bit counters LBCs 2312(1), 2312(2), 2312(3), each of which generates in response to a fast counting clock 2302 a plurality of lower data bits (e.g., LSBs) that are shared and stored among a lower block including a plurality of latches 2330 in response to a respective latch enable signal latch_en 2320. In the example depicted in FIG. 23, each of the plurality of lower data bits of each of the LBCs 2312(1), 2312(2), 2312(3) are shared and stored among a lower block including four latches 2330 (e.g., four columns of latches). In other examples, it is appreciated that each of the plurality of lower data bits of each of the LBCs 2312(1), 2312(2), 2312(3) may be shared and stored among a lower block including a different number of latches 2330.

Continuing with the depicted example, clock divider with phase shift 2368 is also coupled to receive the fast counting clock 2302 to generate a phase shifted slow clock 2352, which is coupled to a plurality of upper bit counters (UBCs) 2362(1), 2362(2), 2362(3). Each of the UBCs 2362(1), 2362(2), 2362(3) generates in response to slow clock 2352 a plurality of upper data bits (e.g., MSBs), including a redundant bit, that are shared and stored among an upper block including a plurality of latches 2330 in response to a respective latch enable signal latch_en 2320. In the example depicted in FIG. 23, each of the plurality of upper data bits of each of the UBCs 2362(1), 2362(2), 2362(3) are shared and stored among an upper block including four latches 2330 (e.g., four columns of latches). In other examples, it is appreciated that each of the plurality of upper data bits of each of the UBCs 2362(1), 2362(2), 2362(3) may be shared and stored among an upper block including a different number of latches 2330.

In the example illustrated in FIG. 23, it is appreciated that the number of latches (e.g., columns of latches in FIG. 23) in the lower blocks that are coupled to and share each output data bit of each LBC 2312(1), 2312(2), 2312(3) is the same number of latches (e.g., columns of latches in FIG. 23) in the upper blocks that are coupled to and share each output data bit of each UBC 2362(1), 2362(2), 2362(3). For instance, as shown in the example depicted in FIG. 23, each output data bit line of each LBC 2312(1), 2312(2), 2312(3) and each UBC 2362(1), 2362(2), 2362(3) is coupled to and shared with lower and upper blocks that 4 latches (e.g., four columns of latches in FIG. 23). In other examples, it is appreciated that the number of latches 2330 in the lower and upper blocks that are share each output data bit of the LBCs 2312(1), 2312(2), 2312(3) and the UBCs 2362(1), 2362(2), 2362(3) may be a different number from four latches 2330.

Figure 24:
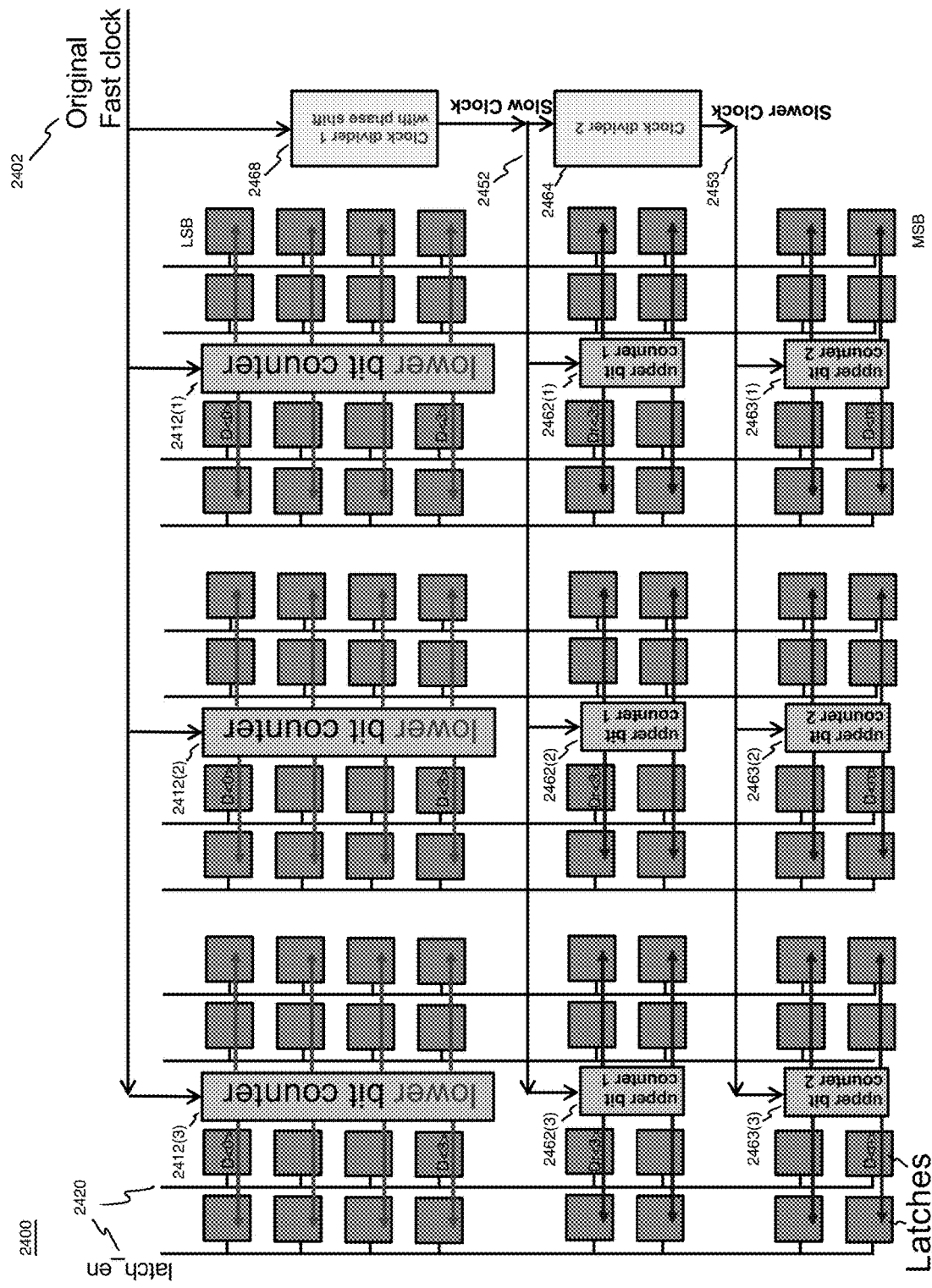
FIG. 24 is a block diagram illustrating an example of an N bit multi stage Gray code counting signal distribution system structure, including a plurality of lower bit counters, a plurality of multi stage upper bit counters, a clock divider with phase shift, and a clock divider, that generates counting signals which are shared by a plurality of latches in accordance with the teachings of the present invention.

FIG. 24 is a block diagram illustrating an example of an N bit multi stage Gray code counting system 2400, including a plurality of lower bit counters, a plurality of multi stage upper bit counters, a clock divider with phase shift, and a clock divider, that generates counting signals which are shared by a plurality of latches in accordance with the teachings of the present invention. It is appreciated that Gray code counting system 2400 of FIG. 24 may be another example of the Gray code counters described above that generate redundant bit(s), and that similarly named and numbered elements described above are coupled and function similarly below.

As shown in the depicted example, FIG. 24 illustrates that Gray code counting system 2400 includes a plurality of lower bit counters LBCs 2412(1), 2412(2), 2412(3), each of which generates in response to a fast counting clock 2402 a plurality of lower data bits (e.g., LSBs) that are shared and stored among a lower block including a plurality of latches 2430 in response to a respective latch enable signal latch_en 2420. In the example depicted in FIG. 24, each of the plurality of lower data bits of each of the LBCs 2412(1), 2412(2), 2412(3) are shared and stored among a lower block including four latches 2430 (e.g., four columns of latches). In other examples, it is appreciated that each of the plurality of lower data bits of each of the LBCs 2412(1), 2412(2), 2412(3) may be shared and stored among a lower block including a different number of latches 2430.

Continuing with the depicted example, clock divider with phase shift 2468 is also coupled to receive the fast counting clock 2402 to generate a phase shifted slow clock 2452, which is coupled to a plurality of first upper bit counters (UBCs) 2462(1), 2462(2), 2462(3). Each of the UBCs 2462(1), 2462(2), 2462(3) generates in response to slow clock 2452 a first plurality of upper data bits (e.g., MSBs), including a redundant bit, that are shared and stored among upper blocks that include the plurality of latches 2430 in response to a respective latch enable signal latch_en 2420.

In addition, the example depicted in FIG. 24 also shows that a second clock divider 2464 is also coupled to receive the phase shifted slow counting clock 2452 to generate a second slower clock 2453, which is coupled to a plurality of second upper bit counters (UBCs) 2463(1), 2463(2), 2463(3) to generate a second plurality of upper data bits (MSBs) that are shared and stored among the upper blocks including the plurality of latches 2430 in response to a respective latch enable signal latch_en 2420.

In the example, it is appreciated that the second clock divider 2464 divides the slow clock 2452 by an amount determined by the number of bits that are generated by the plurality of UBCs 2462(1), 2462(2), 2462(3). For instance, if each of the first upper bit counters 2462(1), 2462(2), 2462(3) generates 2 output data bits, then the second clock divider 2464 divides the first slow counting clock 2452 by equal to or less than 4 (=$2^2$) to generate the second slower clock 2453, which is coupled to the second UBCs 2463(1), 2463(2), 2463(3) as shown.

In the example illustrated in FIG. 24, it is appreciated that the number of latches (e.g., columns of latches in FIG. 24) in the lower blocks that are coupled to and share each output data bit of the LBCs 2412(1), 2412(2), 2412(3) is the same number of latches (e.g., columns of latches in FIG. 24) in the upper blocks that are coupled to and share each output data bit of the plurality of first UBCs 2462(1), 2462(2), 2462(3) and each output data bit of the plurality of second UBCs 2463(1), 2463(2), 2463(3). For instance, in the depicted example, each output data bit of each of the plurality of LBCs 2412(1), 2412(2), 2412(3), each output data bit of each of the plurality of first UBCs 2462(1), 2462(2), 2462(3), and each output data bit of each of the plurality of second UBCs (1), 2463(2), 2463(3) is coupled to and shared with lower and upper blocks including four latches 2430 (e.g., four columns of latches in FIG. 24).

It is appreciated that the example choice of each output data bit line of the bit counters being coupled to and shared with lower and upper blocks including four latches 2430 is for explanation purposes, and that a different number of latches may also be coupled to and share each output data bit line of the bit counters in accordance with the teachings of the present invention.

Figure 25:
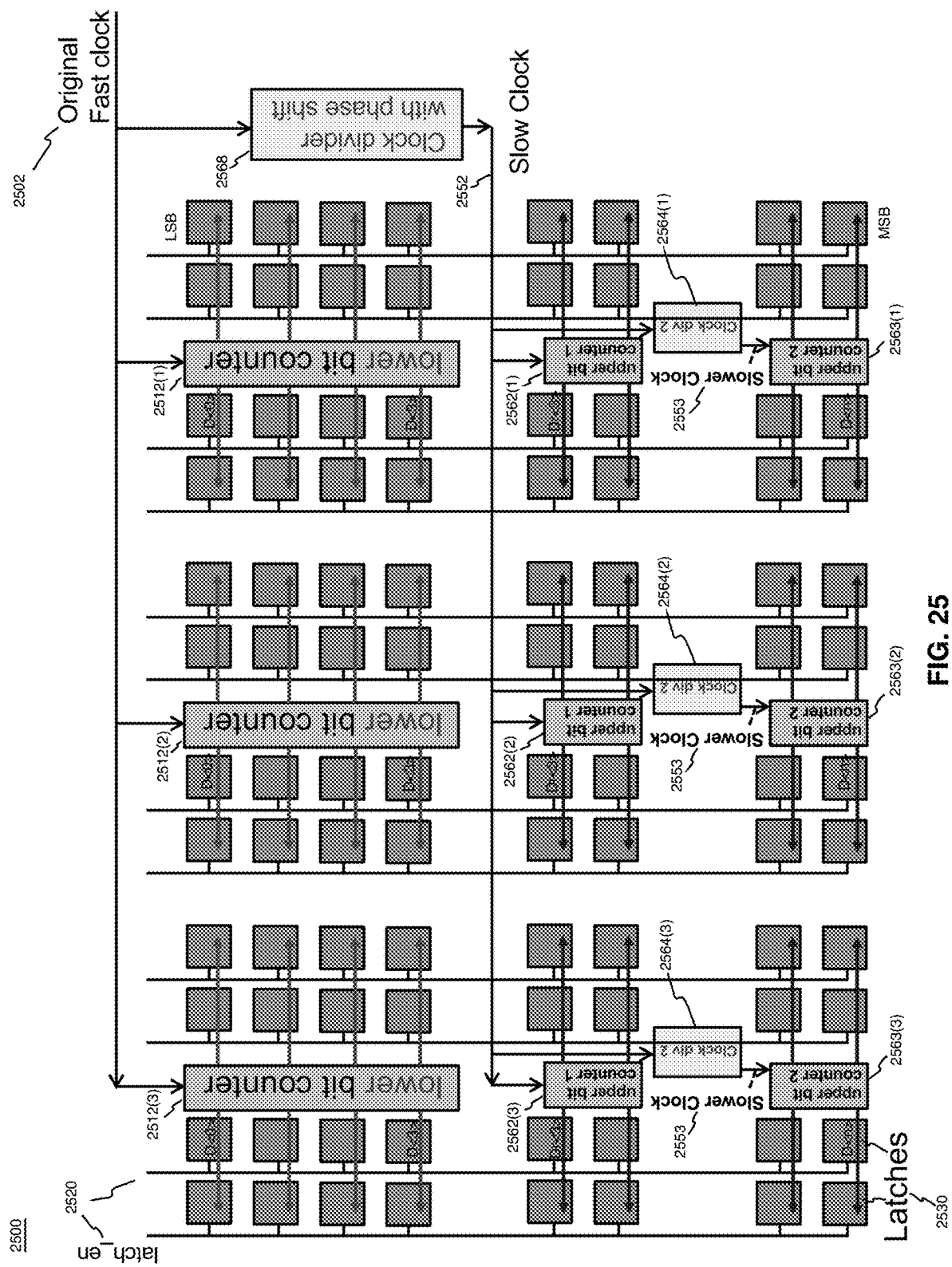
FIG. 25 is a block diagram illustrating an example of an N bit multi stage Gray code counting signal distribution system structure, including a plurality of lower bit counters, a plurality of multi stage upper bit counters, a clock divider with phase shift, and a plurality of clock dividers, that generates counting signals which are shared by a plurality of latches in accordance with the teachings of the present invention.

FIG. 25 is a block diagram illustrating an example of an N bit multi stage Gray code counting system 2500, including a plurality of lower bit counters, a plurality of multi stage upper bit counters, a clock divider with phase shift, and a plurality of clock dividers, that generates counting signals which are shared by a plurality of latches in accordance with the teachings of the present invention. It is appreciated that Gray code counting system 2500 of FIG. 25 may be another example of the Gray code counters described above that generate redundant bit(s), and that similarly named and numbered elements described above are coupled and function similarly below.

As shown in the depicted example, FIG. 25 illustrates that Gray code counting system 2500 includes a plurality of lower bit counters LBCs 2512(1), 2512(2), 2512(3), each of which generates in response to a fast counting clock 2502 a plurality of lower data bits (e.g., LSBs) that are shared and stored among a lower block including a plurality of latches 2530 in response to a respective latch enable signal latch_en 2520. In the example depicted in FIG. 25, each of the plurality of lower data bits of each of the LBCs 2512(1), 2512(2), 2512(3) are shared and stored among a lower block including four latches 2530 (e.g., four columns of latches). In other examples, it is appreciated that each of the plurality of lower data bits of each of the LBCs 2512(1), 2512(2), 2512(3) may be shared and stored among a lower block including a different number of latches 2530.

Continuing with the depicted example, clock divider with phase shift 2568 is also coupled to receive the fast counting clock 2502 to generate a phase shifted slow clock 2552, which is coupled to a plurality of first upper bit counters (UBCs) 2562(1), 2562(2), 2562(3). Each of the UBCs 2562(1), 2562(2), 2562(3) generates in response to slow clock 2552 a first plurality of upper data bits (e.g., MSBs), including a redundant bit, that are shared and stored among an upper block including the plurality of latches 2530 in response to a respective latch enable signal latch_en 2520.

In addition, the example depicted in FIG. 25 also shows that a plurality of second clock dividers 2564(1), 2564(2), 2564(3) are also coupled to receive the phase shifted slow counting clock 2552 to generate second slower clocks 2553, which are coupled to a plurality of second upper bit counters (UBCs) 2563(1), 2563(2), 2563(3) to generate a second plurality of upper data bits (MSBs) that are shared and stored among an upper block including a plurality of latches 2530 in response to a respective latch enable signal latch_en 2520.

In the example, it is appreciated that each of the plurality of second clock dividers 2564(1), 2564(2), 2564(3) divide the slow clock 2552 by an amount determined by the number of bits that are generated by the plurality of UBCs 2562(1), 2562(2), 2562(3). For instance, if each of the first upper bit counters 2562(1), 2562(2), 2562(3) generates 2 output data bits, then each of the second clock dividers 2564(1), 2564(2), 2564(3) divides the first slow counting clock 2552 by equal to or less than 4 (=$2^2$) to generate the second slower clock 2553, which is coupled to the second UBCs 2563(1), 2563(2), 2563(3) as shown.

In the example illustrated in FIG. 25, it is appreciated that the number of latches (e.g., columns of latches in FIG. 25) in the lower blocks that are coupled to and share each output data bit of the LBCs 2512(1), 2512(2), 2512(3) is the same number of latches (e.g., columns of latches in FIG. 25) in the upper blocks that are coupled to and share each output data bit of the plurality of first UBCs 2562(1), 2562(2), 2562(3) and each output data bit of the plurality of second UBCs 2563(1), 2563(2), 2563(3). For instance, in the depicted example, each output data bit of each of the plurality of LBCs 2512(1), 2512(2), 2512(3), each output data bit of each of the plurality of first UBCs 2562(1), 2562(2), 2562(3), and each output data bit of each of the plurality of second UBCs 2563(1), 2563(2), 2563(3) is coupled to and shared with lower and upper blocks including four latches 2530 (e.g., four columns of latches in FIG. 25).

It is appreciated that the example choice of each output data bit line of the bit counters being coupled to and shared with lower and upper blocks with four latches 2530 is for explanation purposes, and that a different number of latches in the lower and upper blocks may also be coupled to and share each output data bit line of the bit counters in accordance with the teachings of the present invention.

Figure 26A:
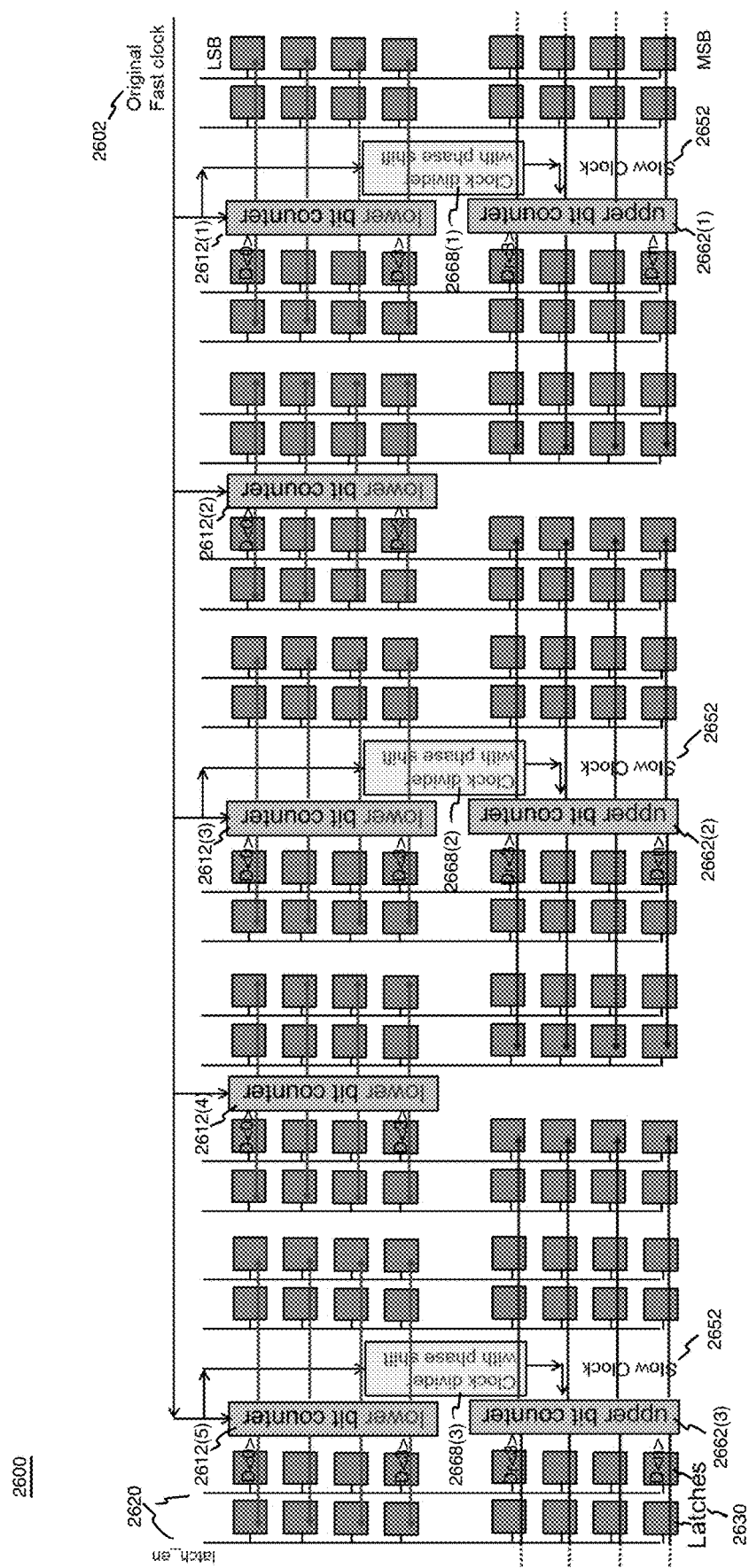
FIG. 26A is a block diagram illustrating an example of an N bit multi stage Gray code counting signal distribution system structure, including a plurality of lower bit counters, a plurality of upper bit counters, and a plurality of clock dividers with phase shift, that generates counting signals which are shared by a plurality of latches in accordance with the teachings of the present invention.

FIG. 26A is a block diagram illustrating an example of an N bit multi stage Gray code counting system 2600, including a plurality of lower bit counters, a plurality of upper bit counters, and a plurality of clock dividers with phase shift, that generates counting signals which are shared by a plurality of latches in accordance with the teachings of the present invention. It is appreciated that Gray code counting system 2600 of FIG. 26A may be another example of the Gray code counters described above that generate redundant bit(s), and that similarly named and numbered elements described above are coupled and function similarly below.

As shown in the depicted example, FIG. 26A illustrates that Gray code counting system 2600 includes a plurality of lower bit counters LBCs 2612(1), 2612(2), 2612(3), 2612(4), 2612(5), each of which generates in response to a fast counting clock 2602 a plurality of lower data bits (e.g., LSBs) that are shared and stored among a lower block including a first plurality of latches 2630 in response to a respective latch enable signal latch_en 2620. In the example depicted in FIG. 26A, each of the plurality of lower data bits of each of the LBCs 2612(1), 2612(2), 2612(3), 2612(4), 2612(5) are shared and stored among a lower block with four latches 2630 (e.g., four columns of latches). In other examples, it is appreciated that each of the plurality of lower data bits of each of the LBCs 2612(1), 2612(2), 2612(3), 2612(4), 2612(5) may be shared and stored among a lower block including a different number of latches 2630.

Continuing with the depicted example, a plurality of clock dividers with phase shift 2668(1), 2668(2), 2668(3) is also coupled to receive the fast counting clock 2602 to generate phase shifted slow clocks 2652, which are coupled to a plurality of upper bit counters (UBCs) 2662(1), 2662(2), 2662(3). Each of the UBCs 2662(1), 2662(2), 2662(3) generates in response to slow clock 2652 a plurality of upper data bits (e.g., MSBs), including a redundant bit, that are shared and stored among an upper block including a second plurality of latches 2630 in response to a respective latch enable signal latch_en 2620. In the example depicted in FIG. 26A, each of the plurality of upper data bits of each of the UBCs 2662(1), 2662(2), 2662(3) are shared and stored among an upper block including eight latches 2630 (e.g., eight columns of latches). In other examples, it is appreciated that each of the plurality of upper data bits of each of the UBCs 2662 may be shared and stored among a different number of latches 2630.

In the example illustrated in FIG. 26A, it is appreciated that the number of latches 2630 (e.g., a first plurality of latches) in the lower blocks that are coupled to and share each output data bit of each LBC 2612(1), 2612(2), 2612(3), 2612(4), 2612(5) is a number that is less than or equal to the number of latches (e.g., a second plurality of latches) in the upper blocks that are coupled to and share each output data bit of each UBC 2662(1), 2662(2), 2662(3). For instance, as shown in the example depicted in FIG. 26A, each output data bit line of each LBC 2612(1), 2612(2), 2612(3), 2612(4), 2612(5) is coupled to and shared with a lower block including 4 latches (e.g., four columns of latches in FIG. 26A), while each output data bit line of each UBC 2662(1), 2662(2), 2662(3) is coupled to and shared with an upper block including 8 latches. In other examples, it is appreciated that the number of latches 2630 that are share each output data bit of the LBCs 2612(1), 2612(2), 2612(3), 2612(4), 2612(5) and the UBCs 2662(1), 2662(2), 2662(3) in the lower and upper blocks may be numbers different than four or eight latches 2630, so long as each output data bit line of each the LBCs 2612(1), 2612(2), 2612(3), 2612(4), 2612(5) is coupled to and shared with a fewer or equal number of latches 2630 in the lower blocks than each output data bit line of each of the UBCs 2662(1), 2662(2), 2662(3) in the upper blocks.

Figure 26B:
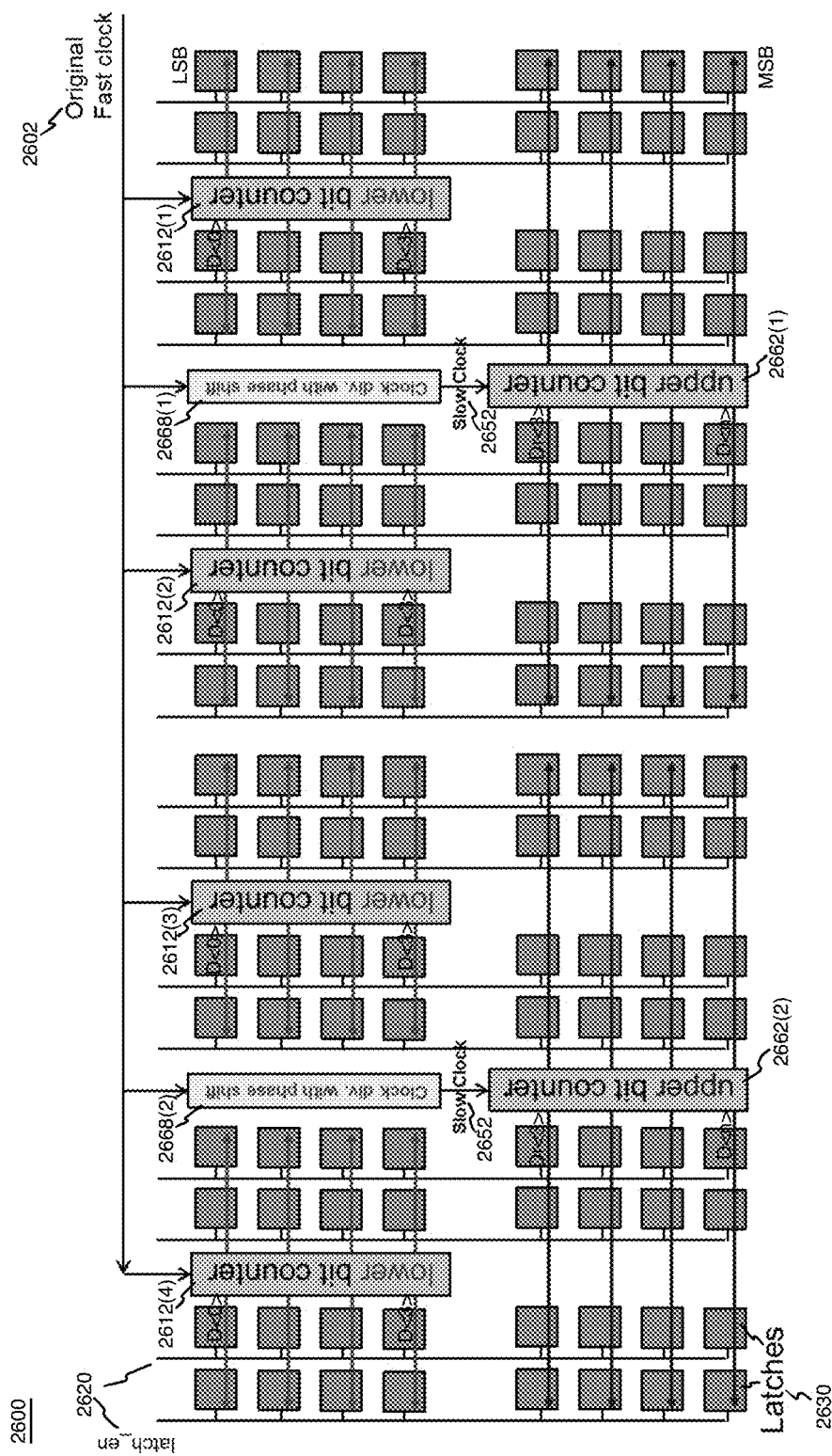
FIG. 26B is a block diagram illustrating another example of an N bit multi stage Gray code counting signal distribution system structure, including a plurality of lower bit counters, a plurality of upper bit counters, and a plurality of clock dividers with phase shift, that generates counting signals which are shared by a plurality of latches in accordance with the teachings of the present invention.

FIG. 26B is a block diagram illustrating another example of an N bit multi stage Gray code counting system 2600, including a plurality of lower bit counters, a plurality of upper bit counters, and a plurality of clock dividers with phase shift, that generates counting signals which are shared by a plurality of latches in accordance with the teachings of the present invention. It is appreciated that Gray code counting system 2600 of FIG. 26B may be another example of the Gray code counters described above that generate redundant bit(s), and that similarly named and numbered elements described above are coupled and function similarly below.

Indeed, it is appreciated that Gray code counting system 2600 of FIG. 26B shares many similarities especially with the Gray code counting system 2600 described in FIG. 26A. However, one difference between the Gray code counting system 2600 of FIG. 26A and Gray code counting system 2600 of FIG. 26B is that in the Gray code counting system of 2600 of FIG. 26A, each of the UBCs 2662(1), 2662(2), 2662(3) is aligned with one of the LBCs (e.g., 2612(1), 2612(3), 2612(5)). As such, each UBC 2662(1), 2662(2), 2662(3) that is aligned with one of the LBCs (e.g., 2612(1), 2612(3), 2612(5)), is arranged between the same columns of latches 2630 as the LBC 2612(1), 2612(3), 2612(5) that the respective UBC 2662(1), 2662(2), 2662(3) is aligned with. In comparison, in Gray code counting system 2600 of FIG. 26B, all of the UBCs 2662(1), 2662(2) are non-aligned with the LBCs 2612(1), 2612(2), 2612(3), 2612(4). As such, all of the UBCs 2662(1), 2662(2) are arranged between different columns of latches 2630 than each LBC 2612(1), 2612(2), 2612(3), 2612(4).

Figure 27A:
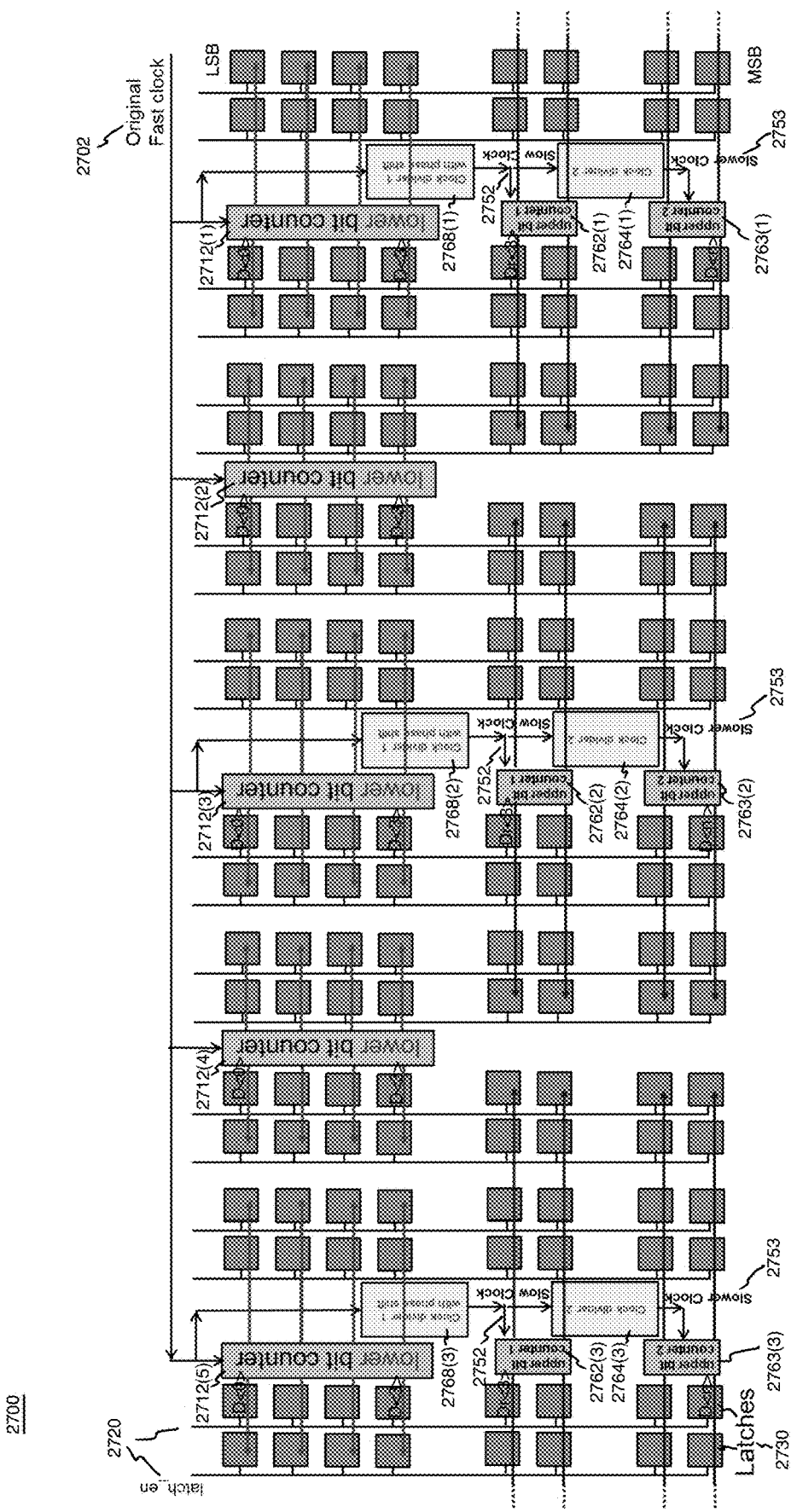
FIG. 27A is a block diagram illustrating an example of an N bit multi stage Gray code counting signal distribution system structure, including a plurality of lower bit counters, a plurality of multi stage upper bit counters, and a plurality of clock dividers with phase shift, and a plurality of clock dividers, that generates counting signals which are shared by a plurality of latches in accordance with the teachings of the present invention.

FIG. 27A is a block diagram illustrating an example of an N bit multi stage Gray code counting system 2700, including a plurality of lower bit counters, a plurality of multi stage upper bit counters, and a plurality of clock dividers with phase shift, and a plurality of clock dividers, that generates counting signals which are shared by a plurality of latches in accordance with the teachings of the present invention. It is appreciated that Gray code counting system 2700 of FIG. 27A may be another example of the Gray code counters described above that generate redundant bit(s), and that similarly named and numbered elements described above are coupled and function similarly below.

As shown in the depicted example, FIG. 27A illustrates that Gray code counting system 2700 includes a plurality of lower bit counters LBCs 2712(1), 2712(2), 2712(3), 2712(4), 2712(5), each of which generates in response to a fast counting clock 2702 a plurality of lower data bits (e.g., LSBs) that are shared and stored among a lower block including a first plurality of latches 2730 in response to a respective latch enable signal latch_en 2720. In the example depicted in FIG. 27A, each of the plurality of lower data bits of each of the LBCs 2712(1), 2712(2), 2712(3), 2712(4), 2712(5) are shared and stored among a lower block including four latches 2730 (e.g., four columns of latches). In other examples, it is appreciated that each of the plurality of lower data bits of each of the LBCs 2712(1), 2712(2), 2712(3), 2712(4), 2712(5) may be shared and stored among a lower block including a different number of latches 2730.

Continuing with the depicted example, a plurality of clock dividers with phase shift 2768(1), 2768(2), 2768(3) is also coupled to receive the fast counting clock 2702 to generate phase shifted slow clocks 2752, which are coupled to a plurality of first upper bit counters (UBCs) 2762(1), 2762(2), 2762(3). Each of the UBCs 2762(1), 2762(2), 2762(3) generates in response to slow clock 2752 a first plurality of upper data bits (e.g., MSBs), including a redundant bit, that are shared and stored among an upper block including a second plurality of plurality of latches 2730 in response to a respective latch enable signal latch_en 2720.

In addition, the example depicted in FIG. 27A also shows that a plurality of second clock dividers 2764(1), 2764(2), 2764(3) is also coupled to receive the phase shifted slow counting clock 2752 to generate second slower clocks 2753, which are coupled to a plurality of second upper bit counters (UBCs) 2763(1), 2763(2), 2763(3) to generate a second plurality of upper data bits (MSBs) that are shared and stored among the upper block including the second plurality of latches 2730 in response to a respective latch enable signal latch_en 2720.

In the example, it is appreciated that each of the second clock dividers 2764(1), 2764(2), 2764(3) divides the slow clock 2752 by an amount determined by the number of bits that are generated by the each of the plurality of UBCs 2762(1), 2762(2), 2762(3). For instance, if each of the first upper bit counters 2762(1), 2762(2), 2762(3) generates 2 output data bits, then the second clock dividers 2764(1), 2764(2), 2764(3) divide the first slow counting clocks 2752 by equal to or less than 4 (=$2^2$) to generate the second slower clocks 2753, which are coupled to the second UBCs 2763(1), 2763(2), 2763(3) as shown.

In the example depicted in FIG. 27A, each of the plurality of upper data bits output by each of the UBCs 2762(1), 2762(2), 2762(3) and UBCs 2763(1), 2763(2), 2763(3) are shared and stored among an upper block including eight latches 2730 (e.g., eight columns of latches). In other examples, it is appreciated that each of the plurality of upper data bits of each of the UBCs 2762(1), 2762(2), 2762(3) and each of the UBCs 2763(1), 2763(2), 2763(3) may be shared and stored among an upper block including a different number of latches 2730.

In the example illustrated in FIG. 27A, it is appreciated that the number of latches 2730 (e.g., a first plurality of latches) in the lower blocks that are coupled to and share each output data bit of each LBC 2712(1), 2712(2), 2712(3), 2712(4), 2712(5) is a number that is less than or equal to the number of latches (e.g., a second plurality of latches) in the upper blocks that are coupled to and share each output data bit of each UBC 2762(1), 2762(2), 2762(3) and of each UBC 2763(1), 2763(2), 2763(3). For instance, as shown in the example depicted in FIG. 27A, each output data bit line of each LBC 2712(1), 2712(2), 2712(3), 2712(4), 2712(5) is coupled to and shared with 4 latches (e.g., four columns of latches in FIG. 27A) in the lower blocks, while each output data bit line of each UBC 2762(1), 2762(2), 2762(3) and of each UBC 2763(1), 2763(2), 2763(3) is coupled to and shared with 8 latches in the upper blocks. In other examples, it is appreciated that the number of latches 2730 that are share each output data bit of the LBCs 2712(1), 2712(2), 2712(3), 2712(4), 2712(5) and the UBCs 2762(1), 2762(2), 2762(3) and UBCs 2763(1), 2763(2), 2763(3) may be different numbers from four or eight latches 2730 in the lower and upper blocks, so long as each output data bit line of each the LBCs 2712(1), 2712(2), 2712(3), 2712(4), 2712(5) is coupled to and shared with a fewer or equal number of latches 2730 in the lower blocks than each output data bit line of each of the UBCs 2762(1), 2762(2), 2762(3) and UBCs 2763(1), 2763(2), 2763(3) in the upper blocks.

Figure 27B:
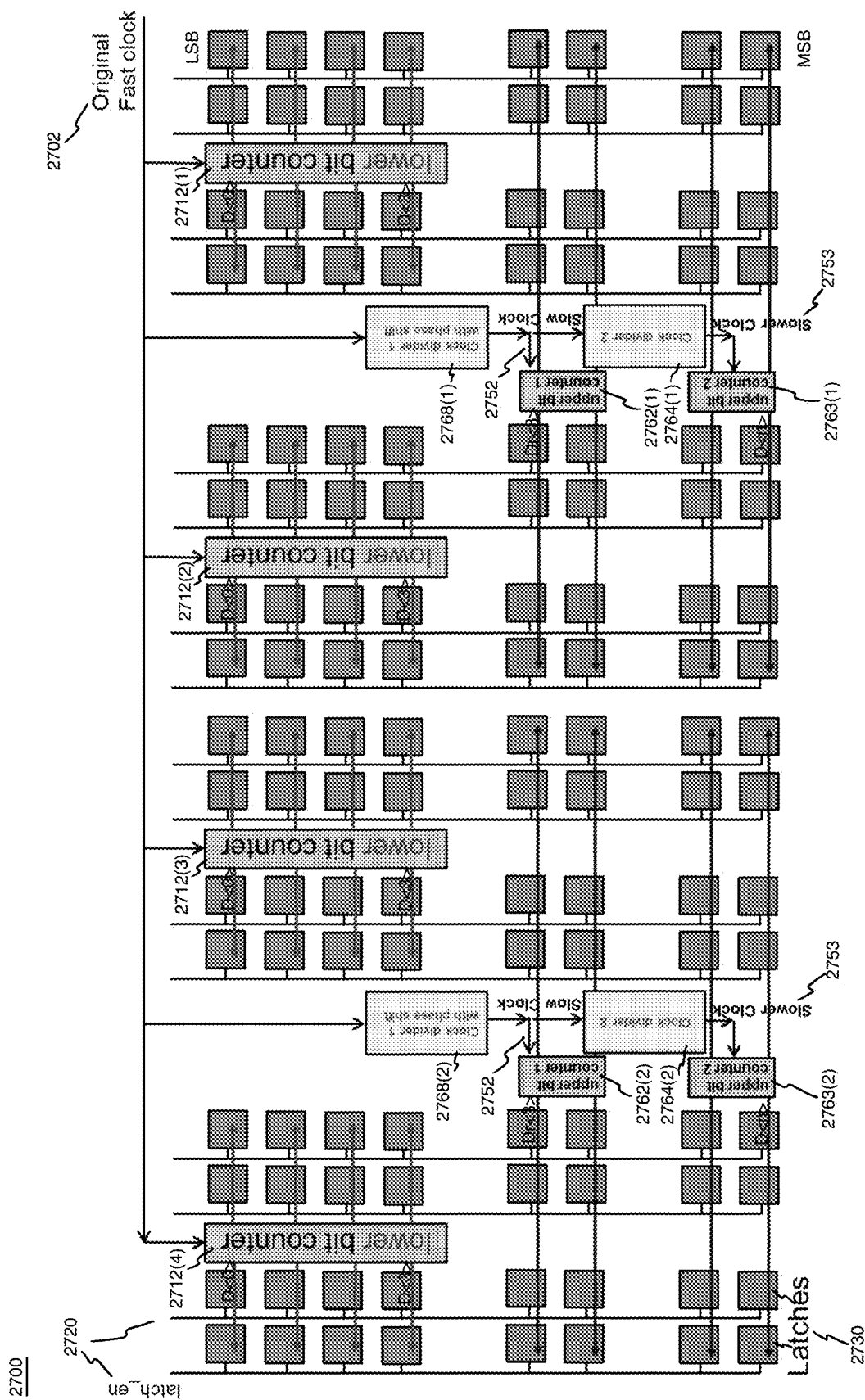
FIG. 27B is a block diagram illustrating another example of an N bit multi stage Gray code counting signal distribution system structure, including a plurality of lower bit counters, a plurality of multi stage upper bit counters, and a plurality of clock dividers with phase shift, and a plurality of clock dividers, that generates counting signals which are shared by a plurality of latches in accordance with the teachings of the present invention.

FIG. 27B is a block diagram illustrating another example of an N bit multi stage Gray code counting system 2700, including a plurality of lower bit counters, a plurality of multi stage upper bit counters, and a plurality of clock dividers with phase shift, and a plurality of clock dividers, that generates counting signals which are shared by a plurality of latches in accordance with the teachings of the present invention. It is appreciated that Gray code counting system 2700 of FIG. 27B may be another example of the Gray code counters described above that generate redundant bit(s), and that similarly named and numbered elements described above are coupled and function similarly below.

Indeed, it is appreciated that Gray code counting system 2700 of FIG. 27B shares many similarities especially with the Gray code counting system 2700 described in FIG. 27A. However, one difference between the Gray code counting system 2700 of FIG. 27A and Gray code counting system 2700 of FIG. 27B is that in the Gray code counting system of 2700 of FIG. 27A, each of the UBCs 2762(1), 2762(2), 2762(3) and 2763(1), 2763(2), 2763(3) is aligned with an LBC 2712(1), 2712(2), 2712(3). As such, each UBC 2762(1), 2762(2), 2762(3) and 2763(1), 2763(2), 2763(3) that is aligned with an LBC 2712(1), 2712(2), 2712(3) is arranged between the same columns of latches 2730 as the LBC 2712(1), 2712(2), 2712(3) that the UBCs 2762(1), 2762(2), 2762(3) and 2763(1), 2763(2), 2763(3) are aligned with in FIG. 27A. In comparison, in Gray code counting system 2700 of FIG. 27B, all of the UBCs 2762(1), 2762(2) and 2763(1), 2763(2) are non-aligned with the LBCs 2712(1), 2712(2), 2712(3), 2712(4). As such, all of the UBCs 2762(1), 2762(2) and UBCs 2763(1), 2763(2) are arranged between different columns of latches 2730 than each LBC 2712(1), 2712(2), 2712(3), 2712(4) in FIG. 27B.

Figure 28A:
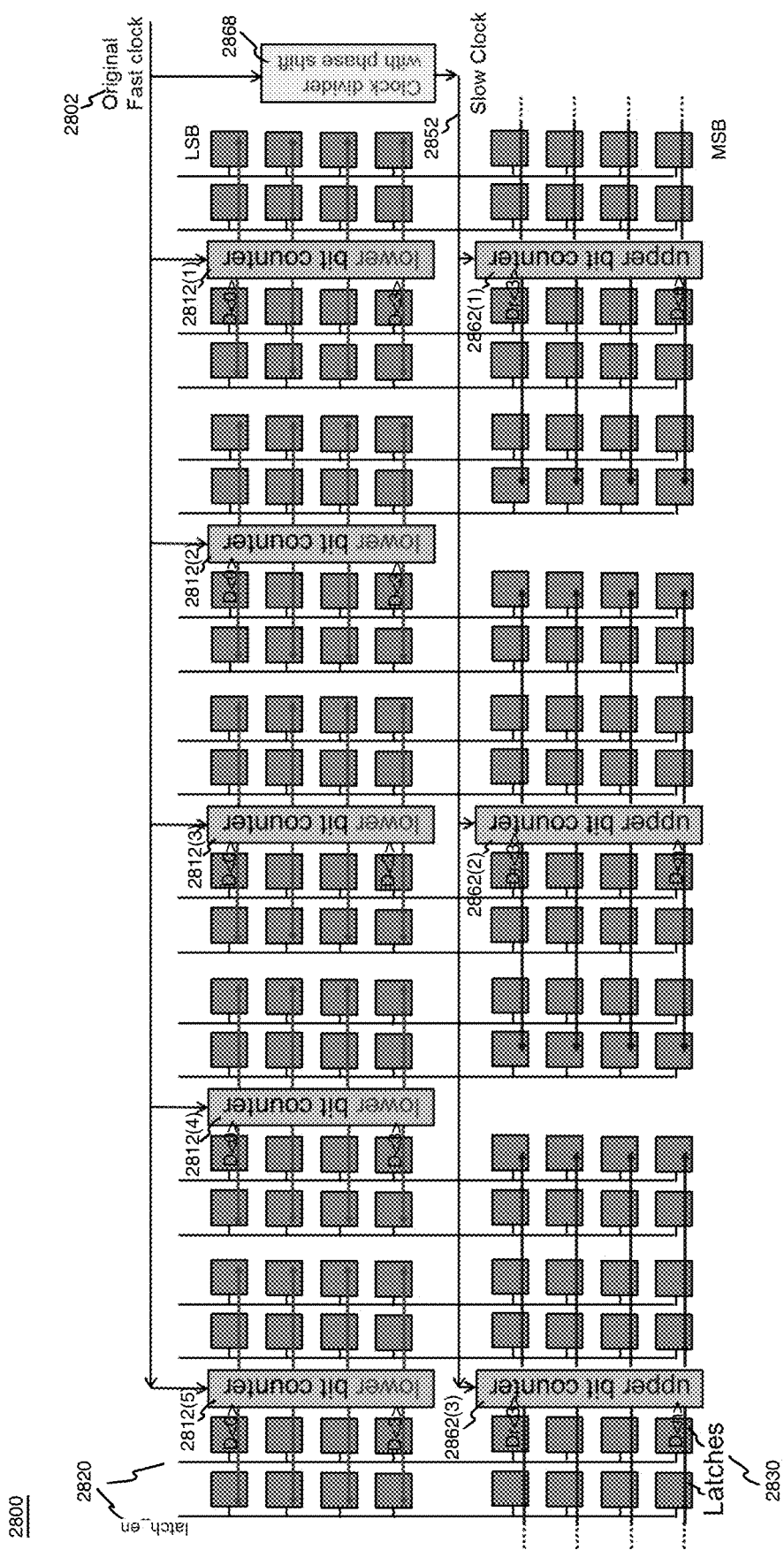
FIG. 28A is a block diagram illustrating another example of an N bit multi stage Gray code counting signal distribution system structure, including a plurality of lower bit counters, a plurality of upper bit counters, and a clock divider with phase shift, that generates counting signals which are shared by a plurality of latches in accordance with the teachings of the present invention.

FIG. 28A is a block diagram illustrating another example of an N bit multi stage Gray code counting system 2800, including a plurality of lower bit counters, a plurality of upper bit counters, and a clock divider with phase shift, that generates counting signals which are shared by a plurality of latches in accordance with the teachings of the present invention. It is appreciated that Gray code counting system 2800 of FIG. 28A may be another example of the Gray code counters described above that generate redundant bit(s), and that similarly named and numbered elements described above are coupled and function similarly below.

As shown in the depicted example, FIG. 28A illustrates that Gray code counting system 2800 includes a plurality of lower bit counters LBCs 2812(1), 2812(2), 2812(3), 2812(4), 2812(5), each of which generates in response to a fast counting clock 2802 a plurality of lower data bits (e.g., LSBs) that are shared and stored among a lower block including a first plurality of latches 2830 in response to a respective latch enable signal latch_en 2820. In the example depicted in FIG. 28A, each of the plurality of lower data bits of each of the LBCs 2812(1), 2812(2), 2812(3), 2812(4), 2812(5) are shared and stored among a lower block including four latches 2830 (e.g., four columns of latches). In other examples, it is appreciated that each of the plurality of lower data bits of each of the LBCs 2812(1), 2812(2), 2812(3), 2812(4), 2812(5) may be shared and stored among a lower block including a different number of latches 2830.

Continuing with the depicted example, a clock divider with phase shift 2868 is also coupled to receive the fast counting clock 2802 to generate a phase shifted slow clock 2852, which is coupled to a plurality of upper bit counters (UBCs) 2862(1), 2862(2), 2862(3). Each of the UBCs 2862(1), 2862(2), 2862(3) generates in response to slow clock 2852 a plurality of upper data bits (e.g., MSBs), including a redundant bit, that are shared and stored among an upper block including a second plurality of plurality of latches 2830 in response to a respective latch enable signal latch_en 2820. In the example depicted in FIG. 28A, each of the plurality of upper data bits of each of the UBCs 2862(1), 2862(2), 2862(3) are shared and stored among in an upper block including eight latches 2830 (e.g., eight columns of latches). In other examples, it is appreciated that each of the plurality of upper data bits of each of the UBCs 2862(1), 2862(2), 2862(3) may be shared and stored among an upper block including a different number of latches 2830.

In the example illustrated in FIG. 28A, it is appreciated that the number of latches 2830 (e.g., a first plurality of latches) in the lower blocks that are coupled to and share each output data bit of each LBC 2812(1), 2812(2), 2812(3), 2812(4), 2812(5) is a number that is less than or equal to the number of latches 2830 (e.g., a second plurality of latches) in the upper blocks that are coupled to and share each output data bit of each UBC 2862(1), 2862(2), 2862(3). For instance, as shown in the example depicted in FIG. 28A, each output data bit line of each LBC 2812(1), 2812(2), 2812(3), 2812(4), 2812(5) is coupled to and shared with a lower block including 4 latches (e.g., four columns of latches in FIG. 28A), while each output data bit line of each UBC 2862(1), 2862(2), 2862(3) is coupled to and shared with an upper block including 8 latches. In other examples, it is appreciated that the number of latches 2830 that are share each output data bit of the LBCs 2812(1), 2812(2), 2812(3), 2812(4), 2812(5) and the UBCs 2862(1), 2862(2), 2862(3) may be different numbers from four or eight latches 2830 in lower and upper blocks, so long as each output data bit line of each the LBCs 2812(1), 2812(2), 2812(3), 2812(4), 2812(5) is coupled to and shared with a fewer or equal number of latches 2830 in the lower blocks than the number of latches 2830 in each upper block coupled to the output data bit line of each of the UBCs 2862(1), 2862(2), 2862(3).

Figure 28B:
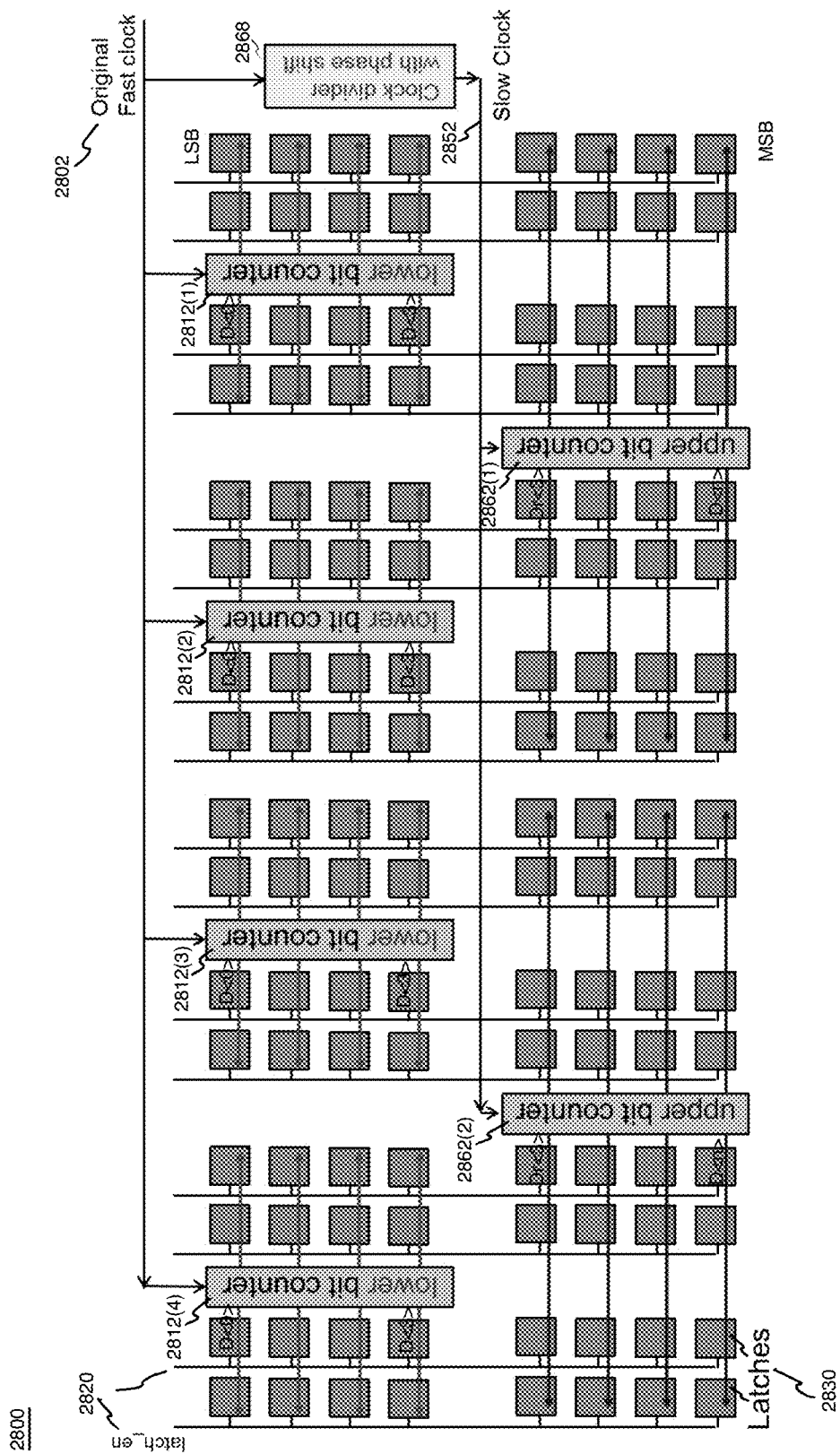
FIG. 28B is a block diagram illustrating yet another example of an N bit multi stage Gray code counting signal distribution system structure, including a plurality of lower bit counters, a plurality of upper bit counters, and a clock divider with phase shift, that generates counting signals which are shared by a plurality of latches in accordance with the teachings of the present invention.

FIG. 28B is a block diagram illustrating yet another example of an N bit multi stage Gray code counting system 2800, including a plurality of lower bit counters, a plurality of upper bit counters, and a clock divider with phase shift, that generates counting signals which are shared by a plurality of latches in accordance with the teachings of the present invention. It is appreciated that Gray code counting system 2000 of FIG. 28B may be another example of the Gray code counters described above that generate redundant bit(s), and that similarly named and numbered elements described above are coupled and function similarly below.

Indeed, it is appreciated that Gray code counting system 2800 of FIG. 28B shares many similarities especially with the Gray code counting system 2800 described in FIG. 28A. However, one difference between the Gray code counting system 2800 of FIG. 28A and Gray code counting system 2800 of FIG. 28B is that in the Gray code counting system of 2800 of FIG. 28A, each of the UBCs 2862(1), 2862(2), 2862(3) is aligned with one of the LBCs (e.g., 2812(1), 2812(3), 2812(5). As such, each UBC 2862(1), 2862(2), 2862(3) that is aligned with an LBC (e.g., 2812(1), 2812(3), 2812(5)) is arranged between the same columns of latches 2830 as the LBC (e.g., 2812(1), 2812(3), 2812(5)) that the UBC 2862(1), 2862(2), 2862(3) is aligned with. In comparison, in Gray code counting system 2800 of FIG. 28B, all of the UBCs 2862(1), 2862(2) are non-aligned with the LBCs 2812(1), 2812(2), 2812(3), 2812(4). As such, all of the UBCs 2862(1), 2862(2) are arranged between different columns of latches 2830 than each LBC 2812(1), 2812(2), 2812(3), 2812(4).

Figure 29A:
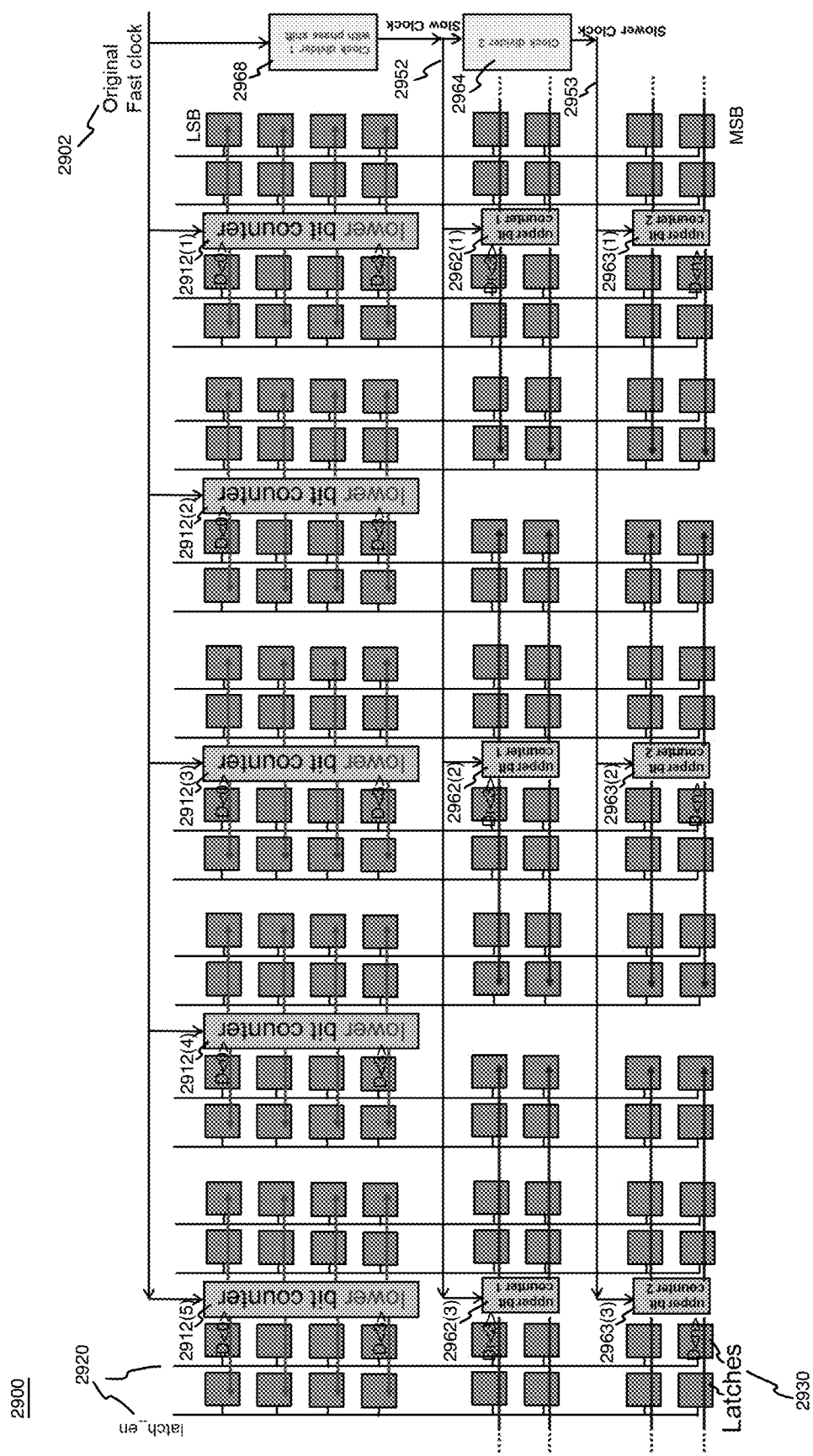
FIG. 29A is a block diagram illustrating an example of an N bit multi stage Gray code counting signal distribution system structure, including a plurality of lower bit counters, a plurality of multi stage upper bit counters, a clock divider with phase shift, and a clock divider, that generates counting signals which are shared by a plurality of latches in accordance with the teachings of the present invention.

FIG. 29A is a block diagram illustrating an example of an N bit multi stage Gray code counting system 2900, including a plurality of lower bit counters, a plurality of multi stage upper bit counters, a clock divider with phase shift, and a clock divider, that generates counting signals which are shared by a plurality of latches in accordance with the teachings of the present invention. It is appreciated that Gray code counting system 2900 of FIG. 29A may be another example of the Gray code counters described above that generate redundant bit(s), and that similarly named and numbered elements described above are coupled and function similarly below.

As shown in the depicted example, FIG. 29A illustrates that Gray code counting system 2900 includes a plurality of lower bit counters LBCs 2912(1), 2912(2), 2912(3), 2912(4), 2912(5), each of which generates in response to a fast counting clock 2902 a plurality of lower data bits (e.g., LSBs) that are shared and stored among a lower block including a first plurality of latches 2930 in response to a respective latch enable signal latch_en 2920. In the example depicted in FIG. 29A, each of the plurality of lower data bits of each of the LBCs 2912(1), 2912(2), 2912(3), 2912(4), 2912(5) are shared and stored among a lower block including four latches 2930 (e.g., four columns of latches). In other examples, it is appreciated that each of the plurality of lower data bits of each of the LBCs 2912(1), 2912(2), 2912(3), 2912(4), 2912(5) may be shared and stored among a lower block including a different number of latches 2930.

Continuing with the depicted example, a clock divider with phase shift 2968 is also coupled to receive the fast counting clock 2902 to generate a phase shifted slow clock 2952, which is coupled to a plurality of first upper bit counters (UBCs) 2962(1), 2962(2), 2962(3). Each of the UBCs 2962(1), 2962(2), 2962(3) generates in response to slow clock 2952 a first plurality of upper data bits (e.g., MSBs), including a redundant bit, that are shared and stored among an upper block including a second plurality of plurality of latches 2930 in response to a respective latch enable signal latch_en 2920.

In addition, the example depicted in FIG. 29A also shows that a second clock divider 2964 is also coupled to receive the phase shifted slow counting clock 2952 to generate a second slower clock 2953, which is coupled to a plurality of second upper bit counters (UBCs) 2963(1), 2963(2), 2963(3) to generate a second plurality of upper data bits (MSBs) that are shared and stored among the upper blocks including the second plurality of latches 2930 in response to a respective latch enable signal latch_en 2920.

In the example, it is appreciated that the second clock divider 2964 divides the slow clock 2952 by an amount determined by the number of bits that are generated by each of the plurality of UBCs 2962. For instance, if each of the first upper bit counters 2962(1), 2962(2), 2962(3) generates 2 output data bits, then the second clock divider 2964 divides the first slow counting clock 2952 by equal to or less than ($=2^2$) to generate the second slower clock 2953, which are coupled to the second UBCs 2963(1), 2963(2), 2963(3) as shown.

In the example depicted in FIG. 29A, each of the plurality of upper data bits output by each of the UBCs 2962(1), 2962(2), 2962(3) and UBCs 2963(1), 2963(2), 2963(3) are shared and stored among an upper block including eight latches 2930 (e.g., eight columns of latches). In other examples, it is appreciated that each of the plurality of upper data bits of each of the UBCs 2962(1), 2962(2), 2962(3) and each of the UBCs 2963(1), 2963(2), 2963(3) may be shared and stored among an upper block including a different number of latches 2930.

In the example illustrated in FIG. 29A, it is appreciated that the number of latches 2930 (e.g., a first plurality of latches) in the lower blocks that are coupled to and share each output data bit of each LBC 2912(1), 2912(2), 2912(3), 2912(4), 2912(5) is a number that is less than or equal to the number of latches 2930 (e.g., a second plurality of latches) in the upper blocks that are coupled to and share each output data bit of each UBC 2962(1), 2962(2), 2962(3) and each UBC 2963(1), 2963(2), 2963(3). For instance, as shown in the example depicted in FIG. 29A, each output data bit line of each LBC 2912(1), 2912(2), 2912(3), 2912(4), 2912(5) is coupled to and shared with a lower block including 4 latches (e.g., four columns of latches in FIG. 29A), while each output data bit line of each UBC 2962(1), 2962(2), 2962(3) and of each UBC 2963(1), 2963(2), 2963(3) is coupled to and shared with an upper block including 8 latches. In other examples, it is appreciated that the number of latches 2930 that are share each output data bit of the LBCs 2912 and the UBCs 2962 and 2963 in the lower and upper blocks may be different numbers from four or eight latches 2930, so long as each output data bit line of each the LBCs 2912(1), 2912(2), 2912(3), 2912(4), 2912(5) is coupled to and shared with a fewer or equal number of latches 2930 in the lower blocks than the number of latches 2930 in the upper blocks coupled to each output data bit line of each of the UBCs 2962(1), 2962(2), 2962(3) and 2963(1), 2963(2), 2963(3).

Figure 29B:
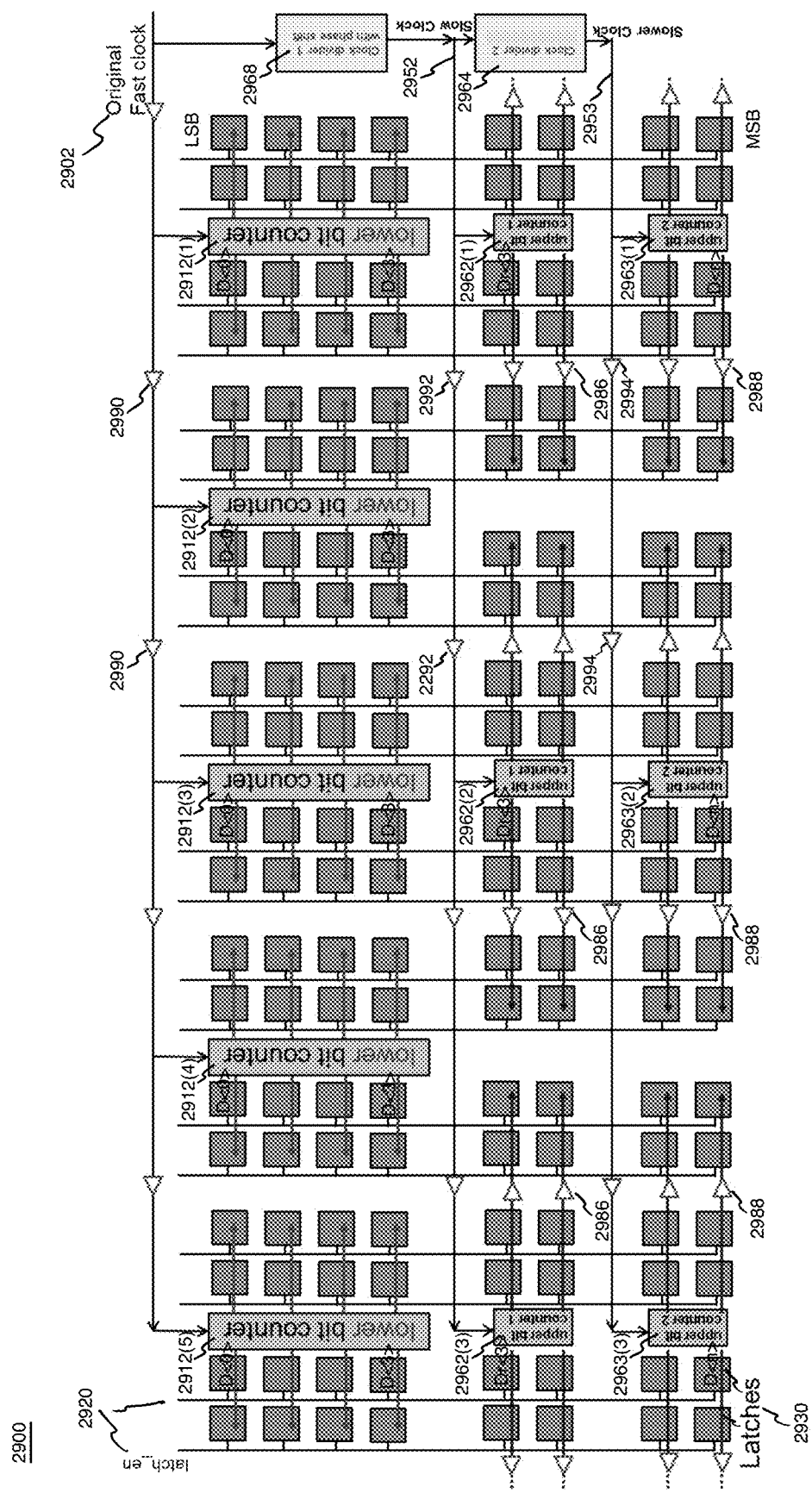
FIG. 29B is a block diagram illustrating another example of an N bit multi stage Gray code counting signal distribution system structure, including a plurality of lower bit counters, a plurality of multi stage upper bit counters, a clock divider with phase shift, a clock divider, and a plurality of buffers, that generates counting signals which are shared by a plurality of latches in accordance with the teachings of the present invention.

FIG. 29B is a block diagram illustrating another example of an N bit multi stage Gray code counting system 2900, including a plurality of lower bit counters, a plurality of multi stage upper bit counters, a clock divider with phase shift, a clock divider, and a plurality of buffers, that generates counting signals which are shared by a plurality of latches in accordance with the teachings of the present invention. It is appreciated that Gray code counting system 2900 of FIG. 29B may be another example of the Gray code counters described above that generate redundant bit(s), and that similarly named and numbered elements described above are coupled and function similarly below.

Indeed, it is appreciated that Gray code counting system 2900 of FIG. 29B shares many similarities especially with the Gray code counting system 2900 described in FIG. 29A. However, one difference between the Gray code counting system 2900 illustrated in FIG. 29B and the Gray code counting system 2900 illustrated in FIG. 29A is that the Gray code counting system 2900 illustrated in FIG. 29B also includes a first plurality of buffers or repeaters 2986 distributed along the output data bit lines of the UBCs 2962(1), 2962(2), 2962(3), a second plurality of buffers or repeaters 2988 distributed along the output data bit lines of UBCs 2963(1), 2963(2), 2963(3), a third plurality of buffers or repeaters 2990 distributed along the clock line of fast counting clock 2902, a fourth plurality of buffers or repeaters 2992 distributed along the clock line of phase shifted slow counting clock 2952, and a fifth plurality of buffers or repeaters 2994 distributed along the clock line of slower counting clock 2953.

In the example, it is noted that the plurality of buffers or repeaters 2986, 2988, 2990, 2992, and/or 2994 are arranged along each output data or clock line to maintain signal integrity. In various examples, it is appreciated that the number of buffers or repeaters utilized in the output data bit lines and/or clock lines, if any, can be freely selected depending on the demand of signal integrity and/or the requirement of allowable delay difference. Furthermore, it is appreciated that the inclusion of buffers or repeaters may be included in all embodiments of the present invention as necessary, including but not limited to the examples depicted in the present disclosure for explanation purposes.

Figure 29C:
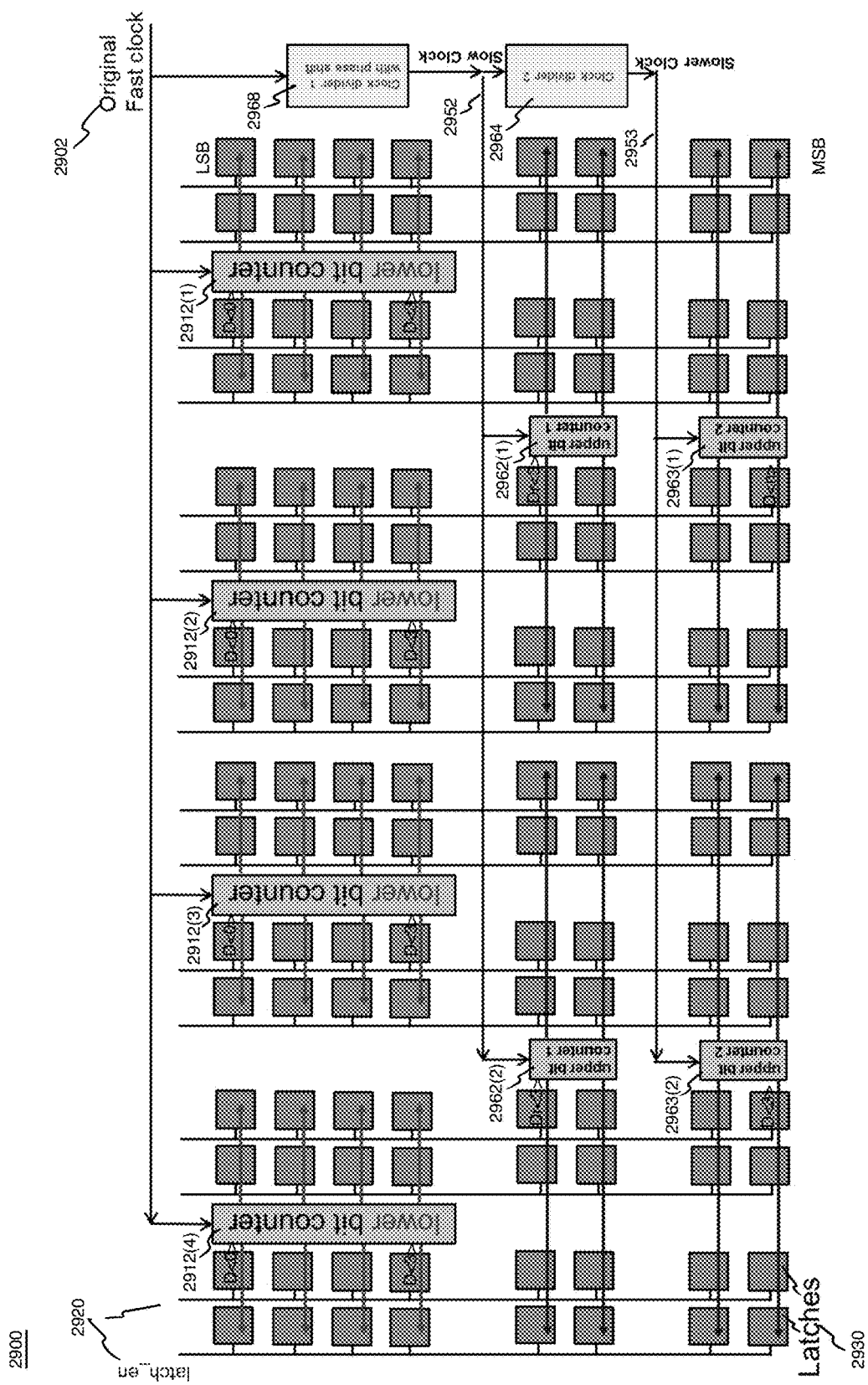
FIG. 29C is a block diagram illustrating yet another example of an N bit multi stage Gray code counting signal distribution system structure, including a plurality of lower bit counters, a plurality of multi stage upper bit counters, a clock divider with phase shift, and a clock divider, that generates counting signals which are shared by a plurality of latches in accordance with the teachings of the present invention.

FIG. 29C is a block diagram illustrating yet another example of an N bit multi stage Gray code counting system 2900, including a plurality of lower bit counters, a plurality of multi stage upper bit counters, a clock divider with phase shift, and a clock divider, that generates counting signals which are shared by a plurality of latches in accordance with the teachings of the present invention. It is appreciated that Gray code counting system 2900 of FIG. 29C may be another example of the Gray code counters described above that generate redundant bit(s), and that similarly named and numbered elements described above are coupled and function similarly below.

Indeed, it is appreciated that Gray code counting system 2900 of FIG. 29C also shares many similarities especially with the Gray code counting system 2900 described in FIG. 29A. However, one difference between the Gray code counting system 2900 of FIG. 29A and Gray code counting system 2900 of FIG. 29C is that in the Gray code counting system of 2900 of FIG. 29A, each of the UBCs 2962(1), 2962(2), 2962(3) and the UBCs 2963(1), 2963(2), 2963(3) are aligned with an LBC 2912 (e.g., 2912(1), 2912(3), 2912(5)). As such, each UBC 2962(1), 2962(2), 2962(3) and UBC 2963(1), 2963(2), 2963(3) that is aligned with an LBC 2912 (e.g., 2912(1), 2912(3), 2912(5)) is arranged between the same columns of latches 2930 as the LBC (e.g., 2912(1), 2912(3), 2912(5)) that the UBCs 2962(1), 2962(2), 2962(3) and UBCs 2963(1), 2963(2), 2963(3) are aligned with. In comparison, in Gray code counting system 2900 of FIG. 29C, all of the UBCs 2962(1), 2962(2) and UBCs 2963(1), 2963(2) are non-aligned with the LBCs 2912(1), 2912(2), 2912(3), 2912(4). As such, all of the UBCs 2962(1), 2962(2) and UBCs 2963(1), 2963(2) are arranged between different columns of latches 2930 from each LBC 2912(1), 2912(2), 2912(3), 2912(4).

Figure 29D:
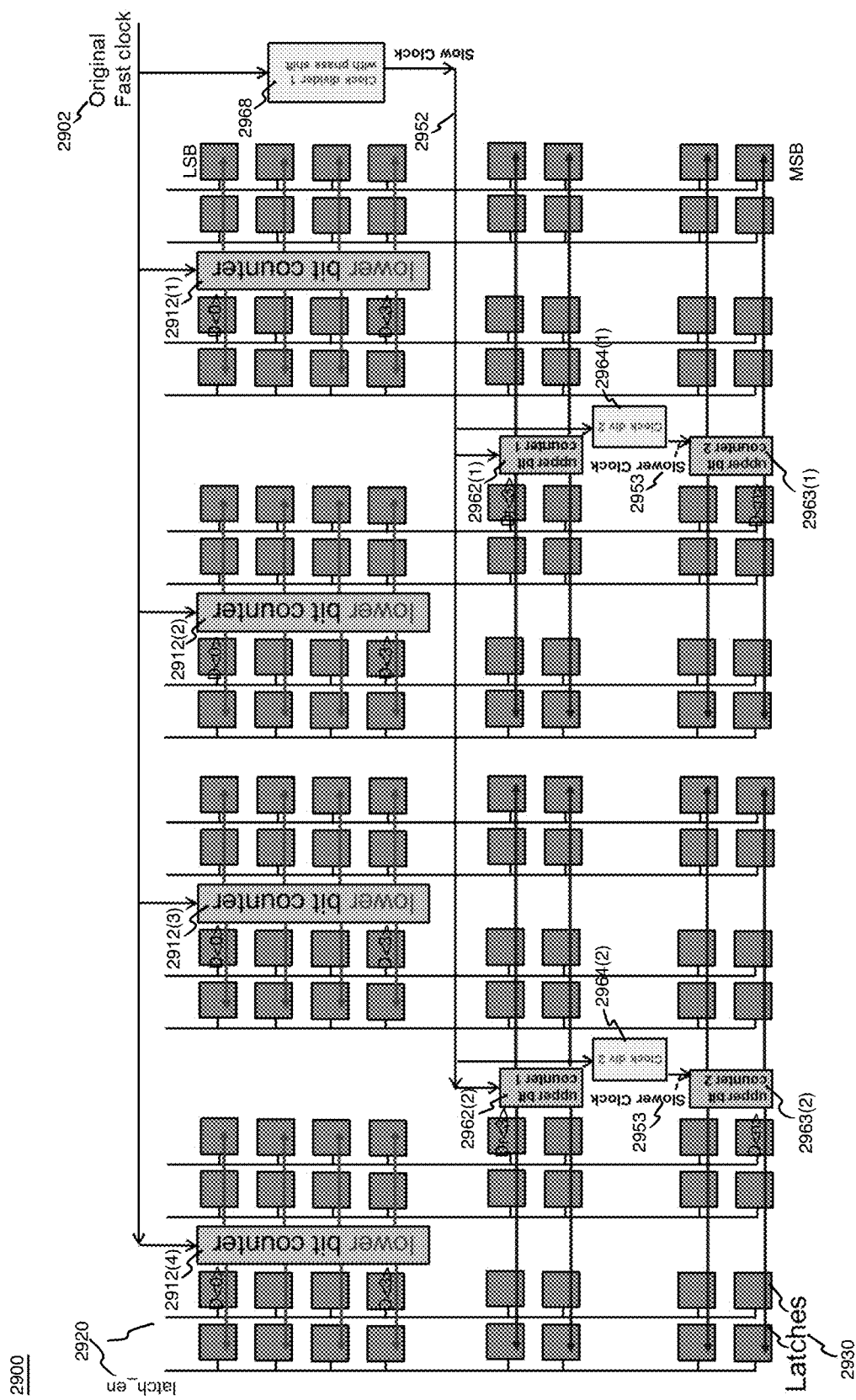
FIG. 29D is a block diagram illustrating an example of an N bit multi stage Gray code counting signal distribution system structure, including a plurality of lower bit counters, a plurality of multi stage upper bit counters, a clock divider with phase shift, and a plurality of clock dividers, that generates counting signals which are shared by a plurality of latches in accordance with the teachings of the present invention.

FIG. 29D is a block diagram illustrating yet another example of an N bit multi stage Gray code counting system 2900, including a plurality of lower bit counters, a plurality of multi stage upper bit counters, a clock divider with phase shift, and a plurality of clock dividers, that generates counting signals which are shared by a plurality of latches in accordance with the teachings of the present invention. It is appreciated that Gray code counting system 2900 of FIG. 29D may be another example of the Gray code counters described above that generate redundant bit(s), and that similarly named and numbered elements described above are coupled and function similarly below.

Indeed, it is appreciated that Gray code counting system 2900 of FIG. 29D also shares many similarities especially with the Gray code counting system 2900 described in FIG. 29C. However, one difference between the Gray code counting system 2900 of FIG. 29D and Gray code counting system 2900 of FIG. 29C is that Gray code counting system of 2900 of FIG. 29D includes a plurality of second clock dividers 2964(1), 2964(2), each of which generates a respective second slower clock signal 2953 that is coupled to a respective second UBC 2963(1), 2963(2) as shown. As such, each second clock divider 2964(1), 2964(2) of FIG. 29D is coupled to provide a second slower clock signal 2953 for a single second UBC 2963(1), 2963(2) as shown. In comparison, in Gray code counting system 2900 of FIG. 29C, there is a single second clock divider 2964 that is coupled to provide a second slower clock signal 2953 for a plurality of second UBCs 2963(1), 2963(2) as shown.

Figure 29E:
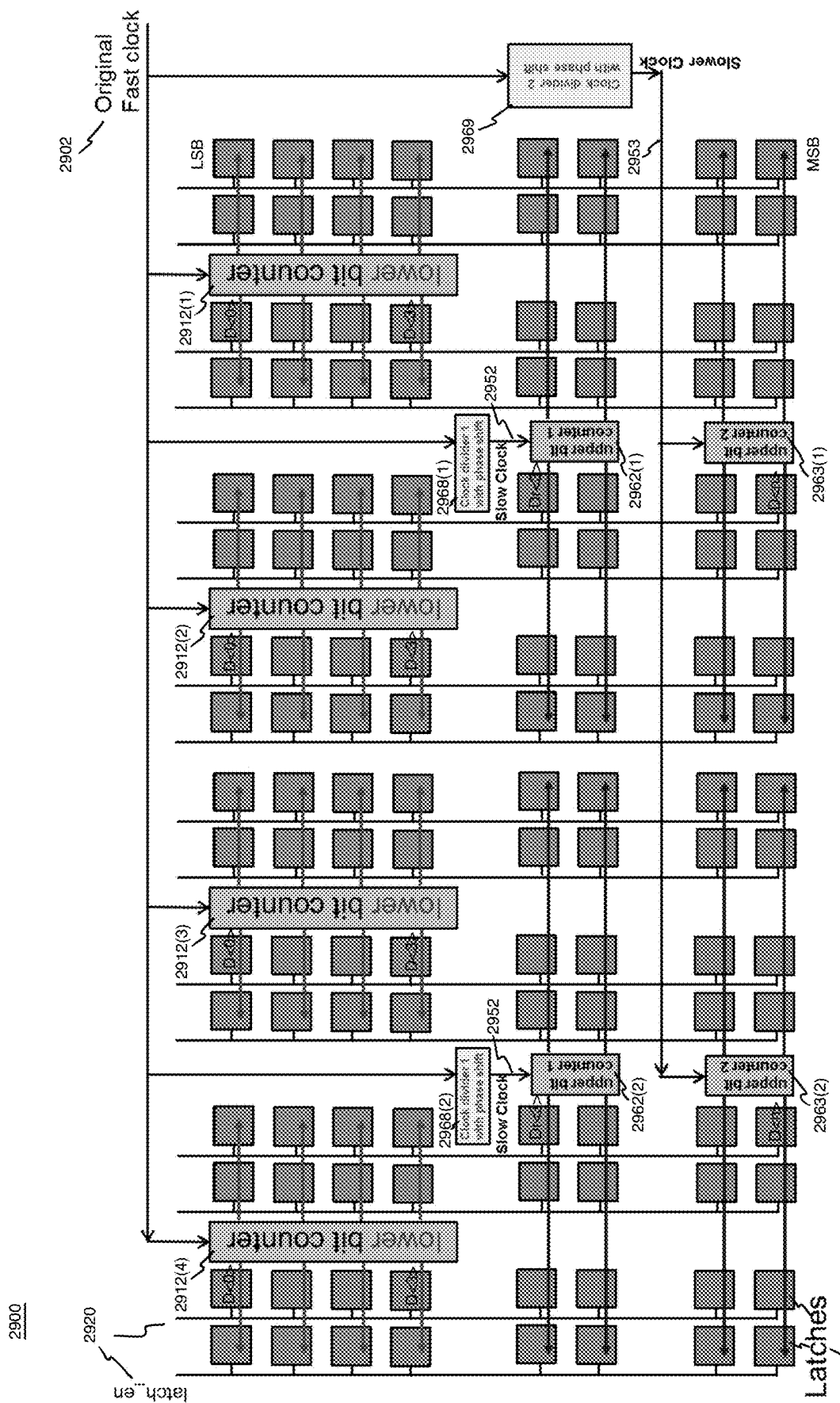
FIG. 29E is a block diagram illustrating an example of an N bit multi stage Gray code counting signal distribution system structure, including a plurality of lower bit counters, a plurality of multi stage upper bit counters, a plurality of first clock dividers with phase shift, and a second clock divider with phase shift, that generates counting signals which are shared by a plurality of latches in accordance with the teachings of the present invention.

FIG. 29E is a block diagram illustrating still another example of an N bit multi stage Gray code counting system 2900, including a plurality of lower bit counters, a plurality of multi stage upper bit counters, a plurality of first clock dividers with phase shift, and a second clock divider with phase shift, that generates counting signals which are shared by a plurality of latches in accordance with the teachings of the present invention. It is appreciated that Gray code counting system 2900 of FIG. 29E may be another example of the Gray code counters described above that generate redundant bit(s), and that similarly named and numbered elements described above are coupled and function similarly below.

Indeed, it is appreciated that Gray code counting system 2900 of FIG. 29E also shares many similarities especially with the Gray code counting system 2900 described in FIG. 29C. However, one difference between the Gray code counting system 2900 of FIG. 29E and Gray code counting system 2900 of FIG. 29C is that Gray code counting system of 2900 of FIG. 29E includes a plurality of first clock dividers with phase shift 2968(1), 2968(2), each of which is coupled to receive the fast counting clock 2902 to generate a respective phase shifted slow clock 2952 that is coupled to a respective first UBC 2962(1), 2962(2). As such, each first clock divider with phase shift 2968(1), 2968(2) is coupled to provide a respective phase shifted slow clock 2952 for a single UBC 2962(1), 2962(2).

In addition, Gray code counting system of 2900 of FIG. 29E also includes a second clock divider with phase shift 2969 that is also coupled to receive the same fast counting clock 2902 to generate a second phase shifted slower clock 2953 that is coupled to be received by the plurality of second UBCs 2963(1), 2963(2) as shown. In the example, it is appreciated that the second clock divider with phase shift 2969 provides the same phase shift and divides the fast counting clock 2902 by an additional amount compared the phase shift and division amount of the first clock dividers with phase shift 2968(1), 2968(2). In the example, the additional amount that the second clock divider with phase shift 2969 divides the fast clock 2902 is determined by the number of bits that are generated by each of plurality of LBCs 2912(1), 2912(2), 2912(3), 2912(4) and each of the plurality of UBCs 2962(1), 2962(2) without redundant bits. For instance, if each of the first upper bit counters 2962(1), 2962(2) generates 2 output data bits, then the second clock divider with phase shift 2969 divides the fast counting clock 2902 by 32 ($=2^{(4-1+2)}$) to generate the second slower clock 2953, which is coupled to the plurality of second UBCs 2963(1), 2963(2)\ as shown.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A counter distribution system, comprising:
   an N bit counter to receive a first counting clock, wherein N bit counter is coupled to generate a plurality of data bits including a plurality of lower data bits and a plurality of upper data bits, wherein upper data bits include at least one redundant bit to provide error correction for the counter distribution system, wherein the N bit counter is coupled to generate the plurality of lower data bits on a plurality of lower data bit lines, wherein the N bit counter is further coupled to generate the plurality of upper data bits on a plurality of upper data bit lines; and
   a plurality of latches coupled to the N bit counter, wherein each one of the plurality of lower bit data lines and each one of the plurality of upper bit data lines is coupled to at least one of a plurality of latches, wherein the plurality of latches is arranged into a plurality of groupings of latches, wherein each grouping of latches is coupled to a respective one of a plurality of latch enable signals, wherein each latch in each grouping of latches is coupled to latch a respective one of the plurality of data bits in response to the respective latch enable signal.

2. The counter distribution system of claim 1, wherein the N bit counter comprises a Gray code generator.

3. The counter distribution system of claim 1,
   wherein the N bit counter comprises a plurality of lower bit counters coupled to receive the first counting clock, wherein each one of the plurality of lower bit counters is coupled to generate the plurality of lower data bits on the plurality of lower data bit lines,
   wherein the plurality of latches is further arranged into a plurality of lower blocks of latches, wherein each one of the lower blocks of latches includes a first plurality of groupings of latches, wherein each one of the plurality of lower bit counters is coupled to a respective one of the plurality of lower blocks of latches.

4. The counter distribution system of claim 3,
   wherein the N bit counter is one of a plurality of N bit counters coupled to receive the first counting clock,
   wherein the plurality of latches is further arranged into a plurality of upper blocks of latches, wherein each one of the upper blocks of latches includes a second plurality of groupings of latches, wherein a number of the second plurality of groupings of latches of the upper blocks of latches is greater than a number the first plurality of groupings of latches of the lower blocks of latches, wherein each one of the plurality of N bit counters is coupled to a respective one of the plurality of upper blocks of latches.

5. The counter distribution system of claim 3,
   wherein the N bit counter comprises a plurality of upper bit counters coupled to receive the first counting clock, wherein each one of the plurality of upper bit counter is coupled to generate the plurality of upper data bits on the plurality of upper data bit lines,
   wherein the plurality of latches is further arranged into a plurality of upper blocks of latches, wherein each one of the upper blocks of latches includes a second plurality of groupings of latches, wherein a number of the second plurality of groupings of latches of the upper blocks of latches is equal to or greater than a number of the first plurality of groupings of latches of the lower blocks of latches, wherein each one of the plurality of upper bit counters is coupled to a respective one of the plurality of upper blocks of latches.

6. The counter distribution system of claim 1, further comprising a clock divider with phase shift, wherein the clock divider with phase shift is coupled to receive the first counting clock to divide the first counting clock by a first amount based on a number of the plurality of lower data bits and redundant bits to generate a second counting clock with a phase shift relative to the first counting clock.

7. The counter distribution system of claim 6, wherein the N bit counter comprises:
   a lower bit counter coupled to receive the first counting clock, wherein the lower bit counter is coupled to generate the plurality of lower data bits in response to the first counting clock; and
   an upper bit counter coupled to receive the second counting clock, wherein the upper bit counter is coupled to generate the plurality of upper data bits in response to the second counting clock.

8. The counter distribution system of claim 7, wherein the plurality of upper data bits comprises a plurality of first upper data bits and a plurality of second upper data bits, wherein the counter distribution system further comprises a second clock divider coupled to receive the second counting clock to divide the second counting clock by a second amount based on a number of the plurality of first upper data bits to generate a third counting clock.

9. The counter distribution system of claim 8, wherein the upper bit counter comprises;
   a first upper bit counter coupled to receive the second counting clock to generate the plurality of first upper data bits on a plurality of first upper data bit lines in response to the second counting clock; and
   a second upper bit counter coupled to receive the third counting clock to generate the plurality of second upper data bits on a plurality of second upper data bit lines in response to the third counting clock.

10. The counter distribution system of claim 1, wherein the first counting clock is coupled to be received through a first clock line, wherein the counter distribution system further comprises:
    a first plurality of repeaters distributed along the plurality of lower data bit lines;
    a second plurality of repeaters distributed along the plurality of upper data bit lines; and
    a third plurality of repeaters distributed along a first clock line.

11. The counter distribution system of claim 6, wherein the first counting clock is coupled to be received through a first clock line and wherein the second counting clock is coupled to be received through a second clock line, wherein the counter distribution system further comprises:
- a first plurality of repeaters distributed along the plurality of lower data bit lines;
- a second plurality of repeaters distributed along the plurality of upper data bit lines;
- a third plurality of repeaters distributed along the first clock line; and
- a fourth plurality of repeaters distributed along the second clock line.

12. The counter distribution system of claim 8, wherein the first counting clock is coupled to be received through a first clock line, wherein the second counting clock is coupled to be received through a second clock line, and wherein the third counting clock is coupled to be received through a third clock line, wherein the counter distribution system further comprises:
- a first plurality of repeaters distributed along the plurality of lower data bit lines;
- a second plurality of repeaters distributed along the plurality of upper data bit lines;
- a third plurality of repeaters distributed along the first clock line;
- a fourth plurality of repeaters distributed along the second clock line; and
- a fifth plurality of repeaters distributed along the third clock line.

13. The counter distribution system of claim 7,
wherein the lower bit counter is one of a plurality of lower bit counters coupled to receive the first counting clock, wherein each one of the plurality of lower bit counters is coupled to generate the plurality of lower data bits on the plurality of lower data bit lines,
wherein the plurality of latches is further arranged into a plurality of lower blocks of latches, wherein each one of the lower blocks of latches includes a first plurality of groupings of latches, wherein each one of the plurality of lower bit counters is coupled to a respective one of the plurality of lower blocks of latches.

14. The counter distribution system of claim 13, wherein the plurality of upper data bits comprises a plurality of first upper data bits and a plurality of second upper data bits, wherein the counter distribution system further comprises a second clock divider, wherein the second clock divider is coupled to the clock divider with phase shift to receive the second counting clock to divide the second counting clock by a second amount based on a number of the plurality of first upper data bits to generate a third counting clock.

15. The counter distribution system of claim 14, wherein the upper bit counter comprises:
- a first upper bit counter coupled to receive the second counting clock from the clock divider with phase shift to generate the plurality of first upper data bits on a plurality of first upper data bit lines in response to the second counting clock; and
- a second upper bit counter coupled to receive the third counting clock from the second clock divider to generate the plurality of second upper data bits on a plurality of second upper data bit lines in response to the third counting clock.

16. The counter distribution system of claim 15, wherein the upper bit counter is one of a plurality of upper bit counters,
wherein each first upper bit counter of the plurality of upper bit counters is coupled to receive the second counting clock from the clock divider with phase shift to generate the plurality of first upper data bits on the plurality of first upper data bit lines in response to the second counting clock,
wherein each second upper bit counter of the plurality of upper bit counters is coupled to receive the third counting clock from the second clock divider to generate the plurality of second upper data bits on the plurality of second upper data bit lines in response to the third counting clock,
wherein the plurality of latches is further arranged into a plurality of upper blocks of latches, wherein each one of the upper blocks of latches includes a second plurality of groupings of latches, wherein each one of the plurality of upper bit counters is coupled to a respective one of the plurality of upper blocks of latches.

17. The counter distribution system of claim 16, wherein a number of the second plurality of groupings of latches of the upper blocks of latches is equal to a number of the first plurality of groupings of latches of the lower blocks of latches.

18. The counter distribution system of claim 16, wherein a number of the second plurality of groupings of latches of the upper blocks of latches is equal to or greater than a number of the first plurality of groupings of latches of the lower blocks of latches.

19. The counter distribution system of claim 16, wherein the second clock divider is one of a plurality of second clock dividers,
wherein each second upper bit counter of the plurality of upper bit counters is coupled to a respective one of the plurality of second clock dividers to receive the third counting clock to generate the plurality of second upper data bits on the plurality of second upper data bit lines in response to the third counting clock.

20. The counter distribution system of claim 19, wherein a number of the second plurality of groupings of latches of the upper blocks of latches is equal to a number of the first plurality of groupings of latches of the lower blocks of latches.

21. The counter distribution system of claim 19, wherein a number of the second plurality of groupings of latches of the upper blocks of latches is equal to or greater than a number of the first plurality of groupings of latches of the lower blocks of latches.

22. The counter distribution system of claim 13,
wherein the upper bit counter is one of a plurality of upper bit counters, where each one of the plurality of upper bit counters is coupled to receive the second counting clock, wherein each one of the plurality of upper bit counters is coupled to generate the plurality of upper data bits on the plurality upper data bit lines,
wherein the plurality of latches is further arranged into a plurality of upper blocks of latches, wherein each one of the upper blocks of latches includes a second plurality of groupings of latches, wherein each one of the plurality of upper bit counters is coupled to a respective one of the plurality of upper blocks of latches.

23. The counter distribution system of claim 22, wherein a number of the second plurality of groupings of latches of the upper blocks of latches is equal to a number of the first plurality of groupings of latches of the lower blocks of latches.

24. The counter distribution system of claim 22, wherein a number of the second plurality of groupings of latches of the upper blocks of latches is equal to or greater than a number of the first plurality of groupings of latches of the lower blocks of latches.

25. The counter distribution system of claim 22, wherein the clock divider with phase shift is one of a plurality of clock dividers with phase shift, wherein each one of the plurality of upper bit counters is coupled to receive the second counting clock from a respective one of the plurality of clock dividers with phase shift.

26. The counter distribution system of claim 25, wherein the plurality of upper data bits comprises a plurality of first upper data bits and a plurality of second upper data bits, wherein the counter distribution system further comprises a plurality of second clock dividers, wherein each one of the plurality of second clock dividers is coupled to a respective one of the plurality of clock dividers with phase shift to receive the second counting clock to divide the second counting clock by a second amount based on a number of the plurality of first upper data bits to generate a third counting clock.

27. The counter distribution system of claim 26, wherein each one of the plurality of upper bit counters comprises:
 a first upper bit counter coupled to receive the second counting clock from a respective one of the plurality of clock dividers with phase shift to generate the plurality of first upper data bits on a plurality of first upper data bit lines in response to the second counting clock; and
 a second upper bit counter coupled to receive the third counting clock from a respective one of the plurality of second clock dividers to generate the plurality of second upper data bits on a plurality of second upper data bit lines in response to the third counting clock.

28. The counter distribution system of claim 27, wherein a number of the second plurality of groupings of latches of the upper blocks of latches is equal to a number of the first plurality of groupings of latches of the lower blocks of latches.

29. The counter distribution system of claim 27, wherein a number of the second plurality of groupings of latches of the upper blocks of latches is equal to or greater than a number of the first plurality of groupings of latches of the lower blocks of latches.

30. The counter distribution system of claim 25,
 wherein the plurality of upper data bits comprises a plurality of first upper data bits and a plurality of second upper data bits,
 wherein the plurality of clock dividers with phase shift is a plurality of first clock dividers with phase shift,
 wherein the counter distribution system further comprises:
  a second clock divider with phase shift coupled to receive the first counting clock to divide the first counting clock by a second amount based on a number of the plurality of lower data bits, redundant bits, and a number of the plurality of first upper data bits, and phase shift the first counting clock the phase shift amount to generate a third counting clock,
 wherein each one of the plurality of upper bit counters comprises:
  a first upper bit counter coupled to receive the second counting clock from a respective one of the plurality of first clock dividers with phase shift to generate the plurality of first upper data bits on a plurality of first upper data bit lines in response to the second counting clock; and
  a second upper bit counter coupled to receive the third counting clock from the second clock divider with phase shift to generate the plurality of second upper data bits on a plurality of second upper data bit lines in response to the third counting clock.

31. The counter distribution system of claim 30, wherein a number of the second plurality of groupings of latches of the upper blocks of latches is equal to or greater than a number of the first plurality of groupings of latches of the lower blocks of latches.

32. An imaging system, comprising:
 a pixel array including a plurality of pixels organized into a plurality of rows and columns;
 control circuitry coupled to the pixel array to control operation of the pixel array; and
 a readout circuit coupled to the pixel array to readout the image data from the pixels, wherein the readout circuit includes analog to digital converter (ADC) circuitry coupled to convert the image data from the pixels to digital image data, wherein the ADC circuitry includes ramp circuitry and at least one comparator coupled to a counter distribution system including an N bit counter, wherein the counter distribution system comprises:
  an N bit counter coupled to receive a first counting clock, wherein the N bit counter is coupled to generate a plurality of data bits including a plurality of lower data bits and a plurality of upper data bits, wherein upper data bits include at least one redundant bit to provide error correction for the counter distribution system, wherein the N bit counter is coupled to generate the plurality of lower data bits on a plurality of lower data bit lines, wherein the N bit counter is further coupled to generate the plurality of upper data bits on a plurality of upper data bit lines; and
  a plurality of latches coupled to the N bit counter, wherein each one of the plurality of lower data bit lines and each one of the plurality of upper data bit lines is coupled to at least one of the plurality of latches, wherein the plurality of latches is arranged into a plurality of groupings of latches, wherein each grouping of latches is coupled to a respective one of a plurality of latch enable signals, wherein each latch in each grouping of latches is coupled to latch a respective one of the plurality of data bits in response to the respective latch enable signal.

33. The imaging system of claim 32, further comprising: function logic coupled to the readout circuit to store the digital image data received from the readout circuit.

34. The imaging system of claim 32, wherein the N bit counter comprises a Gray code generator.

35. The imaging system of claim 32,
 wherein the N bit counter comprises a plurality of lower bit counters coupled to receive the first counting clock, wherein each one of the plurality of lower bit counters is coupled to generate the plurality of lower data bits on the plurality of lower data bit lines,
 wherein the plurality of latches is further arranged into a plurality of lower blocks of latches, wherein each one of the lower blocks of latches includes a first plurality of groupings of latches, wherein each one of the plurality of lower bit counters is coupled to a respective one of the plurality of lower blocks of latches.

36. The imaging system of claim 35,
 wherein the N bit counter is one of a plurality of N bit counters coupled to receive the first counting clock,
 wherein the plurality of latches is further arranged into a plurality of upper blocks of latches, wherein each one of the upper blocks of latches includes a second plurality of groupings of latches, wherein a number of the second plurality of groupings of latches of the upper blocks of latches is greater than a number the first plurality of groupings of latches of the lower blocks of latches, wherein each one of the plurality of N bit counters is coupled to a respective one of the plurality of upper blocks of latches.

37. The imaging system of claim 35,
wherein the N bit counter comprises a plurality of upper bit counters coupled to receive the first counting clock, wherein each one of the plurality of upper bit counters is coupled to generate the plurality of upper data bits on the plurality upper data bit lines,
wherein the plurality of latches is further arranged into a plurality of upper blocks of latches, wherein each one of the upper blocks of latches includes a second plurality of groupings of latches, wherein a number of the second plurality of groupings of latches of the upper blocks of latches is equal to or greater than a number of the first plurality of groupings of latches of the lower blocks of latches, wherein each one of the plurality of upper bit counters is coupled to a respective one of the plurality of upper blocks of latches.

38. The imaging system of claim 32, further comprising a clock divider with phase shift, wherein the clock divider with phase shift is coupled to receive the first counting clock to divide the first counting clock by a first amount based on a number of the plurality of lower data bits and redundant bits to generate a second counting clock with a phase shift relative to the first counting clock.

39. The imaging system of claim 38, wherein the N bit counter comprises:
a lower bit counter coupled to receive the first counting clock, wherein the lower bit counter is coupled to generate the plurality of lower data bits in response to the first counting clock; and
an upper bit counter coupled to receive the second counting clock, wherein the upper bit counter is coupled to generate the plurality of upper data bits in response to the second counting clock.

40. The imaging system of claim 39, wherein the plurality of upper data bits comprises a plurality of first upper data bits and a plurality of second upper data bits, wherein the counter distribution system further comprises a second clock divider coupled to receive the second counting clock to divide the second counting clock by a second amount based on a number of the plurality of first upper data bits to generate a third counting clock.

41. The imaging system of claim 40, wherein the upper bit counter comprises;
a first upper bit counter coupled to receive the second counting clock to generate the plurality of first upper data bits on a plurality of first upper data bit lines in response to the second counting clock; and
a second upper bit counter coupled to receive the third counting clock to generate the plurality of second upper data bits on a plurality of second upper data bit lines in response to the third counting clock.

42. The imaging system of claim 32, wherein the first counting clock is coupled to be received through a first clock line, wherein the counter distribution system further comprises:
a first plurality of repeaters distributed along the plurality of lower data bit lines;
a second plurality of repeaters distributed along the plurality of upper data bit lines; and
a third plurality of repeaters distributed along the first clock line.

43. The imaging system of claim 38, wherein the first counting clock is coupled to be received through a first clock line and wherein the second counting clock is coupled to be received through a second clock line, wherein the counter distribution system further comprises:
a first plurality of repeaters distributed along the plurality of lower data bit lines;
a second plurality of repeaters distributed along the plurality of upper data bit lines;
a third plurality of repeaters distributed along the first clock line; and
a fourth plurality of repeaters distributed along the second clock line.

44. The imaging system of claim 40, wherein the first counting clock is coupled to be received through a first clock line, wherein the second counting clock is coupled to be received through a second clock line, and wherein the third counting clock is coupled to be received through a third clock line, wherein the counter distribution system further comprises:
a first plurality of repeaters distributed along the plurality of lower data bit lines;
a second plurality of repeaters distributed along the plurality of upper data bit lines;
a third plurality of repeaters distributed along the first clock line;
a fourth plurality of repeaters distributed along the second clock line; and
a fifth plurality of repeaters distributed along the third clock line.

45. The imaging system of claim 39,
wherein the lower bit counter is one of a plurality of lower bit counters coupled to receive the first counting clock, wherein each one of the plurality of lower bit counters is coupled to generate the plurality of lower data bits on the plurality of lower data bit lines,
wherein the plurality of latches is further arranged into a plurality of lower blocks of latches, wherein each one of the lower blocks of latches includes a first plurality of groupings of latches, wherein each one of the plurality of lower bit counters is coupled to a respective one of the plurality of lower blocks of latches.

46. The imaging system of claim 45, wherein the plurality of upper data bits comprises a plurality of first upper data bits and a plurality of second upper data bits, wherein the counter distribution system further comprises a second clock divider, wherein the second clock divider is coupled to the clock divider with phase shift to receive the second counting clock to divide the second counting clock by a second amount based on a number of the plurality of first upper data bits to generate a third counting clock.

47. The imaging system of claim 46, wherein the upper bit counter comprises:
a first upper bit counter coupled to receive the second counting clock from the clock divider with phase shift to generate the plurality of first upper data bits on a plurality of first upper data bit lines in response to the second counting clock; and
a second upper bit counter coupled to receive the third counting clock from the second clock divider to generate the plurality of second upper data bits on a plurality of second upper data bit lines in response to the third counting clock.

48. The imaging system of claim 47, wherein the upper bit counter is one of a plurality of upper bit counters,
wherein each first upper bit counter of the plurality of upper bit counters is coupled to receive the second counting clock from the clock divider with phase shift to generate the plurality of first upper data bits on the plurality of first upper data bit lines in response to the second counting clock, wherein each second upper bit counter of the plurality of upper bit counters is coupled to receive the third counting clock from the second clock divider to generate the plurality of second upper data bits on the plurality of second upper data bit lines in response to the third counting clock, wherein the plurality of latches is further arranged into a plurality of upper blocks of latches, wherein each one of the upper blocks of latches includes a second plurality of groupings of latches, wherein each one of the plurality of upper bit counters is coupled to a respective one of the plurality of upper blocks of latches.

49. The imaging system of claim 48, wherein a number of the second plurality of groupings of latches of the upper blocks of latches is equal to a number of the first plurality of groupings of latches of the lower blocks of latches.

50. The imaging system of claim 48, wherein a number of the second plurality of groupings of latches of the upper blocks of latches is equal to or greater than a number of the first plurality of groupings of latches of the lower blocks of latches.

51. The imaging system of claim 48, wherein the second clock divider is one of a plurality of second clock dividers, wherein each second upper bit counter of the plurality of upper bit counters is coupled to a respective one of the plurality of second clock dividers to receive the third counting clock to generate the plurality of second upper data bits on the plurality of second upper data bit lines in response to the third counting clock.

52. The imaging system of claim 51, wherein a number of the second plurality of groupings of latches of the upper blocks of latches is equal to a number of the first plurality of groupings of latches of the lower blocks of latches.

53. The imaging system of claim 51, wherein a number of the second plurality of groupings of latches of the upper blocks of latches is equal to or greater than a number of the first plurality of groupings of latches of the lower blocks of latches.

54. The imaging system of claim 45,
wherein the upper bit counter is one of a plurality of upper bit counters, where each one of the plurality of upper bit counters is coupled to receive the second counting clock, wherein each one of the plurality of upper bit counters is coupled to generate the plurality of upper data bits on the plurality upper data bit lines,
wherein the plurality of latches is further arranged into a plurality of upper blocks of latches, wherein each one of the upper blocks of latches includes a second plurality of groupings of latches, wherein each one of the plurality of upper bit counters is coupled to a respective one of the plurality of upper blocks of latches.

55. The imaging system of claim 54, wherein a number of the second plurality of groupings of latches of the upper blocks of latches is equal to a number of the first plurality of groupings of latches of the lower blocks of latches.

56. The imaging system of claim 54, wherein a number of the second plurality of groupings of latches of the upper blocks of latches is equal to or greater than a number of the first plurality of groupings of latches of the lower blocks of latches.

57. The imaging system of claim 54, wherein the clock divider with phase shift is one of a plurality of clock dividers with phase shift, wherein each one of the plurality of upper bit counters is coupled to receive the second counting clock from a respective one of the plurality of clock dividers with phase shift.

58. The imaging system of claim 57, wherein the plurality of upper data bits comprises a plurality of first upper data bits and a plurality of second upper data bits, wherein the counter distribution system further comprises a plurality of second clock dividers, wherein each one of the plurality of second clock dividers is coupled to a respective one of the plurality of clock dividers with phase shift to receive the second counting clock to divide the second counting clock by a second amount based on a number of the plurality of first upper data bits to generate a third counting clock.

59. The imaging system of claim 58, wherein each one of the plurality of upper bit counters comprises:
a first upper bit counter coupled to receive the second counting clock from a respective one of the plurality of clock dividers with phase shift to generate the plurality of first upper data bits on a plurality of first upper data bit lines in response to the second counting clock; and
a second upper bit counter coupled to receive the third counting clock from a respective one of the plurality of second clock dividers to generate the plurality of second upper data bits on a plurality of second upper data bit lines in response to the third counting clock.

60. The imaging system of claim 59, wherein a number of the second plurality of groupings of latches of the upper blocks of latches is equal to a number of the first plurality of groupings of latches of the lower blocks of latches.

61. The imaging system of claim 59, wherein a number of the second plurality of groupings of latches of the upper blocks of latches is equal to or greater than a number of the first plurality of groupings of latches of the lower blocks of latches.

62. The imaging system of claim 57,
wherein the plurality of upper data bits comprises a plurality of first upper data bits and a plurality of second upper data bits,
wherein the plurality of clock dividers with phase shift is a plurality of first clock dividers with phase shift,
wherein the counter distribution system further comprises:
a second clock divider with phase shift coupled to receive the first counting clock to divide the first counting clock by a second amount based on a number of the plurality of lower data bits and redundant bits and a number of the plurality of first upper data bits, and phase shift the first counting clock the phase shift amount to generate a third counting clock,
wherein each one of the plurality of upper bit counters comprises:
a first upper bit counter coupled to receive the second counting clock from a respective one of the plurality of first clock dividers with phase shift to generate the plurality of first upper data bits on a plurality of first upper data bit lines in response to the second counting clock; and
a second upper bit counter coupled to receive the third counting clock from the second clock divider with phase shift to generate the plurality of second upper data bits on a plurality of second upper data bit lines in response to the third counting clock.

63. The imaging system of claim 62, wherein a number of the second plurality of groupings of latches of the upper blocks of latches is equal to or greater than a number of the first plurality of groupings of latches of the lower blocks of latches.

* * * * *